United States Patent
Biwa et al.

(10) Patent No.: US 8,168,966 B2
(45) Date of Patent: May 1, 2012

(54) GAN-BASED SEMICONDUCTOR LIGHT-EMITTING DEVICE, LIGHT ILLUMINATOR, IMAGE DISPLAY PLANAR LIGHT SOURCE DEVICE, AND LIQUID CRYSTAL DISPLAY ASSEMBLY

(75) Inventors: Goshi Biwa, Kanagawa (JP); Hiroyuki Okuyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 493 days.

(21) Appl. No.: 11/718,862

(22) PCT Filed: Sep. 8, 2006

(86) PCT No.: PCT/JP2006/017881
§ 371 (c)(1),
(2), (4) Date: Jun. 12, 2007

(87) PCT Pub. No.: WO2007/032281
PCT Pub. Date: Mar. 22, 2007

(65) Prior Publication Data
US 2007/0284564 A1 Dec. 13, 2007

(30) Foreign Application Priority Data

Sep. 13, 2005 (JP) ................................. 2005-264938
Aug. 30, 2006 (JP) ................................. 2006-234199

(51) Int. Cl.
*H01L 29/15* (2006.01)

(52) U.S. Cl. ....... 257/13; 257/15; 257/97; 257/E33.008; 257/E33.034

(58) Field of Classification Search ................. 257/9, 13, 257/14, 15, 96, 97, E33.008, E33.009, E33.01, 257/E31.033, E31.035, E31.036, E29.072, 257/E29.074, E29.298, 22, 103, E33.034, 257/79, 94, 615, E33.108; 438/22, 46, 47
See application file for complete search history.

(56) References Cited

U.S. PATENT DOCUMENTS

| | | | |
|---|---|---|---|
| 5,724,170 A * | 3/1998 | Aizawa ........................ 398/197 |
| 5,851,905 A * | 12/1998 | McIntosh et al. ............. 438/492 |
| 6,040,588 A | 3/2000 | Koide et al. | |
| 6,377,597 B1 | 4/2002 | Okumura | |

(Continued)

FOREIGN PATENT DOCUMENTS

JP   07-235732   9/1995

(Continued)

OTHER PUBLICATIONS

Japanese Office Action for corresponding Japanese Patent Application No. 2006-234199, dated Jan. 6, 2009.

(Continued)

*Primary Examiner* — Cuong Q Nguyen
*Assistant Examiner* — Yosef Gebreyesus
(74) *Attorney, Agent, or Firm* — K&L Gates LLP

(57) ABSTRACT

A GaN-based semiconductor light-emitting device includes (A) a first GaN-based compound semiconductor layer 13 having n-type conductivity, (B) an active layer 15 having a multi-quantum well structure including well layers and barrier layers for separating between the well layers, and (C) a second GaN-based compound semiconductor layer 17 having p-type conductivity. The well layers are disposed in the active layer 15 so as to satisfy the relation $d_1 < d_2$ wherein $d_1$ is the well layer density on the first GaN-based compound semiconductor layer side in the active layer and $d_2$ is the well layer density on the second GaN-based compound semiconductor layer side.

17 Claims, 35 Drawing Sheets

U.S. PATENT DOCUMENTS

| | | | |
|---|---|---|---|
| 6,423,984 B1 | 7/2002 | Kato et al. | |
| 6,504,171 B1 | 1/2003 | Grillot et al. | |
| 6,555,403 B1 * | 4/2003 | Domen et al. | 438/22 |
| 7,250,715 B2 | 7/2007 | Mueller et al. | |
| 7,279,717 B2 * | 10/2007 | Yamada | 257/97 |
| 7,358,544 B2 * | 4/2008 | Sakamoto et al. | 257/103 |
| 2002/0079485 A1 * | 6/2002 | Stintz et al. | 257/14 |
| 2003/0001170 A1 | 1/2003 | Shibata et al. | |
| 2003/0124789 A1 * | 7/2003 | Koide et al. | 438/200 |
| 2003/0138983 A1 * | 7/2003 | Biwa et al. | 438/46 |
| 2005/0127391 A1 * | 6/2005 | Yanamoto | 257/103 |
| 2006/0097242 A1 * | 5/2006 | Kuramoto | 257/13 |
| 2006/0108603 A1 * | 5/2006 | Uemura et al. | 257/194 |
| 2008/0230794 A1 * | 9/2008 | Yasuda et al. | 257/96 |

FOREIGN PATENT DOCUMENTS

| | | |
|---|---|---|
| JP | 10-135514 | 5/1998 |
| JP | 10-256657 | 9/1998 |
| JP | 10-261838 | 9/1998 |
| JP | 11-510968 | 9/1999 |
| JP | 2000-072368 | 3/2000 |
| JP | 2000-091629 | 3/2000 |
| JP | 2000-195173 | 7/2000 |
| JP | 2000-244070 | 9/2000 |
| JP | 2000-261106 | 9/2000 |
| JP | 2001-168473 | 6/2001 |
| JP | 2001-332761 | 11/2001 |
| JP | 2001-343706 | 12/2001 |
| JP | 2002-158374 | 5/2002 |
| JP | 2002-237619 | 8/2002 |
| JP | 2002-368268 | 12/2002 |
| JP | 2003-022052 | 1/2003 |
| JP | 2003-520453 | 7/2003 |
| JP | 2003-318495 | 11/2003 |
| JP | 2004-172382 | 6/2004 |
| JP | 2004-179428 | 6/2004 |
| JP | 2004-186278 | 7/2004 |
| JP | 2005-024226 | 1/2005 |
| JP | 2005-072368 | 3/2005 |
| JP | 2005-244226 | 9/2005 |
| JP | 2005-294813 | 10/2005 |
| JP | 2006-128607 | 5/2006 |
| KR | 2005-0003275 | 1/2005 |
| WO | 97/48138 | 5/1997 |

OTHER PUBLICATIONS

Belomoin et al., "Observation of a magic discrete family of ultrabright Si nanoparticles," Applied Physics Letters, Feb. 4, 2002, vol. 80, No. 5, pp. 841-843.

Kawakami et al., "In inhomogeneity and emission characteristics of InGan," J. Phys.: Condens. Matter 13 (2001) pp. 6993-7010.

* cited by examiner

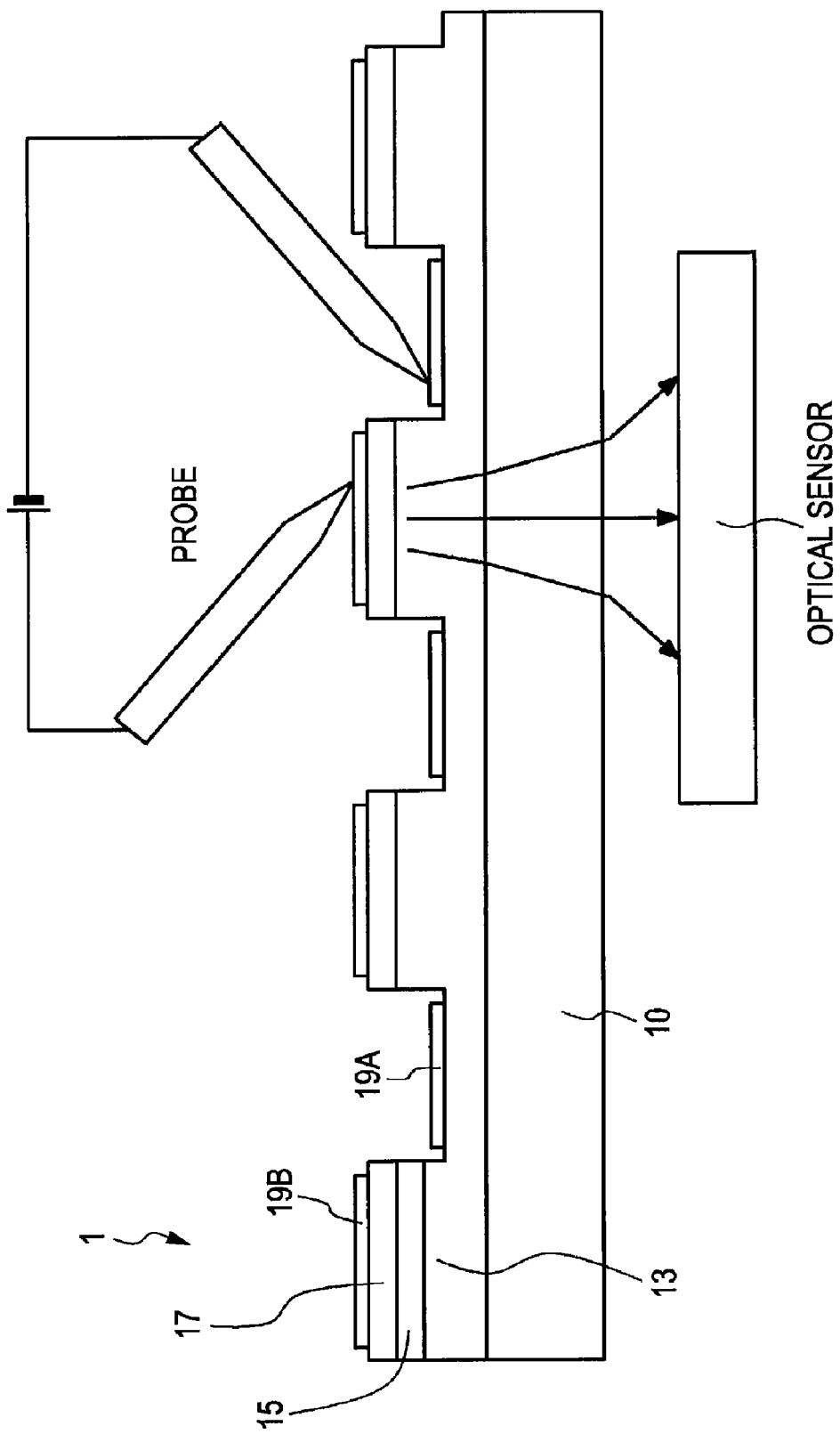

GAN-BASED SEMICONDUCTOR LIGHT-EMITTING DEVICE, LIGHT ILLUMINATOR, IMAGE DISPLAY PLANAR LIGHT SOURCE DEVICE, AND LIQUID CRYSTAL DISPLAY ASSEMBLY

CROSS REFERENCE TO RELATED APPLICATIONS

The present application claims priority to Japanese Patent Document Nos. 2005-264938 filed on Sep. 13, 2005, and 2006-234199 filed on Aug. 30, 2006, the disclosures of which are herein incorporated by reference.

BACKGROUND

The present invention relates to a GaN-based semiconductor light-emitting device and a light illuminator, an image display, a planar light source device, and a liquid crystal display assembly in each of which the GaN-based semiconductor light-emitting device is incorporated.

BACKGROUND ART

In a light-emitting device (GaN-based semiconductor light-emitting device) including an active layer composed of a gallium nitride (GaN)-based compound semiconductor, the band-gap energy can be controlled by changing the alloy composition or thickness of the active layer to realize emission wavelengths in a wide range from ultraviolet to infrared. GaN-based semiconductor light-emitting devices emitting various color lights have already been placed in the market and used in a wide range of applications such as image display devices and illuminating devices, inspection devices, and disinfectant light sources. In addition, blue-violet semiconductor lasers and light-emitting diodes (LED) have been developed and used as writing/reading pickups of large capacity optical discs.

It is generally known that in a GaN-based semiconductor light-emitting device, the emission wavelength shifts to the short-wavelength side as the driving current (operating current) is increased. For example, when the driving current is increased from 20 mA to 100 mA, an emission wavelength shift of −3 nm in the blue light emitting region and an emission wavelength shift of −19 nm in the green light emitting region have been reported (refer to, for example, the product specification NSPB500S and the product specification NSPG500S of Nichia Corporation).

Such an emission wavelength shift due to an increase in the driving current (operating current) is a problem common to active layers composed of GaN-based compound semiconductors containing In atoms which have a visible wavelength or longer wavelength. It is thought that carrier localization due to In atoms within a well layer constituting an active layer (refer to, for example, Y. Kawakami, et al., J. Phys. Condens. Matter 13 (2001), pp. 6993) and an internal field effect due to lattice mismatch (refer to S. P. Chichibu, Materials Science and Engineering B59 (1999), pp. 298) are concerned in the problem.

Further, attempts have been made to control the emission wavelengths of such GaN-based semiconductor light-emitting devices. For example, Japanese Unexamined Patent Application Publication No. 2002-237619 discloses a method for controlling a light color emitted by a light-emitting diode, in which a plurality of color lights is emitted by supplying a pulse current having a plurality of peak current values to a light-emitting diode in which the emission wavelength is changed by changing the current value. The method for controlling a light color emitted by a light-emitting diode is capable of decreasing a size because of the use of a single emission source and of easily controlling a luminescent color.

For example, Japanese Unexamined Patent Application Publication No. 2003-22052 discloses a light-emitting device driving circuit for driving a plurality of light-emitting devices to be driven at the same time. The light-emitting device driving circuit includes emission wavelength correction means for correcting variations in emission wavelength between a plurality of light-emitting devices by controlling the currents supplied to the light-emitting devices and emission luminance correction means for correcting variations in emission luminance between a plurality of light-emitting devices. The light-emitting device driving circuit is capable of effectively correcting a variation between light-emitting devices even when the light-emitting devices have difficulty of uniform emission due to variations in manufacture of the devices.

In a GaN-based semiconductor light-emitting device, various techniques have been proposed for increasing the efficiency of an active layer having a multi-quantum well structure including well layers and barrier layers. For example, PCT Japanese Translation Patent Publication No. 2003-520453 discloses a semiconductor light-emitting device in which in an active layer having a multi-quantum well structure including at least two light-emitting active layers and at least one barrier layer, the light-emitting active layers or the barrier layer are subjected to chirping. The term "chirping" means that a plurality of similar layers is formed so that the thicknesses and/or compositions thereof are made nonuniform or asymmetric. In this case, the efficiency of optical output or light generation in each of the well layers in a LED with a multi-quantum well structure is increased.

More specifically, in paragraph No. [0031] of this patent application publication, it is disclosed that in a first example, active layers 48 to 56 of LED 30 are chirped so that the active layers 48, 50, 52, 54, and 56 have thicknesses of 200, 300, 400, 500, and 600 angstroms, respectively, in an active region 36. In addition, in paragraph No. [0032] of this patent application publication, it is disclosed that in a third example, barrier layers 58 to 64 are chirped so that the thicknesses are between about 10 angstroms and 500 angstroms, and the barrier layer closer to a n-type lower sealing layer 34 is thicker than the barrier layer away from the n-type lower sealing layer 34.

Patent Document 1: Japanese Unexamined Patent Application Publication No. 2002-237619

Patent Document 2: Japanese Unexamined Patent Application Publication No. 2003-22052

Patent Document 3: PCT Japanese Translation Patent Publication No. 2003-520453

Non-patent Document 1: Product specification NSPB500S of Nichia Corporation

Non-patent Document 2: Product specification NSPG500S of Nichia Corporation

Non-patent Document 3: Y. Kawakami, et al., J. Phys. Condens. Matter 13 (2001), pp. 6993

Non-patent Document 4: S. P. Chichibu, Materials Science and Engineering B59 (1999), pp. 298

Non-patent Document 5: Nikkei Electronics, Dec. 20, 2004, No. 889, p. 128

A conceivable method as means for increasing the optical output of a GaN-based semiconductor light-emitting device includes driving (operating) the GaN-based semiconductor light-emitting device with a high driving current (operating current). However, as described above, the use of such means causes the problem of shifting the emission wavelength due to an increase in the driving current (operating current). Therefore, in a conventional GaN-based semiconductor light-emitting device causing a large change in emission wavelength according to an operating current density, a system is generally used, in which the pulse width (or the pulse density) of the operating current is changed at a constant operating current density so as to cause no change in luminescent color when the luminance is changed.

For example, in an image display device in which a GaN-based semiconductor light-emitting device (light-emitting diode) having a blue light emission wavelength, a GaN-based semiconductor light-emitting device (light-emitting diode) having a green light emission wavelength, and an AlInGaP-based compound semiconductor light-emitting diode having a red light emission wavelength are arranged corresponding to respective sub-pixels, roughness may occur in a display image due to a shift of the emission wavelength of each light-emitting diode. In such an image display device, the chromaticity coordinates and luminance are controlled between respective pixels. However, as described above, when the emission wavelength of each light-emitting device is shifted to an emission wavelength different from a desired emission wavelength, there is the problem of narrowing the color space after control.

Further, in a light-emitting device including a GaN-based semiconductor light-emitting device and a color conversion material (for example, a light-emitting device emitting white light by a combination of a ultraviolet or blue light-emitting diode and fluorescent particles), when the driving current (operating current) of the GaN-based semiconductor light-emitting device is increased for increasing the luminance (brightness) of the light-emitting device, the excitation efficiency of the color conversion material may be changed due to a shift of the emission wavelength of the GaN-based semiconductor light-emitting device for exciting the color conversion material, thereby causing a change in chromaticity and difficult in obtaining a light-emitting device with a uniform color.

Further, a liquid crystal display with a back light using a GaN-based semiconductor light-emitting device has been proposed. However, in this liquid crystal display, when the driving current (operating current) of the GaN-based semiconductor light-emitting device is increased for increasing the luminance (brightness) of the back light, a shift of the emission wavelength of the GaN-based semiconductor light-emitting device may cause the problem of narrowing or changing the color space.

In order to realize a decrease in cost or an increase in density (increase in definition) of an illuminating device, a back light, or a display using a GaN-based semiconductor light-emitting device, it is necessary to further decrease the size of the light-emitting device from a conventional size of 300 µm square or 1 mm square. However, in this case, with the same operating current, the operating current density is increased, thereby resulting in the problem of shifting the emission wavelength at a high operating current density. In addition, a display device including an array of light-emitting micro devices can be given as an application of GaN-based semiconductor light-emitting devices. However, in such a light-emitting micro device, from the viewpoint of application to a display device, it is important to decrease a shift of the emission wavelength.

The above-described patent application publications disclose only a calculation example in which the composition of the barrier layer is changed stepwisely, but do not specifically disclose asymmetry and effects. Furthermore, the above-described patent application publications or documents do not disclose a technique for suppressing a large shift of the emission wavelength due to an increase in operating current density.

SUMMARY

Therefore, an object of the present invention is to provide a GaN-based semiconductor light-emitting device having a structure capable of suppressing a large shift of the emission wavelength due to an increase in operating current density and capable of controlling luminance in a wider range, and a light illuminator, an image display, a planar light source device, and a liquid crystal display assembly in each of which the GaN-based semiconductor light-emitting device is incorporated.

In order to achieve the object, a GaN-based semiconductor light-emitting device of the present invention includes:

(A) a first GaN-based compound semiconductor layer having n-type conductivity;

(B) an active layer having a multi-quantum well structure including well layers and barrier layers for separating between the well layers; and (C) a second GaN-based compound semiconductor layer having p-type conductivity;

wherein the well layers are disposed in the active layer so as to satisfy the relation $d_1 < d_2$ wherein $d_1$ is the well layer density on the first GaN-based compound semiconductor layer side in the active layer and $d_2$ is the well layer density on the second GaN-based compound semiconductor layer side.

In order to achieve the object, a light illuminator of the present invention includes a GaN-based semiconductor light-emitting device and a color conversion material on which light emitted from the GaN-based semiconductor light-emitting device is incident and which emits light at a wavelength different from the wavelength of the light emitted from GaN-based semiconductor light-emitting device, the GaN-based semiconductor light-emitting device including:

(A) a first GaN-based compound semiconductor layer having n-type conductivity;

(B) an active layer having a multi-quantum well structure including well layers and barrier layers for separating between the well layers; and (C) a second GaN-based compound semiconductor layer having p-type conductivity;

wherein the well layers are disposed in the active layer so as to satisfy the relation $d_1 < d_2$ wherein $d_1$ is the well layer density on the first GaN-based compound semiconductor layer side in the active layer and $d_2$ is the well layer density on the second GaN-based compound semiconductor layer side.

In the light illuminator of the present invention, the light emitted from the GaN-based semiconductor light-emitting device may be visible light, ultraviolet light, or a combination of visible light and ultraviolet light.

In the light illuminator of the present invention, the light emitted from the GaN-based semiconductor light-emitting device may be blue light, and the light emitted from the color conversion material may be at lease one type of light selected from the group consisting of yellow light, green light, and red light. Specific examples of the color conversion material excited by the blue light emitted from the GaN-based semiconductor light-emitting device to emit red light include red light-emitting fluorescent particles and, more specifically, (ME:Eu)S (wherein ME represents at least one atom selected from the group consisting of Ca, Sr, and Ba hereinafter), $(M:Sm)_x(Si, Al)_{12}(O, N)_{16}$ (wherein M represents at least one atom selected from the group consisting of Li, Mg, and Ca hereinafter), $ME_2Si_5N_8$:Eu, (Ca:Eu)SiN$_2$, and (Ca:Eu)

AlSiN$_3$. Specific examples of the color conversion material excited by the blue light emitted from the GaN-based semiconductor light-emitting device to emit green light include green light-emitting fluorescent particles and, more specifically, (ME:Eu)Ga$_2$S$_4$, (M:RE)$_x$(Si, Al)$_{12}$(O, N)$_{16}$ (wherein RE represents Tb and Yb), (M:Tb)$_x$(Si, Al)$_{12}$(O, N)$_{16}$, (M:Yb)$_x$ (Si, Al)$_{12}$(O, N)$_{16}$, and Si$_{6-z}$Al$_z$O$_z$N$_{8-z}$:Eu. Specific examples of the color conversion material excited by the blue light emitted from the GaN-based semiconductor light-emitting device to emit yellow light include yellow light-emitting fluorescent particles and, more specifically, YAG (yttrium aluminum garnet) fluorescent particles. These color conversion materials may be used alone or as a mixture of two or more. When a mixture of two or more color conversion materials is used, light of a color other than yellow, green, and red can be emitted from a color conversion material mixture. Specifically, for example, light of cyan color may be emitted. In this case, a mixture of green light-emitting fluorescent particles (e.g., LaPO$_4$:Ce, Tb, BaMgAl$_{10}$O$_{17}$:Eu, Mn, Zn$_2$SiO$_4$:Mn, MgAl$_{11}$O$_{19}$:Ce, Tb, Y$_2$SiO$_5$:Ce, Tb, MgAl$_{11}$O$_{19}$:CE, Tb, or Mn) and blue light-emitting fluorescent particles (e.g., BaMgAl$_{10}$O$_{17}$:Eu, BaMg$_2$Al$_{16}$O$_{27}$:Eu, Sr$_2$P$_2$O$_7$:Eu, Sr$_5$(PO$_4$)$_3$Cl:Eu, (Sr, Ca, Ba, Mg)$_5$(PO$_4$)$_3$Cl:Eu, CaWO$_4$, or CaWO$_4$:Pb) may be used.

When the light emitted from the GaN-based semiconductor light-emitting device is ultraviolet light, the emission wavelength is little shifted by an increase in the operating current density, but improvement in luminous efficiency and a decrease in threshold current can be expected by specifying the well layer density. In this case, specific examples of the color conversion material excited by the ultraviolet light emitted from the GaN-based semiconductor light-emitting device to emit red light include red light-emitting fluorescent particles and, more specifically, Y$_2$O$_3$:Eu, YVO$_4$:Eu, Y(P, V)O$_4$: Eu, 3.5MgO.0.5MgF$_2$.Ge$_2$:Mn, CaSiO$_3$:Pb, Mn, Mg$_6$AsO$_{11}$: Mn, (Sr, Mg)$_3$(PO$_4$)$_3$:Sn, La$_2$O$_2$S:Eu, and Y$_2$O$_2$S:Eu. Specific examples of the color conversion material excited by the ultraviolet light emitted from the GaN-based semiconductor light-emitting device to emit green light include green light-emitting fluorescent particles and, more specifically, LaPO$_4$:Ce, Tb, BaMgAl$_{10}$O$_{17}$:Eu, Mn, Zn$_2$SiO$_4$:Mn, MgAl$_{11}$O$_{19}$:Ce, Tb, Y$_2$SiO$_5$:Ce, Tb, MgAl$_{11}$O$_{19}$:CE, Tb, Mn, and Si$_{6-z}$Al$_z$O$_z$N$_{8-z}$:Eu. Specific examples of the color conversion material excited by the ultraviolet light emitted from the GaN-based semiconductor light-emitting device to emit blue light include blue light-emitting fluorescent particles and, more specifically, BaMgAl$_{10}$O$_{17}$:Eu, BaMg$_2$Al$_{16}$O$_{27}$: Eu, Sr$_2$P$_2$O$_7$:Eu, Sr$_5$(PO$_4$)$_3$Cl:Eu, (Sr, Ca, Ba, Mg)$_5$(PO$_4$)$_3$ Cl:Eu, CaWO$_4$, and CaWO$_4$:Pb. Specific examples of the color conversion material excited by the ultraviolet light emitted from the GaN-based semiconductor light-emitting device to emit yellow light include yellow light-emitting fluorescent particles and, more specifically, YAG fluorescent particles. These color conversion materials may be used alone or as a mixture of two or more. When a mixture of two or more color conversion materials is used, light of a color other than yellow, green, and red can be emitted from a color conversion material mixture. Specifically, for example, light of cyan color may be emitted. In this case, a mixture of the above-describe green light-emitting fluorescent particles and blue light-emitting fluorescent particles may be used.

The color conversion material is not limited to fluorescent particles, and multicolor high-efficiency luminescent particles using a quantum effect, for example, nanometer-size CdSe/ZnS and nanometer size silicon, can be used. It is known that rare earth atoms added to a semiconductor material emit sharp light by intranuclear transition, and luminescent particles using this technique can also be used.

In the light illuminator of the present invention including the above-described preferred constitution, white light may be emitted by mixing the light emitted from the GaN-based semiconductor light-emitting device and the light emitted from the color conversion material (for example, yellow, red and green, yellow and red, or green, yellow, and red). However, the present invention is not limited to this and can be applied to color-changeable illumination and display.

In order to achieve the object, an image display device according to a first embodiment of the present invention includes a GaN-based semiconductor light-emitting device for display an image, the GaN-based semiconductor light-emitting device including:

(A) a first GaN-based compound semiconductor layer having n-type conductivity;

(B) an active layer having a multi-quantum well structure including well layers and a barrier layer for separating between the well layers; and (C) a second GaN-based compound semiconductor layer having p-type conductivity;

wherein the well layers are disposed in the active layer so as to satisfy the relation $d_1 < d_2$ wherein $d_1$ is the well layer density on the first GaN-based compound semiconductor layer side in the active layer and $d_2$ is the well layer density on the second GaN-based compound semiconductor layer side.

Examples of the image display device according to the first embodiment of the present invention include image display devices with constitutions and structures which will be described below. Unless otherwise specified, the number of GaN-based semiconductor light-emitting devices constituting an image display device or a light-emitting device panel may be determined on the basis of the specifications required for the image display device. In addition, a light valve may be further provided on the basis of the specifications required for the image display device.

(1) Image Display Device According to Embodiment 1A . . . .

A passive matrix-type or active matrix-type, direct-view-type image display device including:

(α) a light-emitting device panel including GaN-based semiconductor light-emitting devices arranged in a two-dimensional matrix;

wherein the emission state of each of the GaN-based semiconductor light-emitting devices can be directly observed by controlling the emission/non-emission state of each GaN-based semiconductor light-emitting device to display an image.

(2) Image Display Device According to Embodiment 1B . . . .

A passive matrix-type or active matrix-type, projection-type image display device including:

(α) a light-emitting device panel including GaN-based semiconductor light-emitting devices arranged in a two-dimensional matrix;

wherein the emission/non-emission state of each GaN-based semiconductor light-emitting device is controlled to display an image by projection on a screen.

(3) Image Display Device According to Embodiment 1C . . . .

A color-display image display device (direct-view-type or projection-type) including:

(α) a red light-emitting device panel including red light-emitting semiconductor light-emitting devices (for example, AlGaInP-based semiconductor light-emitting devices or GaN-based semiconductor light-emitting devices, hereinafter) arranged in a two-dimensional matrix;

(β) a green light-emitting device panel including green light-emitting GaN-based semiconductor light-emitting devices arranged in a two-dimensional matrix;

(γ) a blue light-emitting device panel including blue light-emitting GaN-based semiconductor light-emitting devices arranged in a two-dimensional matrix; and (δ) means (for example, a dichroic prism, this applies to the description below) for collecting the light emitted from the red light-emitting device panel, the green light-emitting device panel, and the blue light-emitting device panel in an optical path;

wherein the emission/non-emission state of each of the red light-emitting semiconductor light-emitting devices, the green light-emitting semiconductor light-emitting devices, and the blue light-emitting semiconductor light-emitting devices is controlled.

(4) Image Display Device According to Embodiment 1D . . . .

An image display device (direct-view type or projection type) including:

(α) a GaN-based semiconductor light-emitting device; and (β) a light transmission controller (for example, a liquid crystal display, a digital micro-mirror device (DMD), or LCOS (Liquid Crystal On Silicon), this applies to the description below) which is a light valve for controlling transmission/non-transmission of light emitted from the GaN-based semiconductor light-emitting device;

wherein transmission/non-transmission of light emitted from the GaN-based semiconductor light-emitting device is controlled by the light transmission controller to display an image. The number of GaN-based semiconductor light-emitting devices may be determined on the basis of the specifications required for the image display device and may be 1 or more. In addition, examples of means (light guide member) for guiding light emitted from the GaN-based semiconductor light-emitting device to the light transmission controller include a light guiding member, a micro-lens array, a mirror and reflection plate, a condensing lens.

(5) Image Display Device According to Embodiment 1E . . . .

An image display device (direct-view type or projection type) including:

(α) a light-emitting device panel including GaN-based semiconductor light-emitting devices arranged in a two-dimensional matrix; and (β) a light transmission controller (a light valve) for controlling transmission/non-transmission of light emitted from the GaN-based semiconductor light-emitting devices;

wherein transmission/non-transmission of light emitted from the GaN-based semiconductor light-emitting devices is controlled by the light transmission controller to display an image.

(6) Image Display Device According to Embodiment 1F . . . .

A color-display image display device (direct-view-type or projection-type) including:

(α) a red light-emitting device panel including red light-emitting semiconductor light-emitting devices arranged in a two-dimensional matrix, and a red light transmission controller (light valve) for controlling transmission/non-transmission of light emitted from the red light-emitting device panel;

(β) a green light-emitting device panel including green light-emitting GaN-based semiconductor light-emitting devices arranged in a two-dimensional matrix, and a green light transmission controller (light valve) for controlling transmission/non-transmission of light emitted from the green light-emitting device panel;

(γ) a blue light-emitting device panel including blue light-emitting GaN-based semiconductor light-emitting devices arranged in a two-dimensional matrix, and a blue light transmission controller (light valve) for controlling transmission/non-transmission of light emitted from the blue light-emitting device panel; and (δ) means for collecting the light transmitted through the red light transmission controller, the green light transmission controller, and the blue light transmission controller in an optical path;

wherein the transmission/non-transmission of light emitted from each of the light-emitting device panels is controlled by the corresponding light transmission controller to display an image.

(7) Image Display Device According to Embodiment 1G . . . .

A field sequential-system, color-display image display device (direct-view type or projection type) including:

(α) a red light-emitting semiconductor light-emitting device;

(β) a green light-emitting GaN-based semiconductor light-emitting device;

(γ) a blue light-emitting GaN-based semiconductor light-emitting device;

(δ) means for collecting the light emitted from the red light-emitting semiconductor light-emitting device, the green light-emitting GaN-based semiconductor light-emitting device, and the blue light-emitting GaN-based semiconductor light-emitting device in an optical path; and (ε) a light transmission controller (light valve) for controlling transmission/non-transmission of light emitted from the means for colleting the light in the optical path;

wherein the transmission/non-transmission of light emitted from each of the light-emitting devices is controlled by the light transmission controller to display an image.

(8) Image Display Device According to Embodiment 1H . . . .

A field sequential-system, color-display image display device (direct-view type or projection type) including:

(α) a red light-emitting device panel including red light-emitting semiconductor light-emitting devices arranged in a two-dimensional matrix;

(β) a green light-emitting device panel including green light-emitting GaN-based semiconductor light-emitting devices arranged in a two-dimensional matrix;

(γ) a blue light-emitting device panel including blue light-emitting GaN-based semiconductor light-emitting devices arranged in a two-dimensional matrix;

(δ) means for collecting the light emitted from the red light-emitting device panel, the green light-emitting device panel, and the blue light-emitting device panel in an optical path; and (ε) a light transmission controller (light valve) for controlling transmission/non-transmission of light emitted from the means for colleting the light in the optical path;

wherein the transmission/non-transmission of light emitted from each of the light-emitting device panels is controlled by the light transmission controller to display an image.

In order to achieve the object, an image display device according to a second embodiment of the present invention includes light-emitting device units for displaying a color image, which are arranged in a two-dimensional matrix and each of which includes a first light-emitting device emitting blue light, a second light-emitting device emitting green light, and a third light-emitting device emitting red light, a GaN-based semiconductor light emitting device constituting at least one of the first light-emitting device, the second light-emitting device, and the third light-emitting device including:

(A) a first GaN-based compound semiconductor layer having n-type conductivity;

(B) an active layer having a multi-quantum well structure including well layers and a barrier layer for separating between the well layers; and (C) a second GaN-based compound semiconductor layer having p-type conductivity;

wherein the well layers are disposed in the active layer so as to satisfy the relation $d_1<d_2$ wherein $d_1$ is the well layer density on the first GaN-based compound semiconductor layer side in the active layer and $d_2$ is the well layer density on the second GaN-based compound semiconductor layer side.

Examples of the image display device according to the second embodiment of the present invention includes image display devices with constitutions and structures which will be described below. Unless otherwise specified, the number of light-emitting device units may be determined on the basis of the specifications required for the image display device. In addition, a light valve may be further provided on the basis of the specifications required for the image display device.

(1) Image Display Device According to Embodiment 2A . . . .

A passive matrix-type or active matrix-type, direct-view, color-display image display device wherein the emission/non-emission state of each of first, second, and third light-emitting devices is controlled to directly observe the emission state of each light-emitting device and display an image.

(2) Image Display Device According to Embodiment 2B . . . .

A passive matrix-type or active matrix-type, projection-type, color-display image display device wherein the emission/non-emission state of each of first, second, and third light-emitting devices is controlled to display an image by projection on a screen.

(3) Image Display Device According to Embodiment 2C . . . .

A field sequential-system, color-display image display device (direct-view type or projection type) including a light transmission controller (light valve) for controlling transmission/non-transmission of light emitted from each of light-emitting device units arranged in a two-dimensional matrix, wherein the emission/non-emission state of each of first, second, and third light-emitting devices in the light-emitting device units is time-division-controlled and transmission/non-transmission of each of the first, second, and third light-emitting devices is controlled by the light transmission controller to display an image.

In order to achieve the object, a planar light source device of the present invention for illuminating the back of a transmissive or transflective liquid crystal display device includes a GaN-based semiconductor light-emitting device provided as a light source, the GaN-based semiconductor light-emitting device including:

(A) a first GaN-based compound semiconductor layer having n-type conductivity;

(B) an active layer having a multi-quantum well structure including well layers and a barrier layer for separating between the well layers; and (C) a second GaN-based compound semiconductor layer having p-type conductivity;

wherein the well layers are disposed in the active layer so as to satisfy the relation $d_1<d_2$ wherein $d_1$ is the well layer density on the first GaN-based compound semiconductor layer side in the active layer and $d_2$ is the well layer density on the second GaN-based compound semiconductor layer side.

In order to achieve the object, a liquid crystal display assembly of the present invention includes a transmissive or transflective liquid crystal display device and a planar light source device for illuminating the back of the liquid crystal display device, a GaN-based semiconductor light-emitting device provided as a light source in the planar light source device including:

(A) a first GaN-based compound semiconductor layer having n-type conductivity;

(B) an active layer having a multi-quantum well structure including well layers and a barrier layer for separating between the well layers; and (C) a second GaN-based compound semiconductor layer having p-type conductivity;

wherein the well layers are disposed in the active layer so as to satisfy the relation $d_1<d_2$ wherein $d_1$ is the well layer density on the first GaN-based compound semiconductor layer side in the active layer and $d_2$ is the well layer density on the second GaN-based compound semiconductor layer side.

In the planar light source device of the present invention or the planar light source device in the liquid crystal display assembly of the present invention, the light source may include a first light-emitting device emitting blue light, a second light-emitting device emitting green light, and a third light-emitting device emitting red light, and the GaN-based semiconductor light emitting device constitutes at least one (one type) of the first light-emitting device, the second light-emitting device, and the third light-emitting device. However, the light source is not limited to this, and the light source in the planar light source device may include at least one of the light-emitting devices of the present invention. Each of the first light-emitting device, the second light-emitting device, and the third light-emitting device may be provided singly or in a plural number.

In the image display device according to the second embodiment of the present invention, the planar light source device of the present invention, or the liquid crystal display assembly of the present invention, when the light source includes a first light-emitting device, a second light-emitting device, and a third light-emitting device, the GaN-based semiconductor light emitting device constitutes at least one (one type) of the first light-emitting device, the second light-emitting device, and the third light-emitting device. In other words, any one (one type) of the first, second, and third light-emitting devices may include the GaN-based semiconductor light-emitting device, and the remaining two types of light-emitting devices may include semiconductor light-emitting devices with other constitutions. Any two types of the first, second, and third light-emitting devices may include the GaN-based semiconductor light-emitting devices, and the remaining one type of light-emitting device may include a semiconductor light-emitting device with another constitution. All the first, second, and third light-emitting devices may include the GaN-based semiconductor light-emitting devices. Semiconductor light-emitting devices with other constitutions include red light-emitting AlGaInP-based semiconductor light-emitting devices.

The planar light source device of the present invention or the planar light source device in the liquid crystal display assembly of the present invention may include two types of planar light source devices (back light), i.e., a direct-lighting type planar light source device disclosed in, for example, Japanese Unexamined Utility Model Registration Application Publication No. 63-187120 and Japanese Unexamined Patent Application Publication No. 2002-277870, and an edge light-type (also referred to as a "side light type") planar light source device disclosed in, for example, Japanese Unexamined Patent Application Publication No. 2002-131552. The number of GaN-based semiconductor light-emitting devices is basically arbitrary and may be determined on the basis of the specifications required for the planar light source device.

In the direct-lighting type planar light source device, the first, second, and third light-emitting devices are opposed to a liquid crystal display device, and a diffusion plate, a diffusion sheet, a prism sheet, an optical functional sheet group such as a polarization conversion sheet, or a reflection sheet is disposed between the light crystal display device and the first, second, and third light-emitting devices.

More specifically, in the direct-lighting type planar light source device, a red (for example, wavelength 640 nm) light-emitting semiconductor light-emitting device, a green (for example, wavelength 530 nm) light-emitting GaN-based semiconductor light-emitting device, and a blue (for example, wavelength 450 nm) light-emitting GaN-based semiconductor light-emitting device may be arranged in a casing. However, the planar light source device is not limited to this. When a plurality of red light-emitting semiconductor light-emitting devices, a plurality of green light-emitting GaN-based semiconductor light-emitting devices, and a plurality of blue light-emitting GaN-based semiconductor light-emitting devices are arranged in a casing, an example of the arrangement of these light-emitting devices is an arrangement in which a plurality of light-emitting device lines each including a group of a red light-emitting semiconductor light-emitting device, a green light-emitting GaN-based semiconductor light-emitting device, and a blue light-emitting GaN-based semiconductor light-emitting device is arrayed in the horizontal direction of the screen of the light crystal display device to form a light-emitting device line array, and a plurality of the light-emitting device line arrays is arrayed in the vertical direction of the screen of the liquid crystal display device. Examples of the light-emitting device line include several combinations such as (one red light-emitting semiconductor light-emitting device, one green light-emitting GaN-based semiconductor light-emitting device, and one blue light-emitting GaN-based semiconductor light-emitting device); (one red light-emitting semiconductor light-emitting device, two green light-emitting GaN-based semiconductor light-emitting devices, and one blue light-emitting GaN-based semiconductor light-emitting device); and (two red light-emitting semiconductor light-emitting devices, two green light-emitting GaN-based semiconductor light-emitting devices, and one blue light-emitting GaN-based semiconductor light-emitting device). Furthermore, a light-emitting device emitting light of a fourth color other than red, green, and blue may be further provided. A GaN-based semiconductor light-emitting device may be provided with a light extraction lens described in Nikkei Electronics, Dec. 20, 2004, No. 889, p. 128.

On the other hand, in the edge light-type planar light source device, a light guide plate is opposed to the liquid crystal display device, and a GaN-based semiconductor light-emitting device is disposed on a side (first side described below) of the light guide plate. The light guide plate has a first surface (bottom), a second surface (top) opposite to the first surface, the first side, a second side, a third side opposite to the first side, and a fourth side opposite to the second side. A specific example of the shape of the light guide plate is a wedge-shaped truncated quadrangular pyramid shape as a whole. In this case, the two opposing sides of the truncated quadrangular prism correspond to the first and second surfaces, and the bottom of the truncated quadrangular prism corresponds to the first side. Furthermore, projections and/or recesses are preferably provided on the surface of the first surface (bottom). In this case, light is incident on the first side of the light guide plate, and light is emitted from the second surface (top) toward the liquid crystal display device. The second surface of the light guide plate may be smooth (i.e., a mirror surface) or may be provided with blast crimps having a diffusion effect (i.e., a fine irregular surface).

In addition, projection and/or recesses are preferably provided on the first surface (bottom) of the light guide plate. Namely, projections, recesses, or unevenness is preferably provided on the first surface (bottom) of the light guide plate. When unevenness is provided, recesses and projections may be continuous or discontinuous. The projections and/or recesses provided on the first surface of the light guide plate may include continuous projections and/or recesses extending in a direction at a predetermined angle with the incidence direction of the light guide plate. In this structure, examples of a sectional shape of the continuous projections or recesses of the light guide plate taken along a virtual plane vertical to the first surface in the incidence direction of the light guide plate include a triangle; any desired quadrangles including a square, a rectangle, and a trapezoid; any desired polygons; and any desired smooth curves including a circle, an ellipse, a parabola, a hyperbola, and a catenary. The direction at a predetermined angle with the incidence direction of the light guide plate means the direction at 60° to 120° with respect to 0° of the incidence direction of the light guide plate. This applies to the description below. Alternatively, the projections and/or recesses provided on the first surface of the light guide plate may include discontinuous projections and/or recesses extending in a direction at a predetermined angle with the incidence direction of the light guide plate. Examples of the shape of the discontinuous projections and/or recesses include a pyramid, a cone, a cylinder, polygon poles such as a triangle pole and a square pole, and various smoothly curved surfaces such as a part of a sphere, a part of a spheroid of revolution, a part of a paraboloid of revolution, and a part of hyperboloid of revolution. In the light guide plate, the projections or recesses may not be formed in the periphery of the first surface according to circumstances. Further, light emitted from the light source and incident on the light guide plate is scattered by collision with the projection or recess formed on the first surface of the light guide plate. However, the height, depth, pitch, or shape of the projections or recesses provided on the first surface of the light guide plate may be made constant or changed away from the light source. In the latter case, for example, the pitch of the projections or recesses may be decreased away from the light source. The pitch of the projections or recesses means the pitch of the projection or recess along the incidence direction of the light guide plate.

In the planar light source device provided with the light guide plate, a reflective member is preferably disposed opposite to the first surface of the light guide plate. The liquid crystal display device is disposed opposite to the second surface of the light guide plate. Light emitted from the light source is incident on the first side (for example, corresponding to the bottom of a truncated quadrangular pyramid) of the light guide plate, scattered by collision with the projections or recesses of the first surface, emitted from the first surface, reflected by the reflective member, again incident on the first surface, and emitted from the second surface to illuminate the liquid crystal display device. For example, a diffusion sheet or a prism sheet may be disposed between the liquid crystal display device and the second surface of the light guide plate. The light emitted from the light source may be guided directly to the light guide plate or guided indirectly to the light guide plate. In the latter case, for example, an optical fiber may be used.

The light guide plate is preferably formed using a material which little absorbs light emitted from the light source. Examples of the material constituting the light guide plate include glass and plastic materials (e.g., PMMA, polycarbonate resins, acrylic resins, amorphous polypropylene resins, and styrene resins including AS resins).

For example, a transmissive color liquid crystal display device includes a front panel with a transparent first electrode, a rear panel with a transparent second electrode, and a liquid crystal material disposed between the front panel and the rear panel.

More specifically, the front panel includes a first substrate including, for example, a glass substrate or a silicon substrate, the transparent first electrode (also referred to as the "common electrode" and composed of ITO) provided on the inner surface of the first substrate, and a polarizing film provided on the outer surface of the first substrate. The front panel further includes a color filter provided on the inner surface of the first substrate and covered with an overcoat layer composed of an acrylic resin or an epoxy resin, the transparent first electrode being formed on the overcoat layer. Further, an alignment film is formed on the transparent first electrode. Examples of the arrangement pattern of the color filter include a delta arrangement, a stripe arrangement, a diagonal arrangement, and a rectangle arrangement. On the other hand, more specifically, the rear panel includes a second substrate including, for example, a glass substrate or a silicon substrate, a switching element and the transparent second electrode (also referred to as the "pixel electrode" and composed of ITO), which are provided on the inner surface of the second substrate so that conduction/non-conduction of the transparent second electrode is controlled by the switching element, and a polarizing film provided on the outer surface of the second substrate. Further, an alignment film is formed over the entire surface including the transparent second electrode. The members and the liquid crystal material which constitute the transmissive color liquid crystal display device may be known members and material. Examples of the switching element include three-terminal elements such as a MOS-type FET and thin film transistor (TFT) formed on a single crystal silicon semiconductor substrate, and two-terminal elements such as a MIM element, a varistor element, and a diode.

In the GaN-based semiconductor light-emitting device of the present invention, the light-emitting device, the image display device according to the first or second embodiment, the planar light source device, or the liquid crystal display assembly of the present invention with the above-described preferred forms and constitutions (these may be generically named the present invention hereinafter), it is preferred to satisfy the following relations:

$$500 \text{ (nm)} \leq \lambda_2 \leq 550 \text{ (nm)}$$

$$0 \leq |\lambda_2 - \lambda_3| \leq 5 \text{ (nm)}$$

wherein $\lambda_2$ (nm) is the emission wavelength of the active layer when the operating current density is 30 A/cm², and $\lambda_3$ (nm) is the emission wavelength of the active layer when the operating current density is 300 A/cm². Alternatively, it is preferred to satisfy the following relations:

$$500 \text{ (nm)} \leq \lambda_2 \leq 550 \text{ (nm)}$$

$$0 \leq |\lambda_1 - \lambda_2| \leq 10 \text{ (nm)}$$

$$0 \leq |\lambda_2 - \lambda_3| \leq 5 \text{ (nm)}$$

wherein $\lambda_1$ (nm) is the emission wavelength of the active layer when the operating current density is 1 A/cm², $\lambda_2$ (nm) is the emission wavelength of the active layer when the operating current density is 30 A/cm², and $\lambda_3$ (nm) is the emission wavelength of the active layer when the operating current density is 300 A/cm².

Alternatively, in the present invention with the above-described preferred constitutions, it is preferred to satisfy the following relations:

$$430 \text{ (nm)} \leq \lambda_2 \leq 480 \text{ (nm)}$$

$$0 \leq |\lambda_2 - \lambda_3| \leq 2 \text{ (nm)}$$

wherein $\lambda_2$ (nm) is the emission wavelength of the active layer when the operating current density is 30 A/cm², and $\lambda_3$ (nm) is the emission wavelength of the active layer when the operating current density is 300 A/cm² Alternatively, it is preferred to satisfy the following relations:

$$430 \text{ (nm)} \leq \lambda_2 \leq 480 \text{ (nm)}$$

$$0 \leq |\lambda_1 - \lambda_2| \leq 5 \text{ (nm)}$$

$$0 \leq |\lambda_2 - \lambda_3| \leq 2 \text{ (nm)}$$

wherein $\lambda_1$ (nm) is the emission wavelength of the active layer when the operating current density is 1 A/cm², $\lambda_2$ (nm) is the emission wavelength of the active layer when the operating current density is 30 A/cm², and $\lambda_3$ (nm) is the emission wavelength of the active layer when the operating current density is 300 A/cm².

In a semiconductor light-emitting device, the emission wavelength is generally changed by generation of heat or a temperature change in characteristic measurement. Therefore, in the present invention, characteristics at about room temperature (25° C.) are taken into consideration. When a GaN-based semiconductor light-emitting device generates a small quantity of heat, no problem occurs in driving with a DC current. However, when a large quantity of heat is generated, it is necessary to employ a measurement method such as driving with a pulse current, in which the temperature of a GaN-based semiconductor light-emitting device (temperature of a junction region) is not significantly changed from room temperature.

With respect to the emission wavelength, the wavelength of a power peak in a spectrum is taken into consideration. A spectrum in which human visual performance is taken into consideration, or a dominant wavelength usually used for expressing a color is not employed. Furthermore, a spectrum with apparent periodic variations, which are caused by many times of reflection of light emitted from an active layer due to thin film interference, may be observed according to measurement conditions. Therefore, a spectrum of light produced in an active layer and not containing such periodic variations is used.

The operating current density of a GaN-based semiconductor light-emitting device is a value obtained by dividing the operating current by the active layer area (area of a junction region). Namely, commercially available GaN-based semiconductor light-emitting devices have various package forms and different sizes depending on applications and quantities of light. In addition, the standard driving current (operating current) varies according to the size of the GaN-based semiconductor light-emitting device. Therefore, it is difficult to directly compare current dependencies of characteristics. In the present invention, for the purpose of generalization, the driving current is not used, but the expression "operating current density" (unit: ampere/cm$^2$) obtained by dividing the driving current by the active layer area (area of a junction region) is used.

In the present invention, in order to change the well layer density, the thicknesses of the barrier layers are preferably changed (specifically, in the active layer, the thickness of the barrier layer on the second GaN-based compound semiconductor layer side is smaller than that of the barrier layer on the first GaN-based compound semiconductor layer side) while the well layer thicknesses are constant. However, the present invention is not limited to this. The thicknesses of the well layers may be changed (specifically, in the active layer, the thickness of the well layer on the second GaN-based compound semiconductor layer side is larger than that of the well layer on the first GaN-based compound semiconductor layer side) while the barrier layer thickness is constant, or the thicknesses of both the well layer and the barrier layer may be changed.

In the present invention, the well layer density $d_1$ and the well layer density $d_2$ are defined as follows: When the active layer with a total thickness to is divided two parts in the thickness direction, the thickness of an active layer first region $AR_1$ on the first GaN-based compound semiconductor layer side is expressed by $t_1$, and the thickness of an active layer second region $AR_2$ on the second GaN-based compound semiconductor layer side is expressed by $t_2$ ($t_0=t_1+t_2$). In addition, the number of the well layers contained in the active layer first region $AR_1$ is expressed by $WL_1$ (a positive number and not limited to an integer), and the number of the well layers contained in the active layer second region $AR_2$ is expressed by $WL_2$ (a positive number and not limited to an integer, and total number WL of well layers=$WL_1+WL_2$). When a well layer (thickness $t_{IF}$) is present over the active layer first region $AR_1$ and the active layer second region $AR_2$, the number of the well layers contained in only the active layer first region $AR_1$ is expressed by $WL_1'$, and the number of the well layers contained in only the active layer second region $AR_2$ is expressed by $WL_2'$, and in the well layer (thickness $t_{IF}$) present over the active layer first region $AR_1$ and the active layer second region $AR_2$, the thickness contained in the active layer first region $AR_1$ is expressed by $t_{IF-1}$, and the thickness contained in the active layer second region $AR_2$ is expressed by $t_{IF-2}$ ($t_{IF}=t_{IF-1}+t_{IF-2}$). In this case, the following equations are established:

$$WL_1 = WL'_1 + \Delta WL_1$$

$$WL_2 = WL'_2 + \Delta WL_2$$

wherein $$\Delta WL_1 + \Delta WL_2 = 1$$

$$WL = WL_1 + WL_2$$
$$= WL'_1 + WL'_2 + 1$$

$$\Delta WL_1 = t_{IF-1}/t_{IF}$$

$$\Delta WL_2 = t_{IF-2}/t_{IF}$$

The well layer density $d_1$ and the well layer density $d_2$ can be determined by the following equations (1-1) and (1-2) wherein $k \equiv (t_0/WL)$:

$$d_1 = (WL_1/WL)/(t_1/t_0) \qquad (1\text{-}1)$$
$$= k(WL_1/t_1)$$

$$d_2 = (WL_2/WL)/(t_2/t_0) \qquad (1\text{-}2)$$
$$= k(WL_2/t_2)$$

In the present invention, when the total thickness of the active layer is $t_0$, the well layer density in the active layer first region $AR_1$ ranging from the first GaN-based compound semiconductor layer-side interface to the thickness of ($2t_0/3$) in the active layer is $d_1$, and the well layer density in the active layer second region $AR_2$ ranging from the second GaN-based compound semiconductor layer-side interface to the thickness of ($t_0/3$) in the active layer is $d_2$, the well layers may be disposed in the active layer to satisfy the relation $d_1<d_2$. Alternatively, when the total thickness of the active layer is to, the well layer density in the active layer first region $AR_1$ ranging from the first GaN-based compound semiconductor layer-side interface to the thickness of ($t_0/2$) in the active layer is $d_1$, and the well layer density in the active layer second region $AR_2$ ranging from the second GaN-based compound semiconductor layer-side interface to the thickness of ($t_0/2$) in the active layer is $d_2$, the well layers may be disposed in the active layer to satisfy the relation $d_1<d_2$. Alternatively, when the total thickness of the active layer is to, the well layer density in the active layer first region $AR_1$ ranging from the first GaN-based compound semiconductor layer-side interface to the thickness of ($t_0/3$) in the active layer is $d_1$, and the well layer density in the active layer second region $AR_2$ ranging from the second GaN-based compound semiconductor layer-side interface to the thickness of ($2t_0/3$) in the active layer is $d_2$, the well layers may be disposed in the active layer to satisfy the relation $d_1<d_2$.

In the present invention with the above-described various preferred forms and constitutions, the well layers are preferably disposed in the active layer to satisfy the relation $1<d_2/d_1 \leq 20$, preferably $1.2 \leq d_2/d_1 \leq 10$, and more preferably $1.5 \leq d_2/d_1 \leq 5$. This arrangement can be realized by forming barrier layers with uniform thicknesses. Specifically, the thicknesses of the barrier layers in the active layer are changed from the first GaN-based compound semiconductor layer side to the first GaN-based compound semiconductor layer side (for example, changed in multiple steps or three or more steps). More specifically, a structure may be used, in which the thicknesses of the barrier layers in the active layer are decreased stepwise from the first GaN-based compound semiconductor layer side to the first GaN-based compound semiconductor layer side.

Alternatively, in the present invention with the above-described various preferred forms and constitutions, the thicknesses of the barrier layers in the active layer are preferably changed, for example, stepwise so that the thickness of the barrier layer nearest the second GaN-based compound semiconductor layer is preferably 20 nm or less, or the thickness of the barrier layer nearest the first GaN-based compound semiconductor layer is twice or more the thickness of the barrier layer nearest the second GaN-based compound semiconductor layer.

Further, in the present invention with the above-described various preferred forms and constitutions, the active layer may contain indium atoms and, more specifically, the composition $Al_xGa_{1-x-y}In_yN$ (wherein $x \geq 0$, $y>0$, and $0<x+y \leq 1$). Examples of the first GaN-based compound semiconductor layer and the second GaN-based compound semiconductor layer include a GaN layer, an AlGaN layer, an InGaN layer, and AlInGaN layer. These compound semiconductor layers may further contain boron (B) atoms, thallium (Tl) atoms, arsenic (As) atoms, phosphorus (P) atoms, or antimony (Sb) atoms.

Further, in the present invention with the above-described various preferred forms and constitutions, the number (WL) of the well layers in the active layer is 2 or more and preferably 4 or more.

Further, in the present invention with the above-described various preferred forms and constitutions, the GaN-based semiconductor light-emitting device may further include:

(D) an underlying layer containing In atoms and formed between the first GaN-based compound semiconductor layer and the active layer; and (E) a superlattice layer containing a p-type dopant and formed between the active layer and the second GaN-based compound semiconductor layer.

In this constitution, the more stable operation of the GaN-based semiconductor light-emitting device can be achieved at a high operating current density while further improving the luminous efficiency and further decreasing the operating voltage.

In this constitution, an undoped GaN-based compound semiconductor layer is preferably formed between the active layer and the superlattice layer, the thickness of the undoped GaN-based compound semiconductor layer being 100 nm or less. The total thickness of the superlattice layer is preferably 5 nm or more, and the period of a superlattice structure in the superlattice layer is preferably 2-atom layer to 20 nm. In addition, the concentration of the p-type dopant contained in the superlattice layer is preferably $1 \times 10^{18}/cm^3$ to $4 \times 10^{20}/cm^3$. Alternatively, the thickness of the underlying layer is 20 nm or more, and an undoped GaN-based compound semiconductor layer is preferably formed between the underlying layer and the active layer, the thickness of the undoped GaN-based compound semiconductor layer being 50 nm or less. Further, the underlying layer and the active layer may contain In, and the In ratio in the underlying layer is 0.005 or more which is lower than that in the active layer. The underlying layer may contain $1 \times 10^{16}/cm^3$ to $1 \times 10^{21}/cm^3$ of n-type dopant.

The GaN-based compound semiconductor layer constituting the active layer is preferably composed of an undoped GaN-based compound semiconductor or the n-type impurity concentration of the GaN-based compound semiconductor layer constituting the active layer is preferably less than $2 \times 10^{17}/cm^3$.

Further, in the present invention with the above-described various preferred forms and constitutions, the length of the short side (when the active layer has a rectangular planar shape) or the short diameter (when the active layer has a circular or elliptic planar shape) of the active layer is 0.1 mm or less and preferably 0.03 mm or less. When the active layer has a planar shape such as a polygon or the like in which the short side or short diameter cannot be defined, the diameter of a circle estimated to have the same area as that of the active layer is defined as the short diameter. In the GaN-based semiconductor light-emitting device of the present invention, a shift of the emission wavelength, particularly, at a high operating current density is decreased. However, in a GaN-based semiconductor light-emitting device of a smaller size, the effect of decreasing a shift of the emission wavelength is significant. Therefore, when the present invention is applied to a GaN-based semiconductor light-emitting device of a smaller size than that of a conventional GaN-based semiconductor light-emitting device, it is possible to realize a high-density (high-definition) GaN-based semiconductor light-emitting device at a low cost and an image display device using the light-emitting device.

For example, when a 32-inch high-definition television receiver (1920×1080×RGB) generally used as a home television receiver is realized by arranging such GaN-based semiconductor light-emitting devices in a matrix, the size of one pixel including a combination of a red light-emitting device, a green light-emitting device, and blue light-emitting device corresponding to sub-pixels is about 360-μm square, and each sub-pixel essentially has a long side length of 300 μm and a short side length of 100 μm. Alternatively, for example, in a projection-type display in which such GaN-based semiconductor light-emitting devices are arranged in a matrix for projection through a lens, like in a conventional projection-type liquid crystal display device or DMD light valve, a size of 1 inch or less is preferred from the viewpoint of optical design and cost. Even in a three-plate type using a dichroic prism, in order to realize DVD of 1 inch in diagonal length with a general resolution of 720×480, the required size of a GaN-based semiconductor light-emitting device is 30 μm or less. In this way, when the short side (short diameter) is 0.1 mm or less and more preferably 0.03 mm or less, an emission wavelength shift in a region with the dimensions can be significantly decreased as compared with a conventional GaN-based semiconductor light-emitting device, thereby widening a practical application range and causing high usefulness.

In the present invention with the above-described various preferred forms and constitutions, as a method for forming various GaN-based compound semiconductor layers such as the first GaN-based compound semiconductor layer, the active layer, and the second GaN-based compound semiconductor layer, a metalorganic chemical vapor deposition method (MOCVD method), a MBE method, or a hydride vapor deposition method in which halogen contributes to transport or reaction can be used.

In the MOCVD method, trimethyl gallium (TMG) gas or triethyl gallium (TEG) gas can be used as an organic gallium source gas, and ammonia gas or hydrazine gas can be used as a nitrogen source gas. In forming the first GaN-based compound semiconductor layer having n-type conductivity, for example, silicon (Si) may be added as a n-type impurity (n-type dopant). In forming the second GaN-based compound semiconductor layer having p-type conductivity, for example, magnesium (Mg) may be added as a p-type impurity (p-type dopant). When a GaN-based compound semiconductor layer contains aluminum (Al) or indium (In) as a constituent atom, trimethylaluminum (TMA) gas may be used as an Al source or trimethylindium (TMI) gas may be used as an In source. In addition, monosilane gas ($SiH_4$ gas) may be used as a Si source, and cyclopentadienyl magnesium gas, methylcyclopentadienyl magnesium, or biscyclopentadienyl magnesium ($Cp_2Mg$) may be used as a Mg source. Examples of the n-type impurity (n-type dopant) other than Si include Ge, Se, Sn, C, and Ti. Examples of the p-type impurity (p-type dopant) other than Mg include Zn, Cd, Be, Ca, Ba, and O.

A p-type electrode connected to the second GaN-based compound semiconductor layer having p-type conductivity preferably has a single-layer or multi-layer structure containing at least one metal selected from the group consisting of palladium (Pd), platinum (Pt), nickel (Ni), Al (aluminum), Ti (titanium), gold (Au), and silver (Ag). A transparent conductive material such as ITO (Indium Tin Oxide) may be used. In particular, silver (Ag), Ag/Ni, or Ag/Ni/Pt, which can reflect light with high efficiency, is preferably used. A n-type electrode connected to the first GaN-based compound semiconductor layer having n-type conductivity preferably has a single-layer or multi-layer structure containing at least one metal selected from the group consisting of gold (Au), silver (Ag), palladium (Pd), Al (aluminum), Ti (titanium), tungsten (W), Cu (copper), Zn (zinc), tin (Sn), and indium (In). For example, Ti/Au, Ti/Al, or Ti/Pt/Au can be used. The n-type electrode and the p-type electrode can be formed by a PVD method such as vacuum evaporation or sputtering.

Further, a pad electrode may be provided on each of the n-type electrode and the p-type electrode, for electrically connecting the electrode to an external electrode or circuit. The pad electrode preferably has a single-layer or multi-layer structure containing at least one metal selected from the group consisting of Ti (titanium), Al (aluminum), Pt (platinum), Au (gold), and Ni (nickel). The pad electrode may have a multilayer structure, for example, a Ti/Pt/Au multilayer structure or a Ti/Au multilayer structure.

In the present invention with the above-described preferred forms and constitutions, an assembly of a GaN-based semiconductor light-emitting device may have a face-up structure or a flip-chip structure.

In the present invention, the quantity of light (luminance) emitted from a GaN-based semiconductor light-emitting device can be controlled by controlling the pulse width of the driving current, the pulse density of the driving current, or combination of both, in addition to the control of the peak current value of the driving current. This is because a change in the peak current value of the driving current slightly affects the emission wavelength of a GaN-based semiconductor light-emitting device.

Specifically, for example, in one type of GaN-based semiconductor light-emitting device, the peak current of a driving current for a certain emission wavelength $\lambda_0$ is expressed by $I_0$, and the pulse width of the driving current is expressed by $P_0$. In a GaN-based semiconductor light-emitting device or a light illuminator, an image display device, a planar light source device, or a liquid crystal display assembly, in which the GaN-based semiconductor light-emitting device is incorporated, the one-operation period of the GaN-based semiconductor light-emitting device is expressed by $T_{OP}$. In this case, a control method includes:

(1) controlling (adjusting) the peak current value $I_0$ of the driving current to control the quantity of light (luminance) emitted from the GaN-based semiconductor light-emitting device; and (2) controlling the pulse width $P_0$ of the driving current (pulse width control of driving current) to control the quantity of light (brightness or luminance) emitted from the GaN-based semiconductor light-emitting device; and/or (3) controlling the number of pulses (pulse density) with the pulse width $P_0$ in the one-operation period $T_{OP}$ of the GaN-based semiconductor light-emitting device (pulse density control of driving current) to control the quantity of light (brightness or luminance) emitted from the GaN-based semiconductor light-emitting device.

The above-described control of the quantity of light emitted from the GaN-based semiconductor light-emitting device can be achieved by a driving circuit for the GaN-based semiconductor light-emitting device, the driving circuit including:

(a) pulse driving current supply means for supplying a pulse driving current to the GaN-based semiconductor light-emitting device;

(b) pulse driving current setting means for setting the pulse width and pulse density of the driving current; and (c) means for setting the peak current value.

The driving current can be applied to not only the GaN-based semiconductor light-emitting device of the present invention characterized by the well layer density but also a conventional GaN-based semiconductor light-emitting device.

The GaN-based semiconductor light-emitting device of the present invention can be exemplified by a light-emitting diode (LED) and a semiconductor laser (LD). The structure and constitution of the GaN-based semiconductor light-emitting device are not particularly limited as long as the multilayer structure thereof has a light-emitting diode structure or laser structure. Besides the above-described light-emitting device, image display device, planar light source device, and liquid crystal display assembly including a color liquid crystal display assembly, the application field of the GaN-based semiconductor light-emitting device of the present invention includes lamp fittings and lamps for transport means such as automobiles, electric railcars, ships, and aircrafts (e.g., headlights, tail lights, high-mount stop lights, small lights, turn signal lights, fog lights, room lamps, meter-panel lights, light sources provided in various buttons, destination lamps, emergency lamps, and emergency exit guide lights); various lamp fittings and lamps in buildings (e.g., outdoor lights, room lamps, lightings, emergency lights, and emergency exit guide lights); various indicating lamp fittings of street lights, traffic signals, advertising displays, machines, and apparatuses; lightings and lighting parts in tunnels and underground passages; special illuminations in various inspection devices such as biological microscopes; sterilizers using light; deodorizing sterilizers combined with optical catalysts; exposure devices for photographs and semiconductor lithography; and devices for modulating light to transmit information through spaces, optical fibers, or waveguides.

In the present invention, the well layers are disposed in the active layer so as to satisfy the relation $d_1 < d_2$ wherein $d_1$ is the well layer density on the first GaN-based compound semiconductor layer side in the active layer and $d_2$ is the well layer density on the second GaN-based compound semiconductor layer side. Therefore, it is possible to suppress a large shift of the emission wavelength due to an increase in the operating current density while improving the luminous efficiency. As a result of experiments conducted by the inventors, it was found that in a GaN-based semiconductor light-emitting device, a well layer contributing light emission is gradually shifted to a well layer on the second GaN-based compound semiconductor layer side as the operating current density increases. A possible cause is a difference in mobility between electrons and holes. It is thought that since holes have low mobility in a GaN-based compound semiconductor, holes reach only a well layer near the second GaN-based compound semiconductor layer, and thus light emission due to recombination of holes and electrons is localized on the second GaN-based compound semiconductor layer side. In addition, with respect to the carrier transmittance of a hetero-barrier including a well layer and a barrier layer, another possible cause is that holes with large effective mass have difficulty in reaching a well layer on the first GaN-based compound semiconductor layer side through a plurality of barrier layers. Namely, in the present invention, a large number of well layers are present in a range (the second GaN-based compound semiconductor layer side) where holes can reach. For example, since the thickness of the barrier layer on the first GaN-based compound semiconductor layer side in the active layer is larger than that of the barrier layer on the second GaN-based compound semiconductor layer side in the active layer, the transmittance of holes is improved to facilitate uniform distribution of holes. As a cause of a shift of the emission wavelength to the short wavelength side due to an increase in the operating current density in a GaN-based semiconductor light-emitting device, "band filling of localized level" and "screening of piezo-electric field" accompanying an increase in carrier concentration in a well layer have been proposed. However, holes are effectively distributed to improve the recombination probability, and holes are uniformly distributed to decrease the carrier concentration per well layer, thereby possibly decreasing a shift of the emission wavelength to the short wavelength side.

Therefore, even when the driving current (operating current) of a GaN-based semiconductor light-emitting device is increased for increasing the optical output of the GaN-based semiconductor light-emitting device, the problem of causing a shift of the emission wavelength due to an increase in the driving current (operating current) can be prevented. In particular, when the operating current density in a blue light-emitting or green light-emitting GaN-based semiconductor light-emitting device is increased to 30 A/cm$^2$ or further increased to 50 A/cm$^2$ or 100 A/cm$^2$ or more, a larger effect (increasing luminance and decreasing a shift of the emission wavelength to the short wavelength side) can be obtained. In the present invention, since light emission from well layers localized in a specified region of the active layer is effectively used, a higher efficiency can be realized by a synergistic effect with a light extraction technique having a high optical resonator effect, and an improvement in characteristics of a semiconductor layer can be expected.

In the image display device, the planar light source device, or the liquid crystal display assembly including a color liquid crystal display assembly, the pulse width and/or the pulse density of the driving current is controlled, and the GaN-based semiconductor light-emitting device is driven at a high peak current of the driving current (operating current) to increase optical output, thereby increasing luminance while decreasing a shift of the emission wavelength, i.e., in the state where the emission wavelength is not much changed due to a change in the driving current (operating current). In other words, the luminance can be controlled by controlling the pulse width and/or the pulse density of the driving current and controlling the peak current of the driving current (operating current). Therefore, the number of control parameters of luminance is increased in comparison to a conventional technique, thereby permitting luminance control in a wider range. Namely, a wide dynamic range of luminance can be obtained. Specifically, for example, the luminance of the whole device may be controlled by controlling the peak current of the driving current (operating current), and the luminance may be finely controlled by controlling the pulse width and/or the pulse density of the driving current. In contrast, the luminance of the whole device may be controlled by controlling the pulse width and/or the pulse density of the driving current, and the luminance may be finely controlled by controlling the peak current of the driving current (operating current). Since a light-emitting device causes a small shift of the emission wavelength of the GaN-based semiconductor light-emitting device, stable chromaticity can be realized regardless of the current value. In particular, this control is useful for a white light source including a combination of a blue or near-ultraviolet GaN-based semiconductor light-emitting device and a color conversion material.

Additional features and advantages of the present invention are described in, and will be apparent from, the following Detailed Description and the Figures.

BRIEF DESCRIPTION OF THE FIGURES

FIG. 5 is a conceptual view showing the state in which a driving current is supplied to a GaN-based semiconductor light-emitting device in order to evaluate the GaN-based semiconductor light-emitting device.

Figure 1:
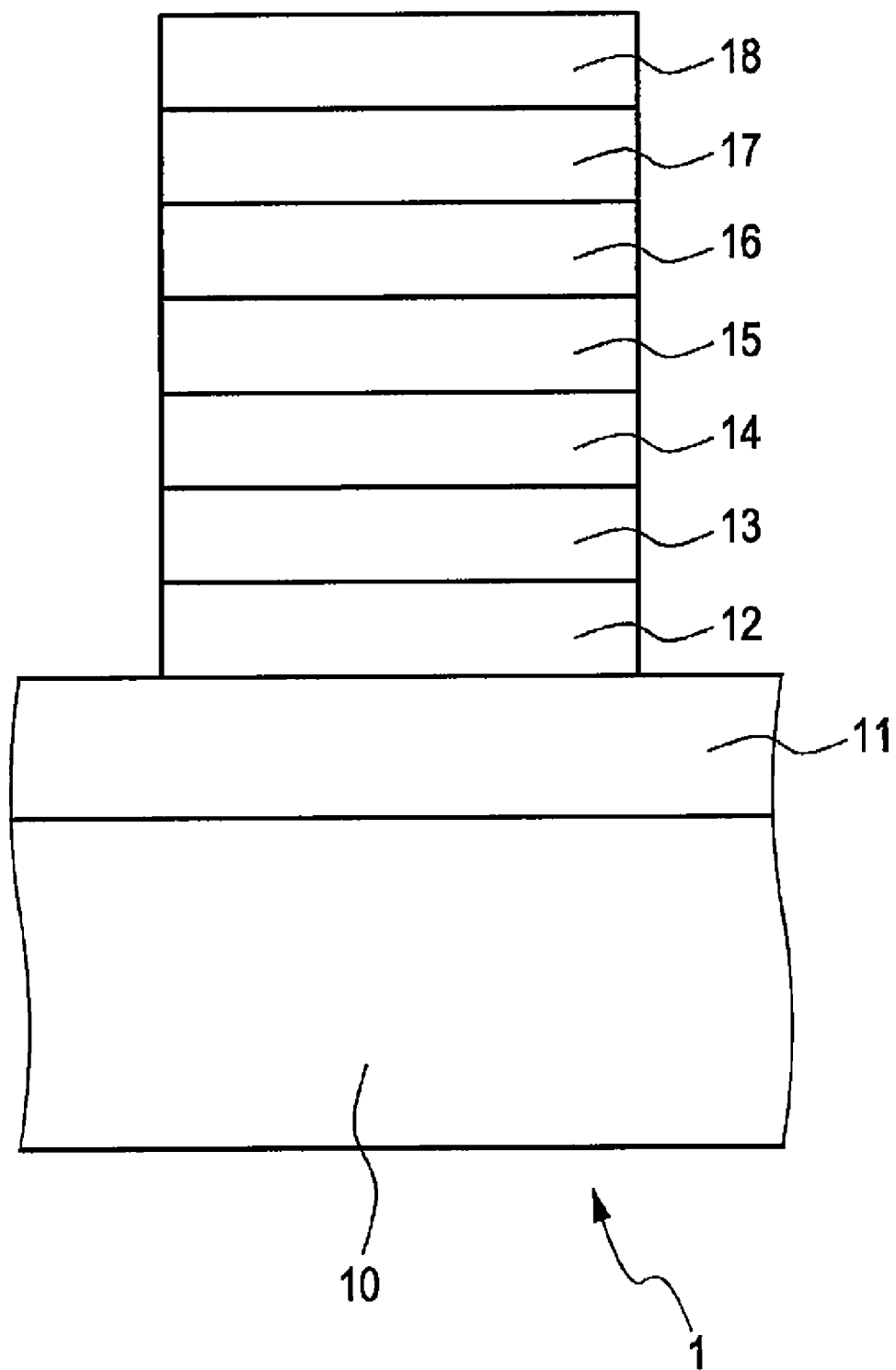
FIG. 1 is a conceptual view showing the layer structure of a GaN-based semiconductor light-emitting device of Example 1.

REFERENCE NUMERALS 1, 101 ... GaN-based semiconductor light-emitting device, UN ... light-emitting device unit, 10 ... substrate, 11 ... buffer layer, 12 ... undoped GaN layer, 13 ... first GaN-based compound semiconductor layer with n-type conductivity, 14 ... undoped GaN layer, 15 ... active layer, 16 ... undoped GaN layer, 17 ... second GaN-based compound semiconductor layer with p-type conductivity, 18 ... Mg-doped GaN layer, 19A ... n-type electrode, 19B ... p-type electrode, 21 ... sub-mount, 22 ... plastic lens, 23A ... gold wire, 23B ... outer electrode, 24 ... reflector cup, 25 ... heat sink, 26 ... driving circuit, 27 ... control part, 28 ... driving current source, 29 ... pulse generator circuit, 30 ... driver, 41, 43 ... column driver, 42, 44 ... row driver, 45 ... driver, 50 ... light-emitting device panel, 51 ... support, 52 ... X-direction wiring, 53 ... Y-direction wiring, 54 ... transparent substrate, 55 ... micro lens, 56 ... projection lens, 57 ... dichroic prism, 58 ... liquid crystal display device, 59 ... light guide member, 102 ... heat sink, 200, 200A ... color liquid crystal display assembly, 210 ... color liquid crystal display device, 220 ... front panel, 221 ... first substrate, 222 ... color filter, 223 ... overcoat layer, 224 ... transparent first electrode, 225 ... alignment film, 226 ... polarizing film, 227 ... liquid crystal material, 230 ... rear panel, 231 ... second substrate, 232 ... switching element, 234 ... transparent second electrode, 235 ... alignment film, 236 ... polarizing film, 240 ... planar light source device, 241 ... casing, 242A ... bottom of casing, 242B ... side surface of casing, 243 ... outer frame, 244 ... inner frame, 245A, 245B ... spacer, 246 ... guide member, 247 ... bracket member, 251 ... diffusion plate, 252 ... diffusion sheet, 253 ... prism sheet, 254 ... polarization conversion sheet, 255 ... reflective sheet, 250 ... planar light source device, 260 ... light source, 270 ... light guide plate, 271 ... first surface of light guide plate, 272 ... irregularity of first surface, 273 ... second surface of light guide plate, 274 ... first side surface of light guide plate, 275 ... second side surface of light guide plate, 276 ... third side surface of light guide plate, 281 ... reflective member, 282 ... diffusion sheet, 283 ... prism sheet, 301, 302 ... solder layer, 303 ... aluminum layer, 304 ... SiO$_2$ layer, 304 ... passivation layer

DETAILED DESCRIPTION

The characteristics of a GaN-based light-emitting diode were preliminarily examined prior to description of the present invention on the basis of examples with reference to the drawings.

Namely, a GaN-based semiconductor light-emitting device (reference product 0) including an active layer having nine well layers and eight barrier layers was produced. The GaN-based semiconductor light-emitting device has a structure shown in a conceptual view of FIG. 1 in which a buffer layer 11 (thickness 30 nm); an undoped GaN layer 12 (thickness 1 μm); a first GaN-based compound semiconductor layer 13 with n-type conductivity (thickness 3 μm); an undoped GaN layer 14 (thickness 5 nm); an active layer 15 having a multi-quantum well structure including well layers and barrier layers for separating between the well layers (the well layers and the barrier layers are not shown in the drawing); an undoped GaN layer 16 (thickness 10 nm); a second GaN-based compound semiconductor layer 17 with p-type conductivity (thickness 20 nm); and a Mg-doped GaN layer (contact layer) 18 (thickness 100 nm) are stacked in order. In some drawings, the buffer layer 11, the undoped GaN- layer 12, the undoped GaN layer 14, the undoped GaN layer 16, and the Mg-doped GaN layer 18 are not shown. The undoped GaN layer 14 is provided for improving the crystallinity of the active layer 15 formed thereon by crystal growth, and the undoped GaN layer 16 is provided for preventing a dopant (for example, Mg) in the second GaN-based compound semiconductor layer 17 from diffusing into the active layer 15. In the active layer 15, each well layer is an InGaN ($In_{0.23}Ga_{0.77}N$) layer having a thickness of 3 nm and an In ratio of 0.23, and each barrier layer is a GaN layer having a thickness of 15 nm. The well layers with such a composition may be referred to as "composition-A well layers".

In the GaN-based semiconductor light-emitting device (reference product-0), at an operating current density of 60 A/cm², the emission peak wavelength was 515 nm, and the luminous efficiency was 180 mW/A. Like a commercial LED, when the light-emitting device is mounted on a high-reflectivity mount and subjected to resin molding with high refractive index, an efficiency of about two times or more can be obtained in total luminous flux measurement.

Next, a GaN-based semiconductor light-emitting device with a similar layer structure was produced, in which the In composition ratio of only a specified layer of the nine well layers was adjusted, i.e., a well layer (may be referred to as composition-B well layer for the convenience sake) of InGaN ($In_{0.15}Ga_{0.85}N$) having a thickness of 3 nm and an In ratio of 0.15 was provided, and the other eight layers were composition-A well layers. A GaN-based semiconductor light-emitting device in which the first well layer from the first GaN-based compound semiconductor layer side is a composition-B well layer is referred to as a "reference product-1"; a GaN-based semiconductor light-emitting device in which the third well layer is a composition-B well layer is referred to as a "reference product-2"; a GaN-based semiconductor light-emitting device in which the fifth well layer is a composition-B well layer is referred to as a "reference product-3"; a GaN-based semiconductor light-emitting device in which the seventh well layer is a composition-B well layer is referred to as a "reference product-4"; and a GaN-based semiconductor light-emitting device in which the ninth well layer is a composition-B well layer is referred to as a "reference product-5". In each of the GaN-based semiconductor light-emitting device of reference products-1 to 5, the other well layers were composition-A well layers as described above.

The purpose of this experiment is that when light is emitted from a green light-emitting GaN-based semiconductor light-emitting device (light-emitting diode) having nine well layers, the luminous ratios of the well layers are visualized.

Figure 36:
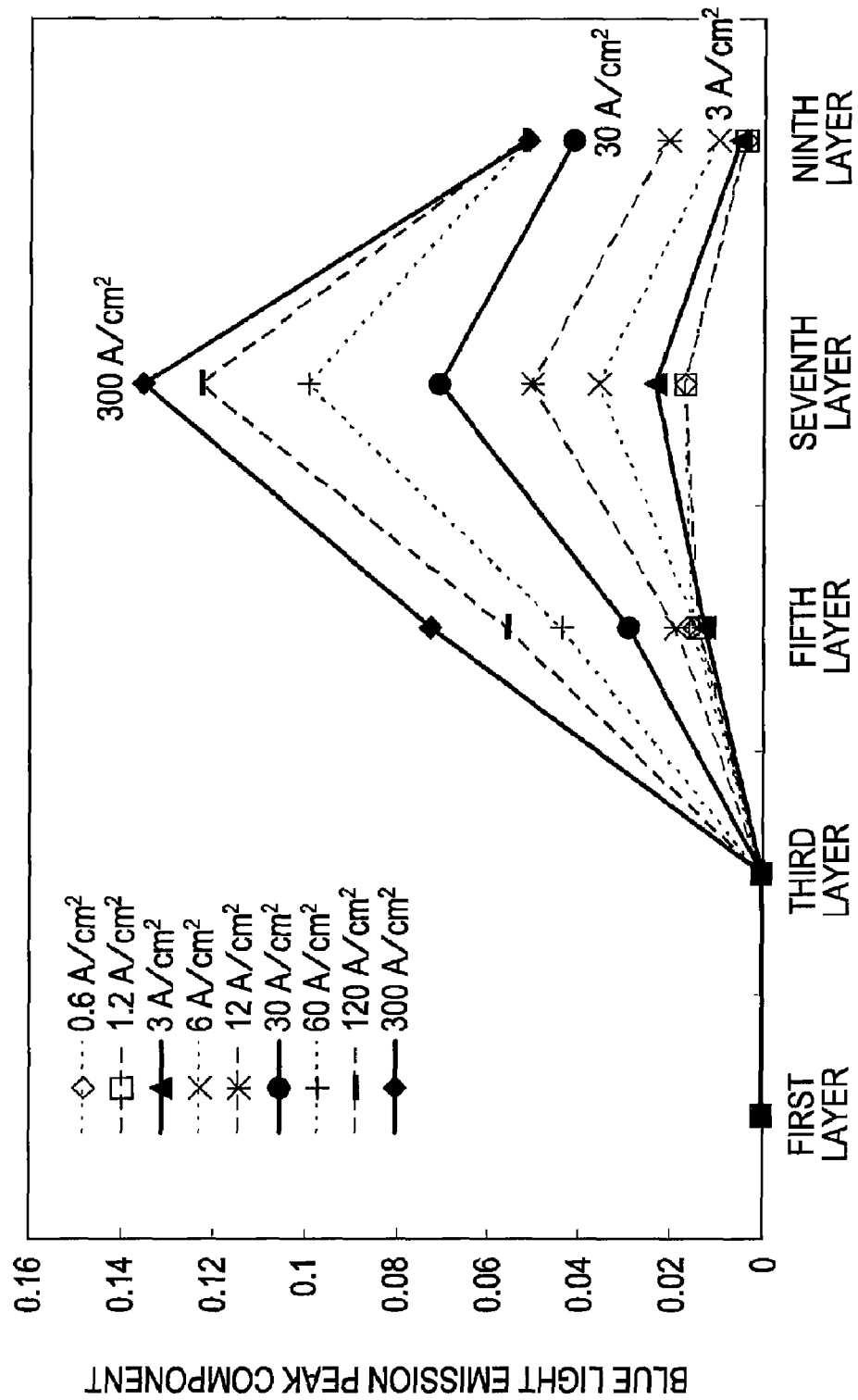
FIG. 36 is a graph in which the ratios of a blue light emission peak component to the whole in a GaN-based semiconductor light-emitting device of each of reference products 1 to 5 are plotted.

In each of the GaN-based semiconductor light-emitting devices of the reference products-1 to 5, at an operating current density of 60 A/cm², the emission peak wavelength was 515 nm, and the luminous efficiency was 180 mW/A. However, some reference products, a small emission peak was observed in a blue emission region (emission wavelength: about 450 nm) other than green emission (emission wavelength: about 515 nm) due to the composition-B well layers. The ratios of the blue emission peak component to the whole are plotted in FIG. 36. In FIG. 36, the first layer, the third layer, . . . inn the abscissa show positions of the composition-B well layers from the first GaN-based compound semiconductor layer side. Namely, the data of the ratio of the blue emission peak component to the whole corresponding to the Qth layer (Q=1, 3, 5, 7, or 9) indicates the data of the ratio of the blue emission peak component of the Qth well layer to the whole for each operating current density in the GaN-based semiconductor light-emitting device having the composition-B well layers.

It is necessary to pay attention to the point that green emission (emission wavelength: about 515 nm) and blue emission (emission wavelength: about 450 nm) are different in band gap energy by 350 meV, and the typical decay times are different (for example, in FIG. 6 of S. F. Chichibu, et al., Materials Science & Engineering B59(1999), p. 298, the emission decay time of LED having an In composition ratio of 0.15 (blue light emission) is 6 nanoseconds, while the emission decay time of LED having an In composition ratio of 0.22 (green light emission) is 9 nanoseconds). However, the method of experimentally showing an emission distribution as shown in FIG. 36 is a nonconventional method.

As shown in FIG. 36, at any operating current density, emission is localized in a region of about ⅔ of the active layer in the thickness direction on the second GaN-based compound semiconductor layer side of the active layer having a multi-quantum well structure. In addition, 80% of emission is caused in a region of ½ in the thickness direction of the active layer on the second GaN-based compound semiconductor layer side. A possible cause of significant localization of emission is a difference in mobility between electrons and holes, as described in PCT Japanese Translation Patent Publication No. 2003-520453. Since holes have low mobility in a GaN-based compound semiconductor, holes reach only the well layers near the second GaN-based compound semiconductor layer, and thus emission due to recombination of holes and electrons is possibly localized on the second GaN-based compound semiconductor layer side. In addition, with respect to carrier transmittance of a hetero barrier layer including well layers and barrier layers, another possible cause is that holes with a large effective mass have difficulty in reaching well layers on the first GaN-based compound semiconductor layer side through a plurality of barrier layers.

Therefore, in order to effectively utilize emission localized on the second GaN-based compound semiconductor layer side, a multi-quantum well structure with a well layer asymmetric distribution which is localized on the second GaN-based compound semiconductor layer side can be proposed. Further, it is found that the emission distribution has a peak in a region of ⅓ to ¼ of the active layer in the thickness direction on the second GaN-based compound semiconductor layer side. It is also found that as in a semiconductor layer or a light-emitting diode using an optical resonator effect (refer to, for example, Y. C. Shen, et al., Applied Physics Letters, vol. 82 (2003), p. 2221), in order to realize higher-efficiency induced emission or light extraction by concentrating well layers serving as luminescent layers in a specified narrow region, it is preferred to use a multi-quantum well structure in which the well layer distribution is localized in a region of about ⅓ of the active layer in the thickness direction on the second GaN-based compound semiconductor layer side.

EXAMPLE 1

Figure 2:
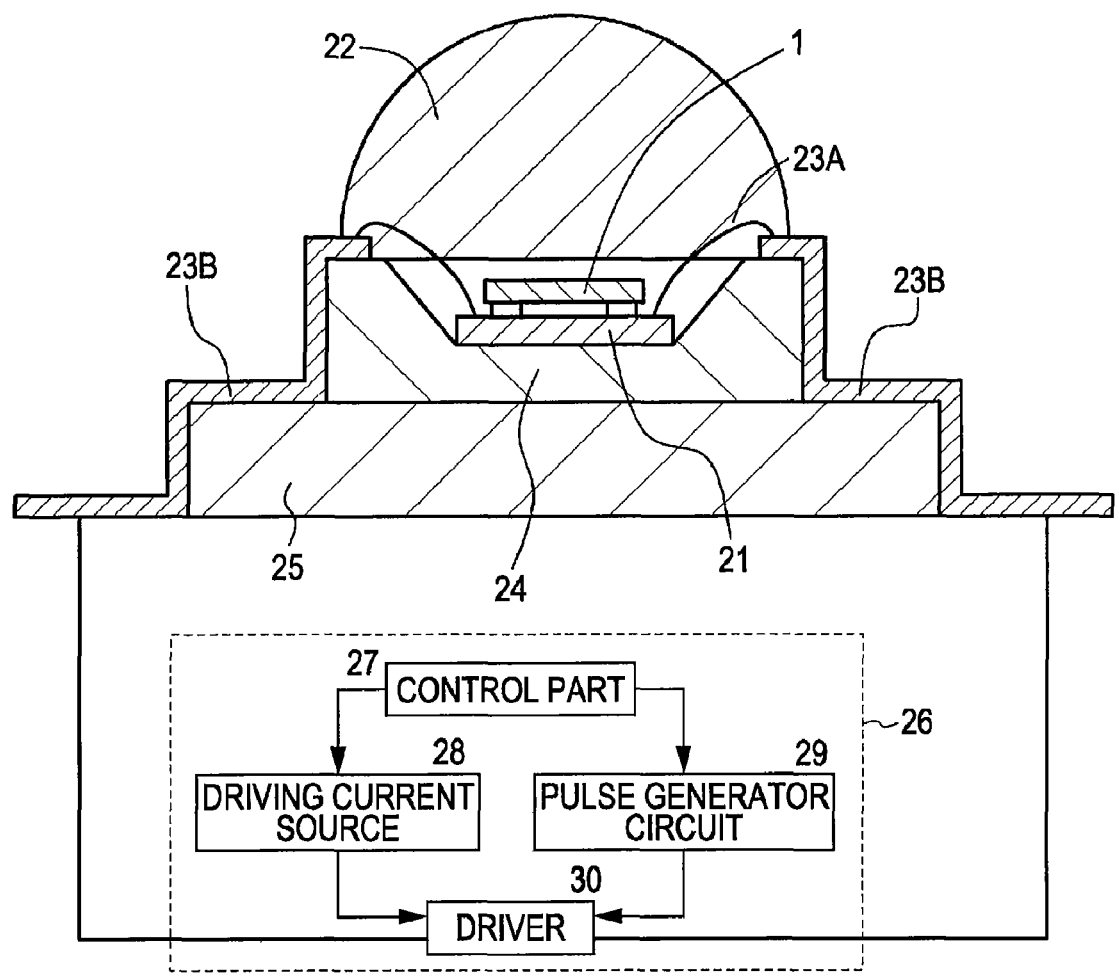
FIG. 2 is a schematic sectional view of a GaN-based semiconductor light-emitting device of Example 1.

Example 1 relates to a GaN-based semiconductor light-emitting device of the present invention and, more specifically, a light-emitting diode (LED). FIG. 1 is a conceptual view of a layer structure, and FIG. 2 is a schematic sectional view. A GaN-based semiconductor light-emitting device 1 of Example 1 has the same layer constitution and structure as the reference product-0 except the constitution and structure of the active layer 15.

The GaN-based semiconductor light-emitting device 1 is fixed to a sub-mount 21 and electrically connected to an outer electrode 23B through wiring (not shown) and gold wires 23A provided on the sub-mount 21, the outer electrode 23B being electrically connected to a driving circuit 26. The sub-mount 21 is attached to a reflector cup 24 which is provided on a heat sink 25. Further, a plastic lens 22 is disposed above the GaN-based semiconductor light-emitting device 1, and the space between the plastic lens 22 and the GaN-based semiconductor light-emitting device 1 is filled with a light-transmitting medium layer (not shown) for light emitted from the GaN-based semiconductor light-emitting device 1, for example, a transparent epoxy resin (refractive index: for example, 1.5), a gelatinous material (e.g., trade name OCK-451 (refractive index: 1.51) or trade name OCK-433 (refractive index: 1.46) of Nye Lubricants Inc.), silicone rubber, or an oil compound material such as silicone oil compound (e.g., trade name TSK5353 (refractive index: 1.45) of Toshiba Silicone Co., Ltd.).

In addition, the well layers are disposed in the active layer 15 so as to satisfy the relation $d_1 < d_2$ wherein $d_1$ is the well layer density on the first GaN-based compound semiconductor layer side in the active layer 15 and $d_2$ is the well layer density on the second GaN-based compound semiconductor layer side. Details of a multi-quantum well structure of the active layer 15 are shown in Table 1 below. In Table 1 and Tables 2 and 3 given below, a numeral in parentheses at the right of the thickness of each of the well layers and barrier layers represents the integrated thickness from the first GaN-based compound semiconductor layer-side interface in the active layer 15 (more specifically, the interface between the undoped GaN layer 14 and the active layer 15 in Example 1).

TABLE 1

| | Example 1 | Comparative Example 1 | Modified example A of Example 1 |
|---|---|---|---|
| Total thickness of active layer ($t_0$ nm) | 150 | 147 | 162 |
| | | The active layer is divided into two parts at $2t_0/3$ | |
| Thickness of active layer first region ($t_1$ nm) | 100 | 98 | 108 |
| Thickness of active layer second region ($t_2$ nm) | 50 | 49 | 54 |
| Number of well layers (WL) | 10 | 10 | 9 |
| Number of barrier layers | 9 | 9 | 8 |
| Number or well layers in active layer first region $WL_1$ | 6 | 6 + ⅔ | 4 + ⅓ |
| Number or well layers in active layer second region $WL_2$ | 4 | 3 + ⅓ | 4 + ⅔ |
| Well layer density in active layer first region $d_1$ | 0.90 | 1.00 | 0.72 |
| Well layer density in active layer second region $d_2$ | 1.20 | 1.00 | 1.04 |
| Thickness of first well layer (nm) | 3 (3) | 3 (3) | 3 (3) |
| Thickness of first barrier layer (nm) | 25 (28) | 13 (16) | 50 (53) |
| Thickness of second well layer (nm) | 3 (31) | 3 (19) | 3 (56) |
| Thickness of second barrier layer (nm) | 25 (56) | 13 (32) | 25 (81) |
| Thickness of third well layer (nm) | 3 (59) | 3 (35) | 3 (84) |
| Thickness of third barrier layer (nm) | 10 (69) | 13 (48) | 10 (94) |
| Thickness of fourth well layer (nm) | 3 (72) | 3 (51) | 3 (97) |
| Thickness of fourth barrier layer (nm) | 10 (82) | 13 (64) | 10 (107) |
| Thickness of fifth well layer (nm) | 3 (85) | 3 (67) | 3 (110) |
| Thickness of fifth barrier layer (nm) | 10 (95) | 13 (80) | 10 (120) |
| Thickness of sixth well layer (nm) | 3 (98) | 3 (83) | 3 (123) |
| Thickness of sixth barrier layer (nm) | 10 (108) | 13 (96) | 10 (133) |
| Thickness of seventh well layer (nm) | 3 (111) | 3 (99) | 3 (136) |
| Thickness of seventh barrier layer (nm) | 10 (121) | 13 (112) | 10 (146) |
| Thickness of eighth well layer (nm) | 3 (124) | 3 (115) | 3 (149) |
| Thickness of eighth barrier well layer (nm) | 10 (134) | 13 (128) | 10 (159) |
| Thickness of ninth well layer (nm) | 3 (137) | 3 (131) | 3 (162) |
| Thickness of ninth barrier layer (nm) | 10 (147) | 13 (144) | |
| Thickness of tenth well layer (nm) | 3 (150) | 3 (147) | |

In Example 1, when the total thickness of the active layer 15 is $t_0$, the well layer density in an active layer first region $AR_1$ ranging from the first GaN-based compound semiconductor layer-side interface (more specifically, the interface between the undoped GaN layer 14 and the active layer 15 in Example 1) to the thickness of $(2t_0/3)$ in the active layer 15 is $d_1$, and the well layer density in an active layer second region $AR_2$ ranging from the second GaN-based compound semiconductor layer-side interface (more specifically, the interface between the undoped GaN layer 16 and the active layer 15 in Example 1) to the thickness of $(t_0/3)$ is $d_2$, the well layers are disposed in the active layer 15 to satisfy the relation $d_1 < d_2$.

Specifically, the well layer density $d_1$ and the well layer density $d_2$ are determined from the equations (1-1) and (1-2) as follows:

EXAMPLE 1

$$d_2 = (WL_2 / WL) / (t_2 / t_0)$$
$$= (4/10) / (50/150)$$
$$= 1.20$$

-continued $$d_1 = (WL_1/WL)/(t_1/t_0)$$
$$= (6/10)/(100/150)$$
$$= 0.90$$

For comparison, a GaN-based semiconductor light-emitting device including an active layer shown as Comparative Example 1 in Table 1 was produced.

Figure 6A:
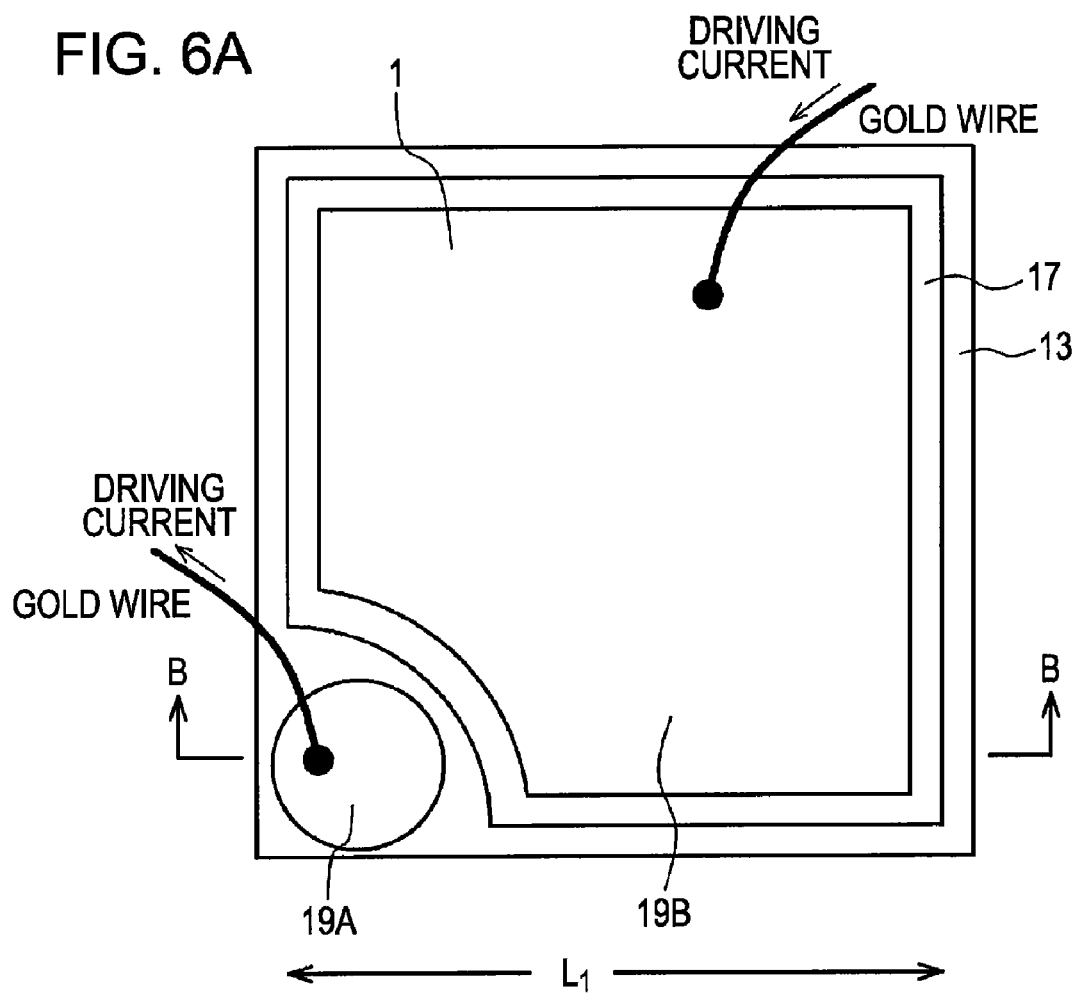
FIG. 6A is schematic top view of a GaN-based semiconductor light-emitting device of Example 1.
Figure 6B:
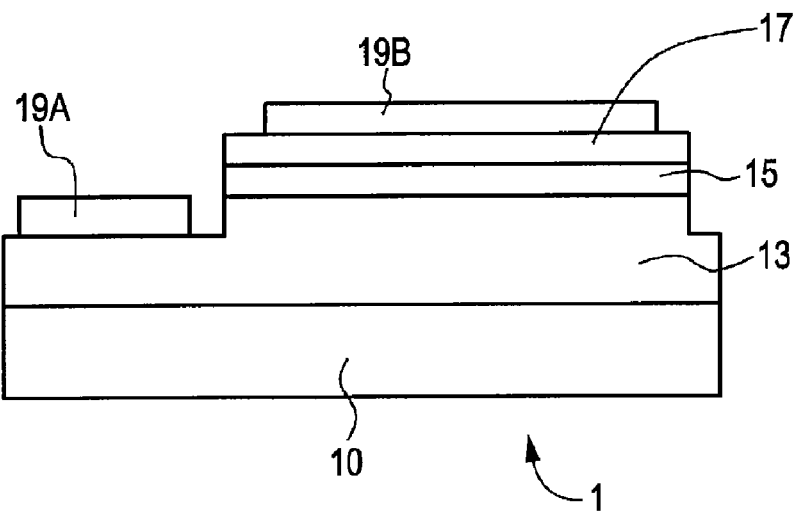
FIG. 6B is a schematic sectional view (in which oblique lines are omitted) taken along arrows B-B in FIG. 6A.
Figure 7:
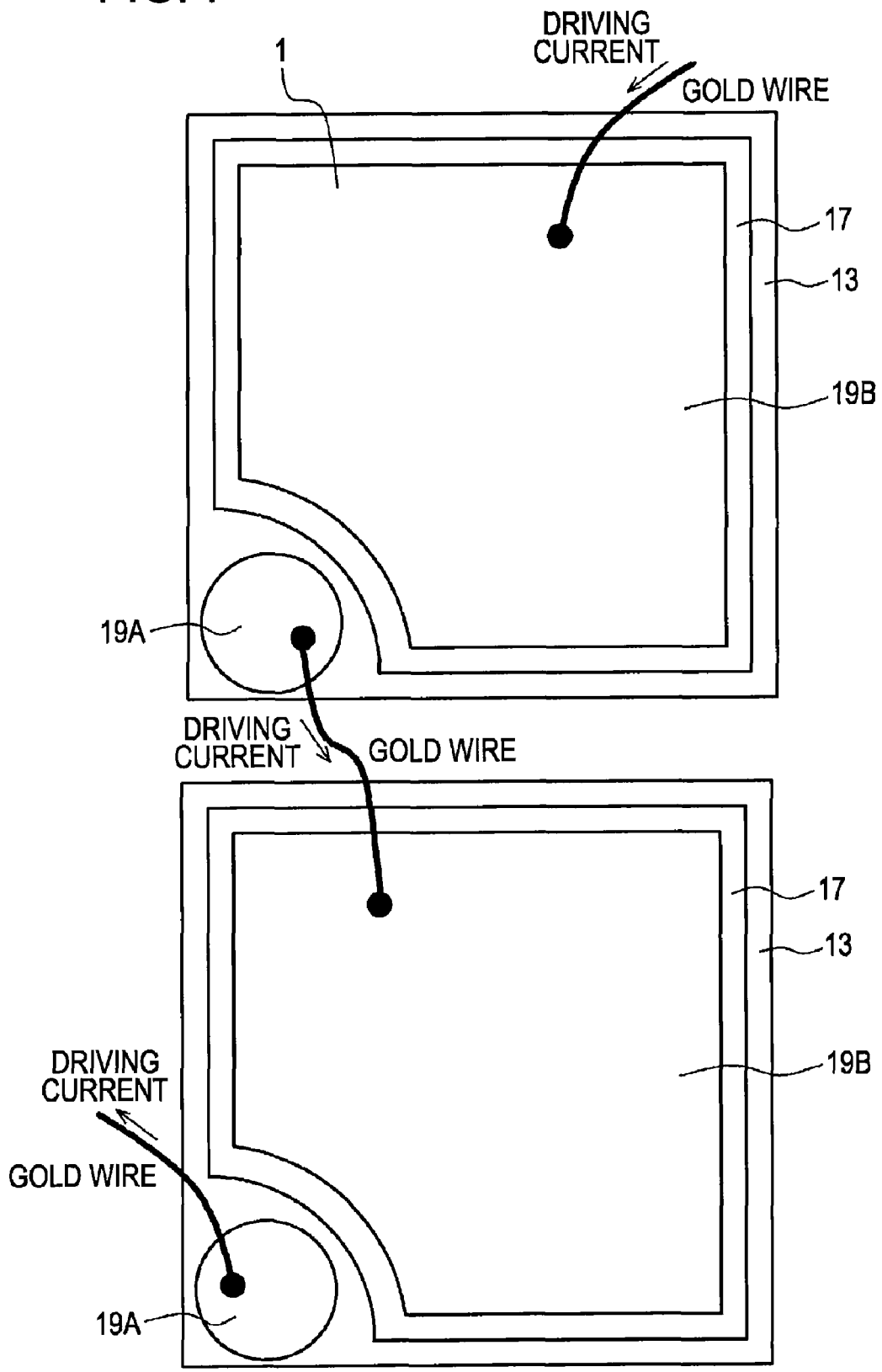
FIG. 7 is a schematic top view showing two GaN-based semiconductor light-emitting devices which are connected in series.

In each of the GaN-based semiconductor light-emitting devices of Example 1 and Comparative Example 1, in order to evaluate and simplify the manufacture process, the first GaN-based compound semiconductor layer 13 with n-type conductivity was partially exposed on the basis of a lithography process and an etching process, a p-type electrode 19B composed of Ag/Ni was formed on the Mg-doped GaN layer 18, and a n-type electrode 19A composed of Ti/Al was formed on the first GaN-based compound semiconductor layer 13. Then, probe tips were brought into contact with the n-type electrode 19A and the p-type electrode 19B, and a driving current was supplied to detect light emitted from the back of the substrate 10. This state is shown in a conceptual view of FIG. 5. FIG. 6A is a schematic top view of the GaN-based semiconductor light-emitting device 1, and FIG. 6B is a schematic sectional view (in which oblique lines are omitted) taken along arrows B-B in FIG. 6A. The operating current density of a GaN-based semiconductor light-emitting device is a value obtained by dividing the operating current by the area of an active layer (area of a junction region). For example, when the active layer area (area of a junction region) of the GaN-based semiconductor light-emitting device 1 shown in FIGS. 6A and 6B is $6 \times 10^{-4}$ cm$^2$, and the driving current is 20 mA, the operating current density is calculated at 33 A/cm$^2$. For example, even in a state in which the GaN-based semiconductor light-emitting devices are connected in series as shown in FIG. 7, the operating current density is calculated at 33 A/cm$^2$.

The well layer density $d_1$ and the well layer density $d_2$ in Comparative Example 1 are determined from the equations (1-1) and (1-2) as follows:

COMPARATIVE EXAMPLE 1

$$d_2 = (WL_2/WL)/(t_2/t_0)$$
$$= ((3+1/3)/10)/(49/147)$$
$$= 1.00$$

$$d_1 = (WL_1/WL)/(t_1/t_0)$$
$$= \{(6+2/3)\}/10\}/(98/147)$$
$$= 1.00$$

Figure 3:
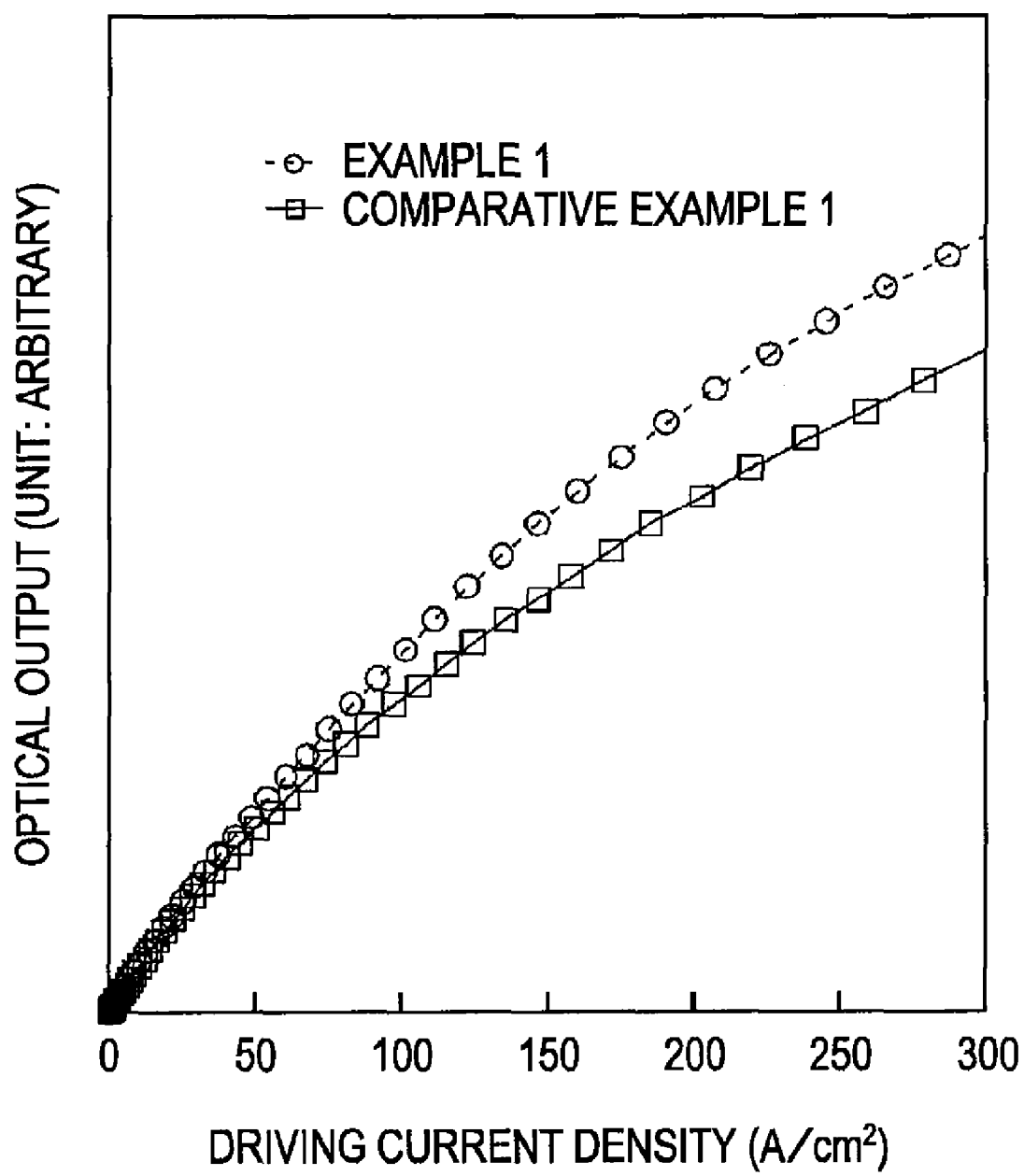
FIG. 3 is a graph showing the results of measurement of a relationship between the operating current density and optical output of each of GaN-based semiconductor light-emitting devices of Example 1 and Comparative Example 1.

FIG. 3 shows the results of measurement of a relationship between the operating current density and optical output of a GaN-based semiconductor light-emitting device. The optical output of the GaN-based semiconductor light-emitting device 1 of Example 1 more increases than in Comparative Example 1 corresponding to a conventional GaN-based semiconductor light-emitting device. The difference in optical output between the GaN-based semiconductor light-emitting devices of Example 1 and Comparative Example 1 becomes significant at an operating current density of 50 A/cm$^2$ or more and is 10% or more at an operating current density of 100 A/cm$^2$ or more. Namely, since the optical output of the GaN-based semiconductor light-emitting device 1 of Example 1 more increases than in a conventional GaN-based semiconductor light-emitting device at an operating current density of 50 A/cm$^2$ or more and preferably 100 A/cm$^2$ or more, the GaN-based semiconductor light-emitting device 1 is preferably used at an operating current density of 50 A/cm$^2$ or more and more preferably 100 A/cm$^2$ or more.

Figure 4:
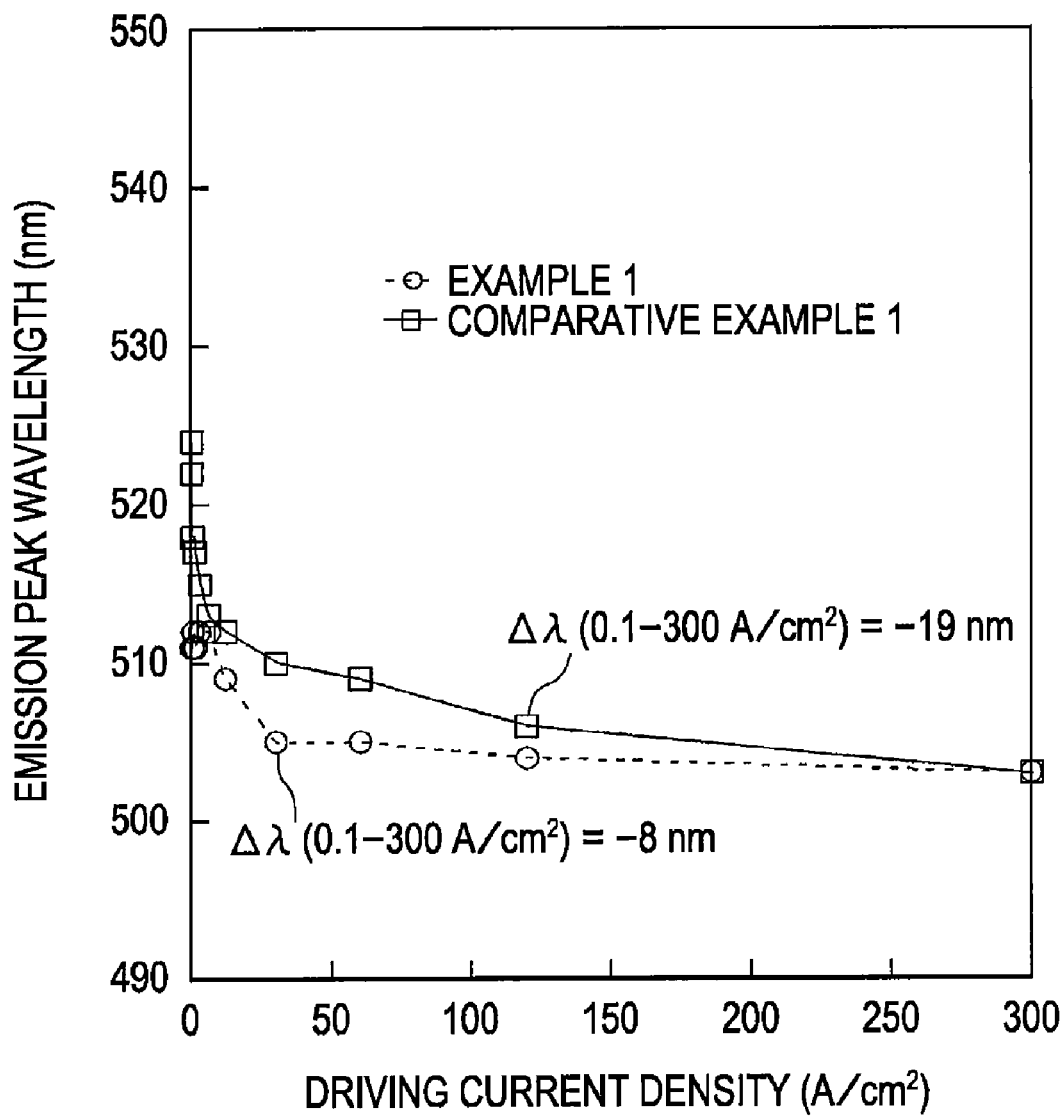
FIG. 4 is a graph showing a relationship between the operating current density and emission peak wavelength of each of GaN-based semiconductor light-emitting devices of Example 1 and Comparative Example 1.

Further, FIG. 4 shows a relationship between the operating current density and emission peak wavelength of a GaN-based semiconductor light-emitting device. When the operating current density is increased from 0.1 A/cm$^2$ to 300 A/cm$^2$, in Comparative Example 1, $\Delta\lambda = -19$ nm, while in Example 1, $\Delta\lambda = -8$ nm, and thus a small emission wavelength shift is realized. In particular, at an operating current density of 30 A/cm$^2$ or more, substantially no wavelength shift is observed. In other words, since the emission wavelength is little changed at an operating current density of 30 A/cm$^2$ or more, the operating current density is preferred from the viewpoint of control of the emission wavelength and luminous color. In particular, at an operating current density of 50 A/cm$^2$ or more, further 100 A/cm$^2$ or more, the GaN-based semiconductor light-emitting device 1 of Example 1 causes a significantly smaller wavelength shift than that of a conventional GaN-based semiconductor light-emitting device of Comparative Example 1, and is thus apparently superior to the conventional GaN-based semiconductor light-emitting device.

In order to theoretically prove the effect, band diagrams of Example 1 and Comparative Example 1 were calculated. The compositions and doping concentrations were as described below in [Step—100] to [Step—140], and the n-type impurity concentration in the active layer was $1 \times 10^{17}$/cm$^3$. In addition, an outer bias was 3 volts.

Figure 8:
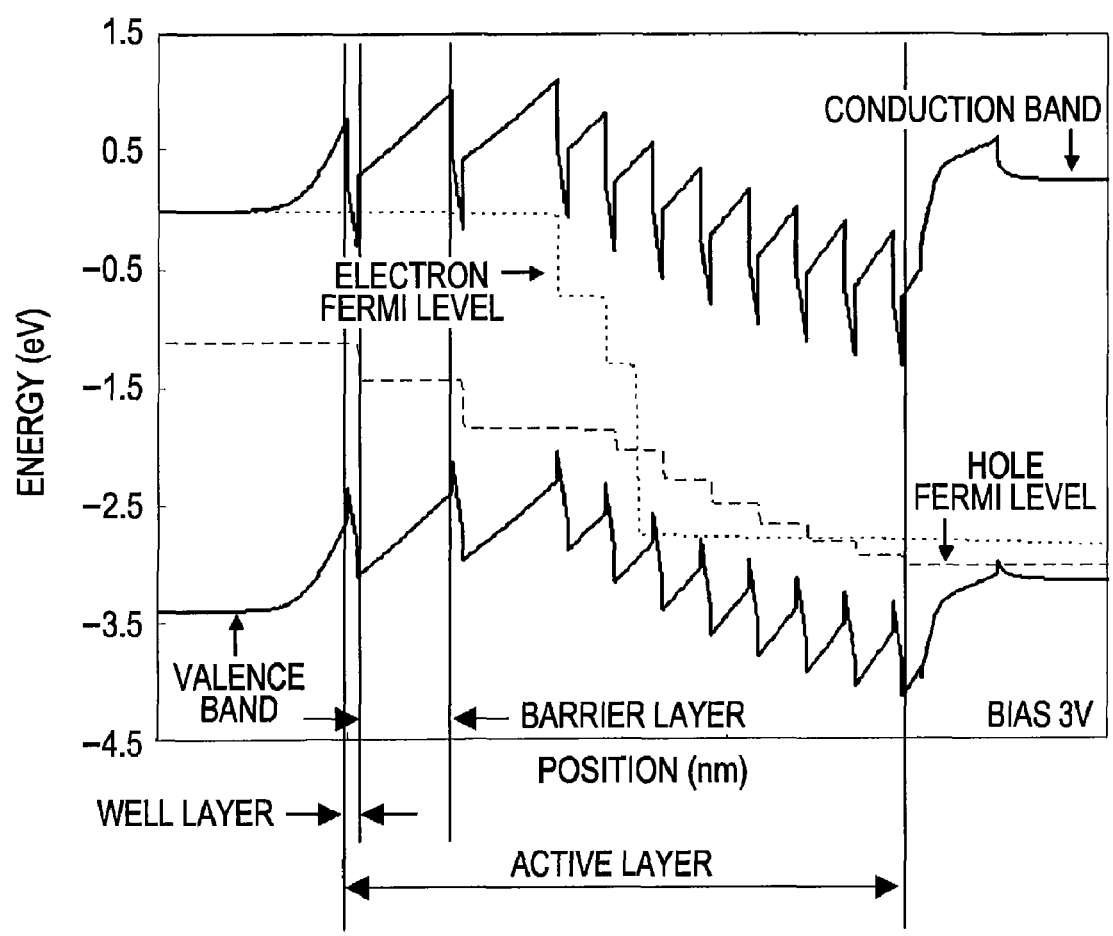
FIG. 8 is a graph showing a band diagram and Fermi levels near an active layer in Example 1.
Figure 9:
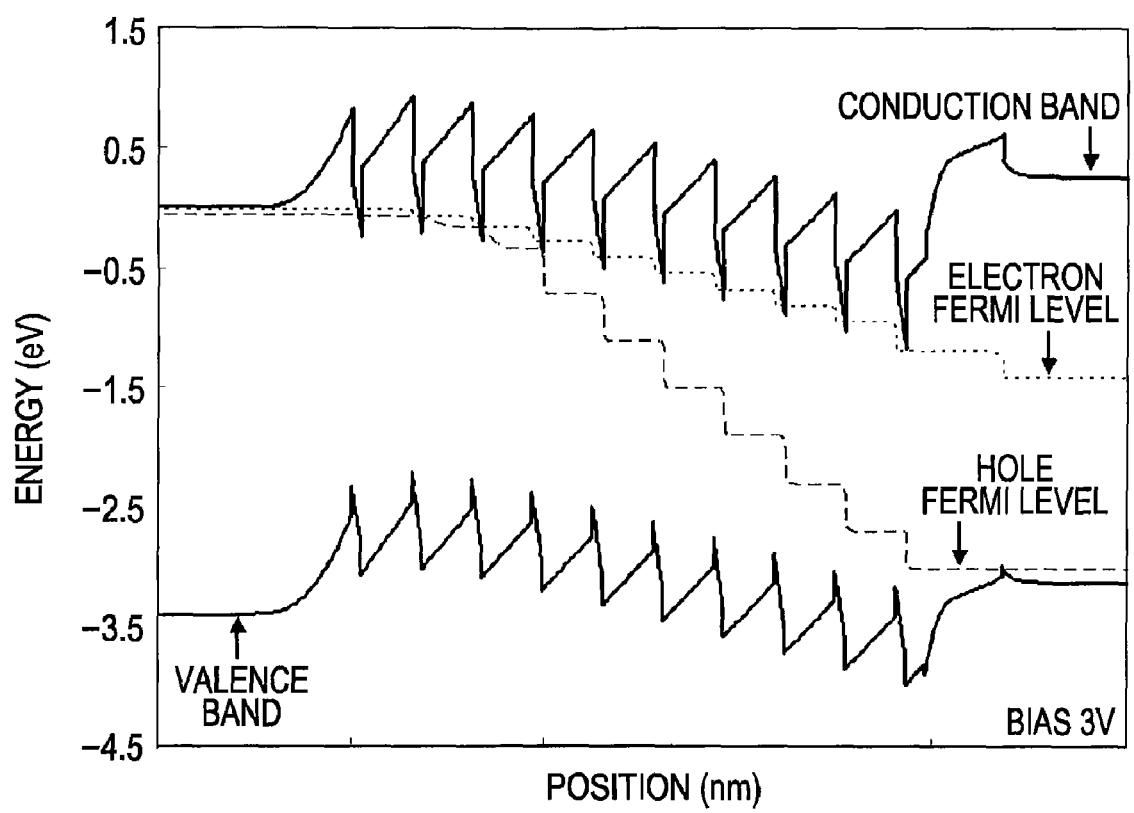
FIG. 9 is a graph showing a band diagram and Fermi levels near an active layer in Comparative Example 1.

The diagrams and Fermi levels near the active layers of Example 1 and Comparative Example 1, which were determined by calculation, are shown in FIGS. 8 and 9, respectively. In any one of Example 1 and Comparative Example 1, the active layer includes ten well layers and is characterized by band inclination (diagonally right down) due to a piezo electric field in the well layers and large band bending (diagonally right up) before and after the well layers. The difference between Example 1 and Comparative Example 1 appears in the envelopes thereof. In Comparative Example 1 in which the well layers are uniformly distributed, the envelope is gently diagonally right down, while in Example 1, the envelope is greatly bend at a portion (about ⅓ from the interface between the active layer and the first GaN-based compound semiconductor layer) where the barrier layer is changed in thickness.

Figure 10:
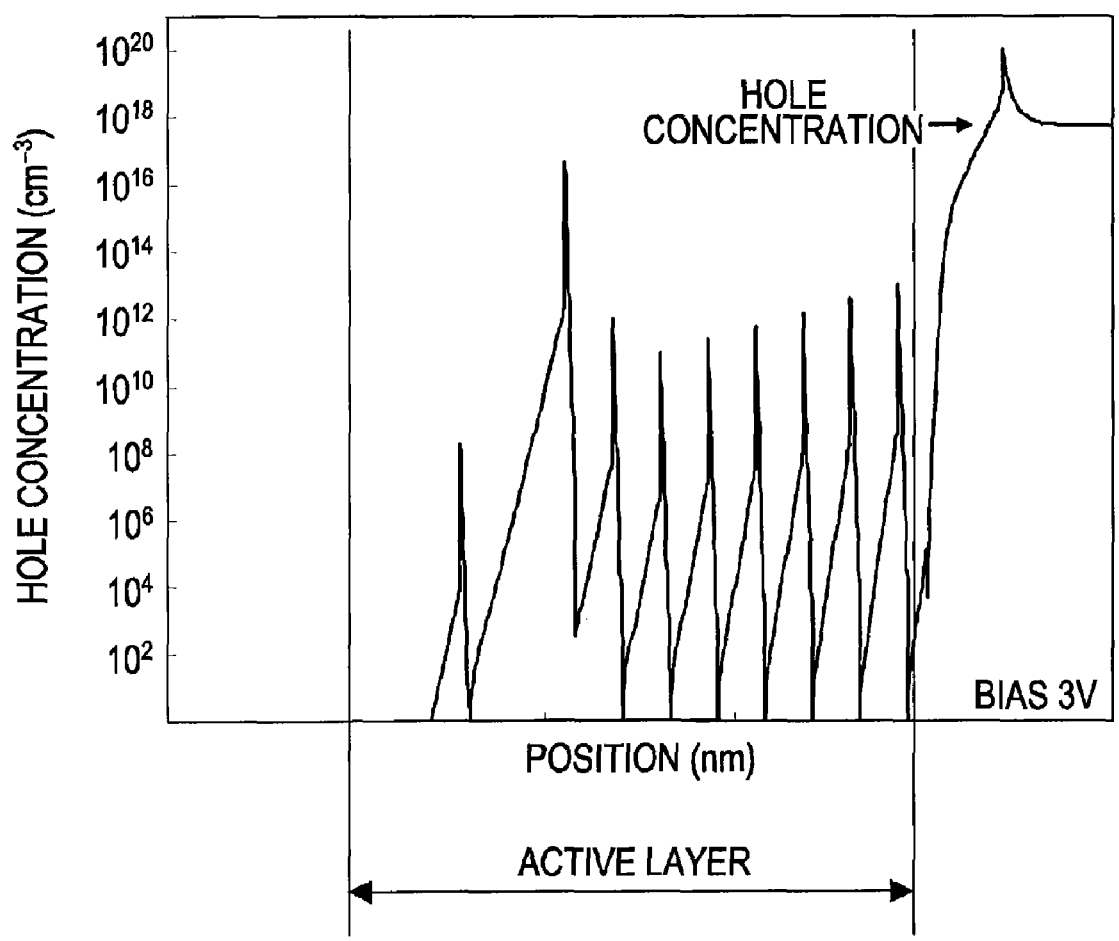
FIG. 10 is a graph showing the results of calculation of hole concentrations in Example 1.
Figure 11:
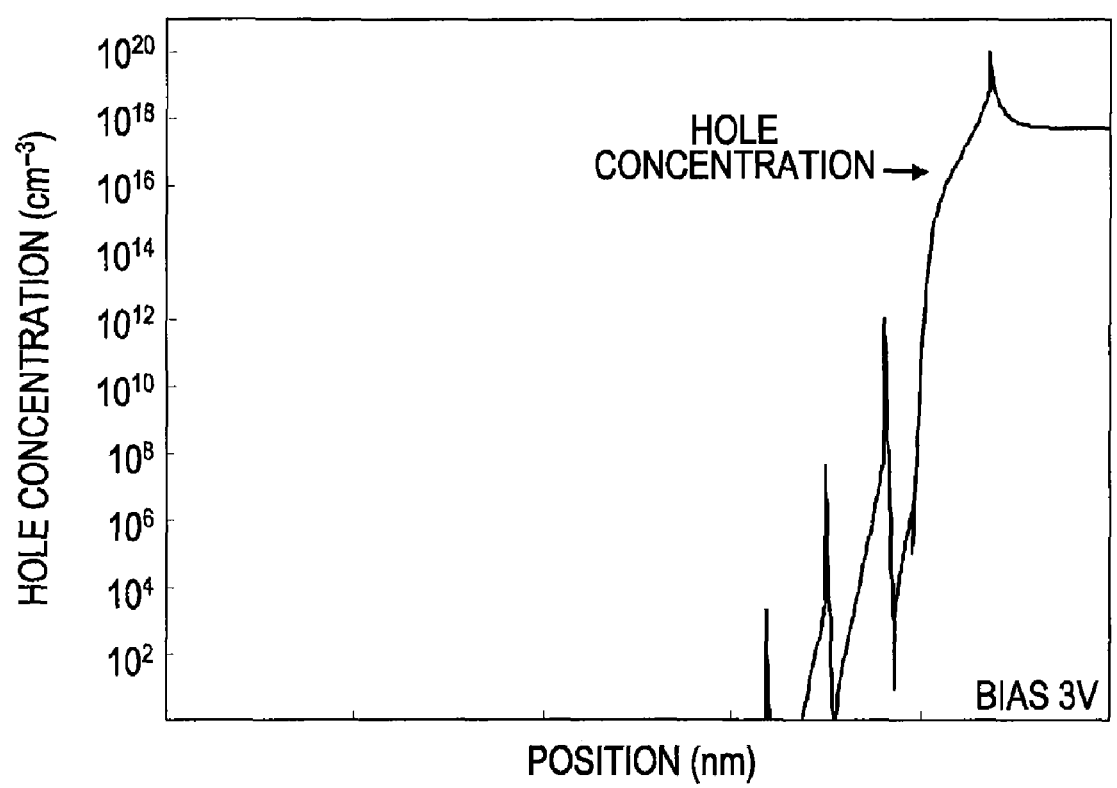
FIG. 11 is a graph showing the results of calculation of hole concentrations in Comparative Example 1.

On the basis of these results, hole concentrations in Example 1 and Comparative Example 1 were calculated. The results are shown in FIGS. 10 and 11. These figures indicate that in Comparative Example 1, holes are distributed up to only the third well layer from the interface of the second GaN-based compound semiconductor layer, while in Example 1, the hole concentrations in all well layers are higher than in Comparative Example 1, and holes are distributed up to the ninth layer from the interface of the second GaN-based compound semiconductor layer. As described above, the hole concentration distribution in Comparative Example 1 is possibly due to the fact that holes reach only the vicinity of the interface of the second GaN-based compound semiconductor layer because of the mobility and effective mass of holes. In Example 1, holes can be distributed to many well layers and distributed to the well layer away from the interface of the second GaN-based compound semiconductor layer. This possibly results in improvement in the output and a decrease in the emission wavelength shift of the light-emitting device.

Figure 12:
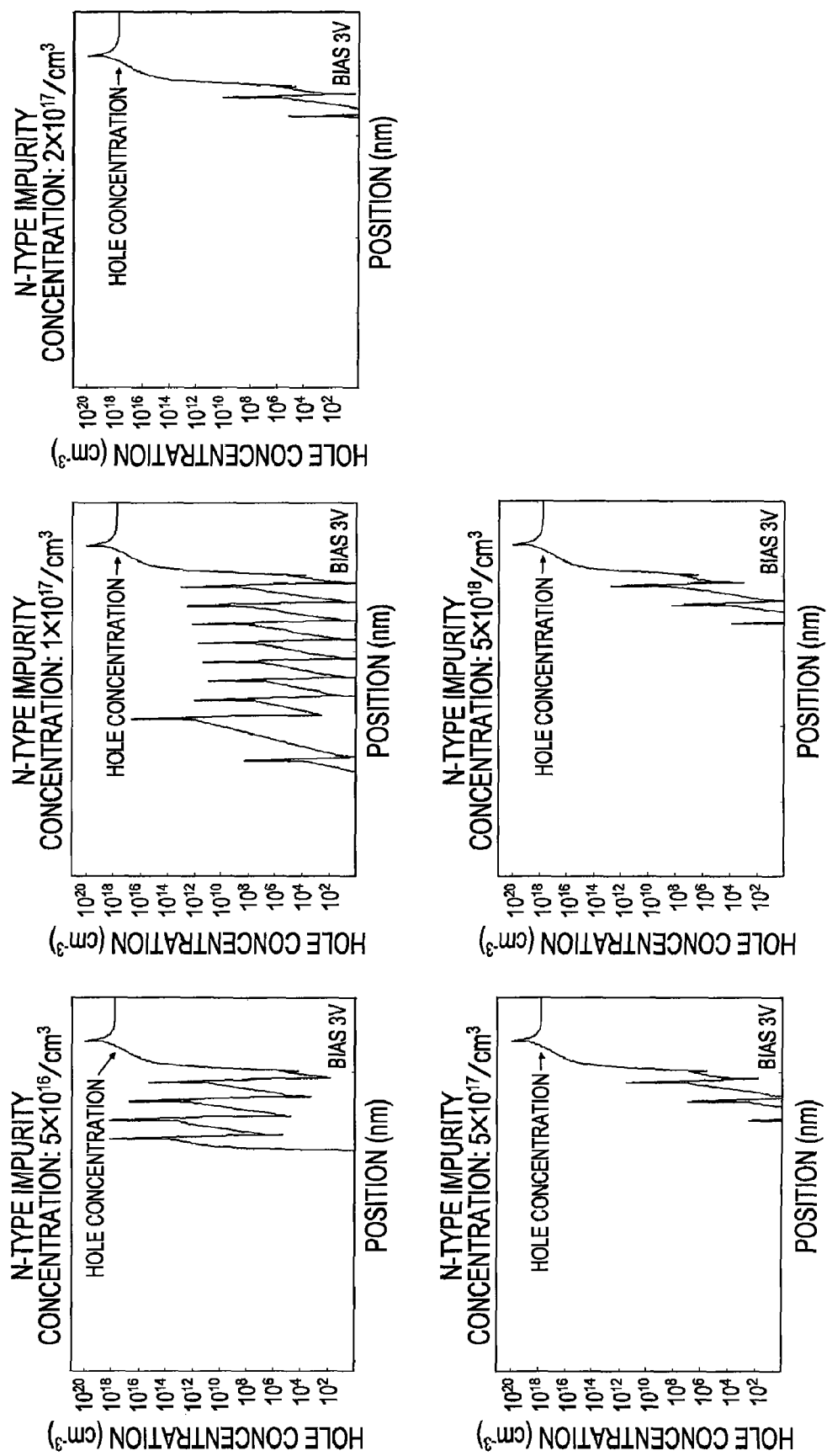
FIG. 12 is a graph showing the results of calculation of hole concentrations at each of different n-type impurity concentrations in an active layer having a structure of Example 1.

By using the same calculation, hole concentrations were calculated at various n-type impurity concentrations in the active layer of the structure of Example 1. The results are shown in FIG. 12. At a n-type impurity concentration of $5 \times 10^{16}/cm^3$, holes are distributed to a small number of well layers, but distributed to four well layers at concentrations of 100 times or more higher than those at a n-type impurity concentration of $1 \times 10^{17}/cm^3$. On the other hand, at a n-type impurity concentration of $2 \times 10^{17}/cm^3$ or more, holes reach only two or three layers near the interface of the second GaN-based compound semiconductor layer, and the hole concentrations are also low. Therefore, preferably, the n-type impurity concentration is less than $2 \times 10^{17}/cm^3$ or the active layer is undoped. The active layer may be partially doped by delta doping, not uniformly doped. In this case, the average n-type impurity concentration in the whole active layer is preferably less than $2 \times 10^{17}/cm^3$.

A GaN-based semiconductor light-emitting device having the structure shown in the right column of Table 1 was produced as a modified example of Example 1. In the modified example-A of Example 1, the thickness of the first barrier layer was twice, i.e., 50 nm. In addition, the number of the well layers and the number of the barrier layers were decreased by 1 each to control the total thickness of the active layer. Broadly, in the structure, the thicknesses of the barrier layers decrease stepwise.

Figure 13:
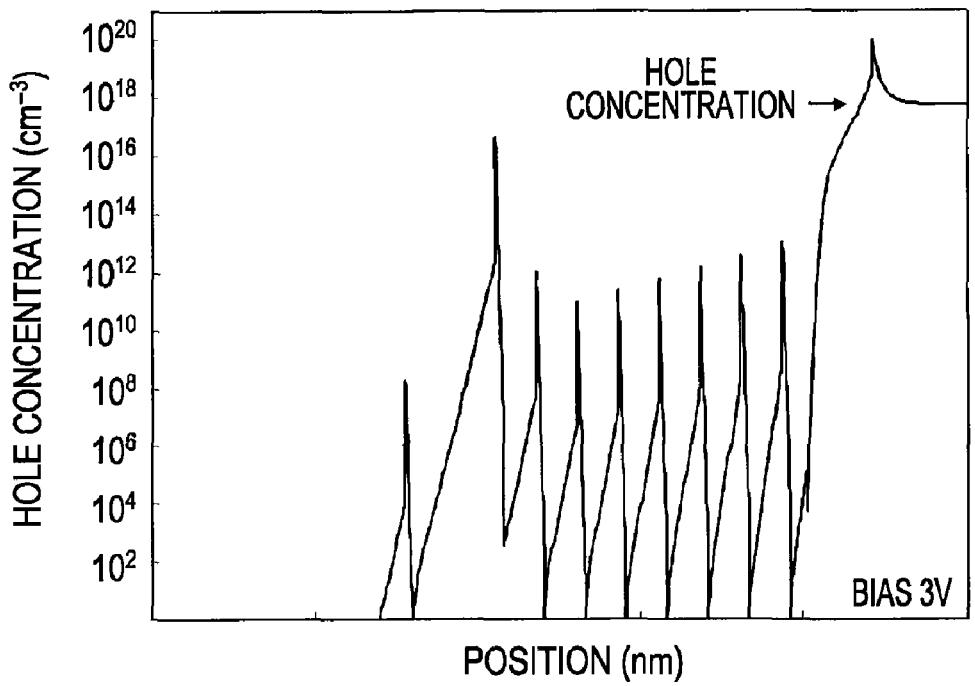
FIG. 13 is a graph showing the results of calculation of hole concentrations in Example 1.
Figure 14:
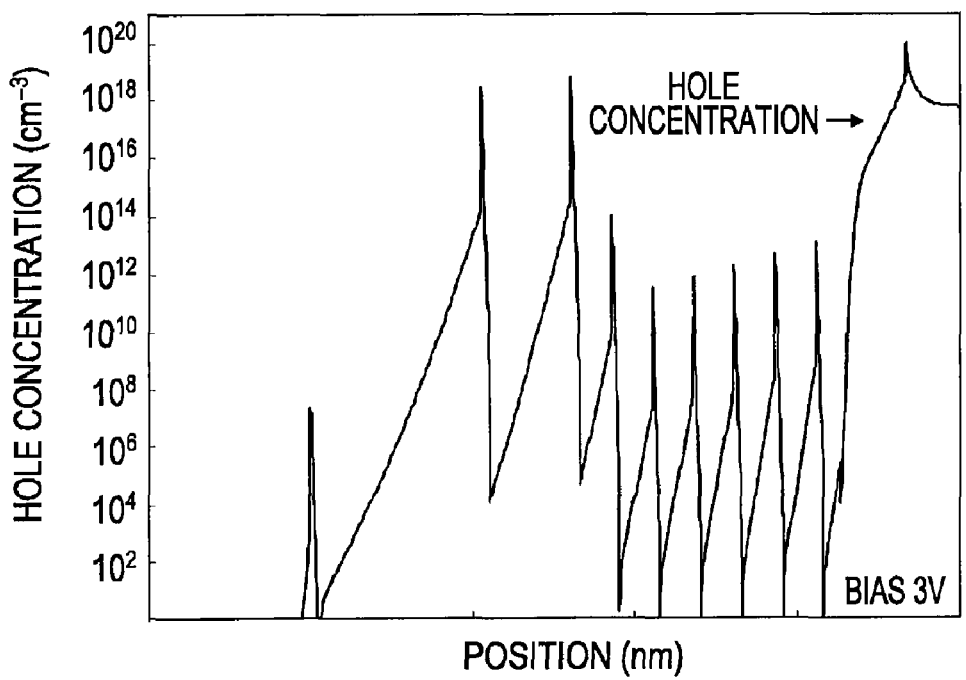
FIG. 14 is a graph showing the results of calculation of hole concentrations in modified example A of Example 1.

The results of calculation of holes concentrations in Example 1 and modified example-A of Example 1 are shown in FIGS. 13 and 14. In Example 1, holes are distributed at high concentrations in a larger number of well layers than that in Comparative Example 1, but a high hole concentration is observed in only one well layer. On the other hand, in modified example-A of Example 1, a higher hole concentration is observed in two well layers, thereby causing higher usefulness for improving the luminous efficiency and decreasing the emission wavelength shift.

Figure 15A:
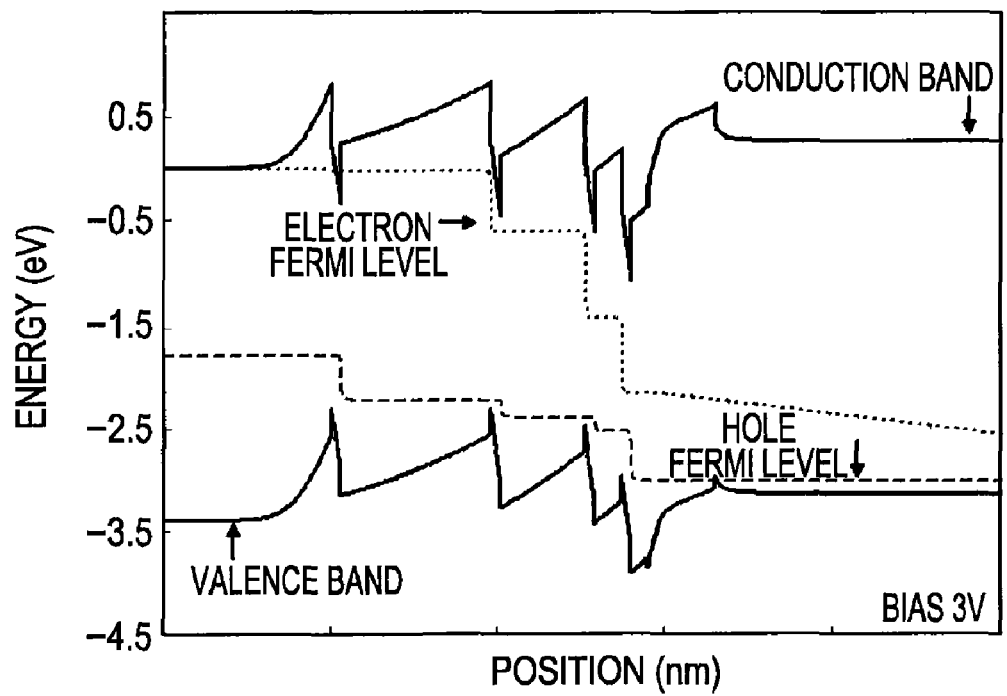
FIG. 15A is a graph showing a band diagram and Fermi levels near an active layer in modified example B of Example 1.
Figure 15B:
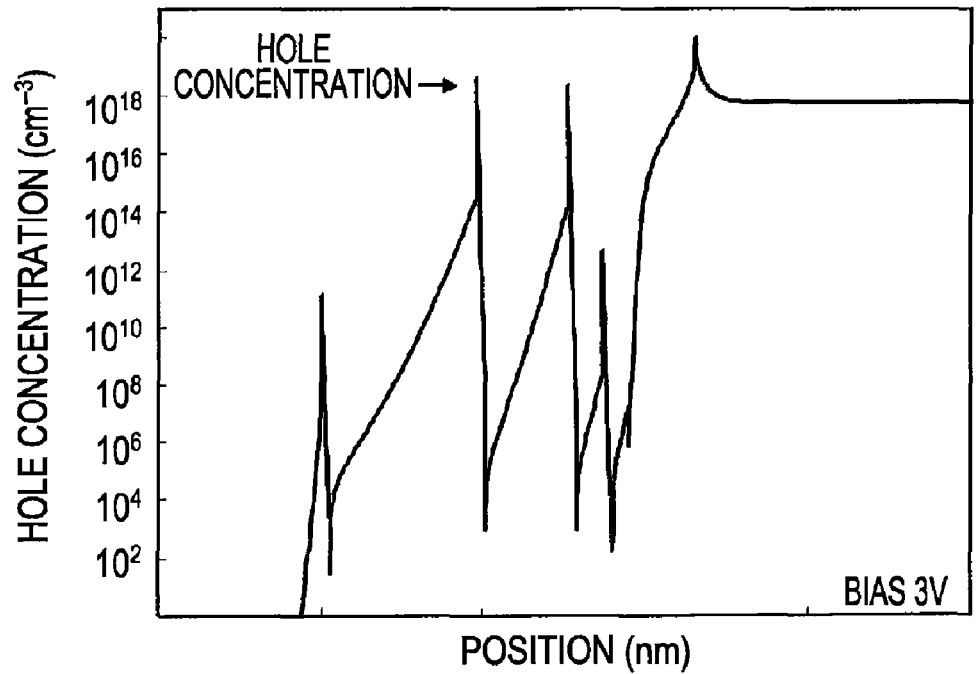
FIG. 15B is a graph showing the results of calculation of hole concentrations in modified example B of Example 1.
Figure 16A:
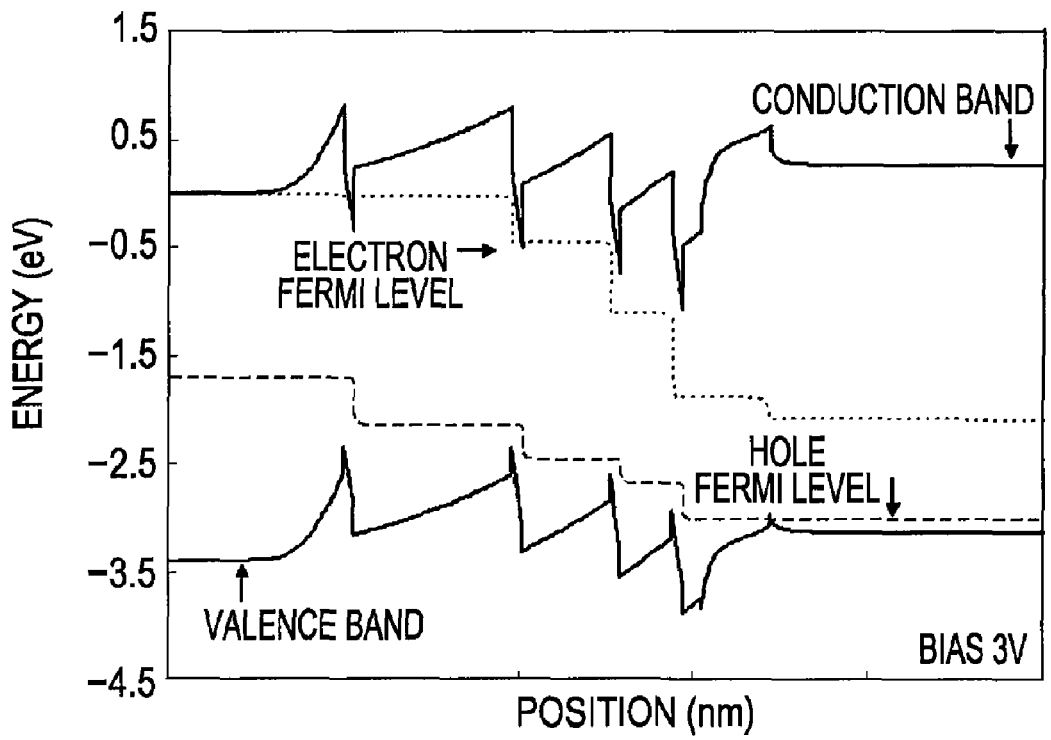
FIG. 16A is a graph showing a band diagram and Fermi levels near an active layer in modified example C of Example 1.
Figure 16B:
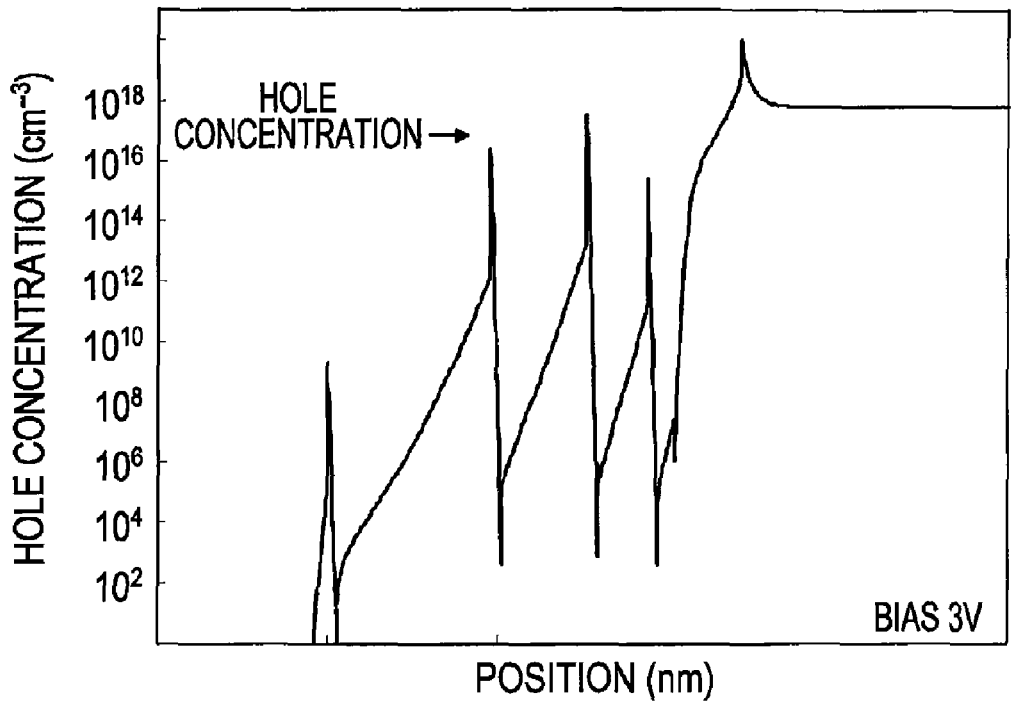
FIG. 16B is a graph showing the results of calculation of hole concentrations in modified example C of Example 1.
Figure 17A:
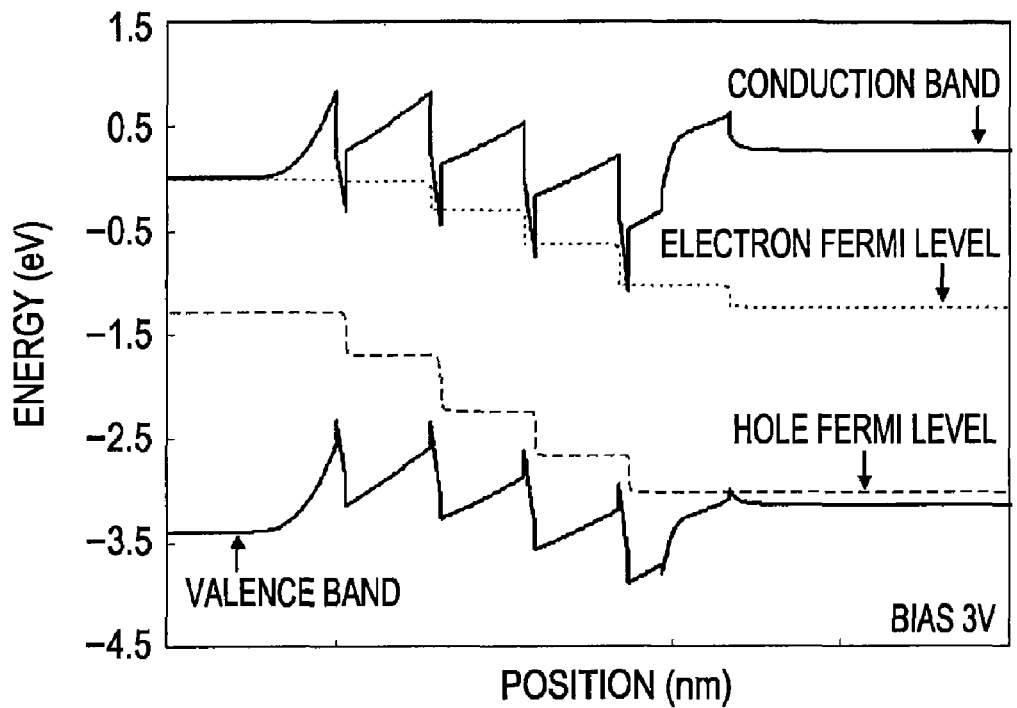
FIG. 17A is a graph showing a band diagram and Fermi levels near an active layer in Comparative Example 1-A.
Figure 17B:
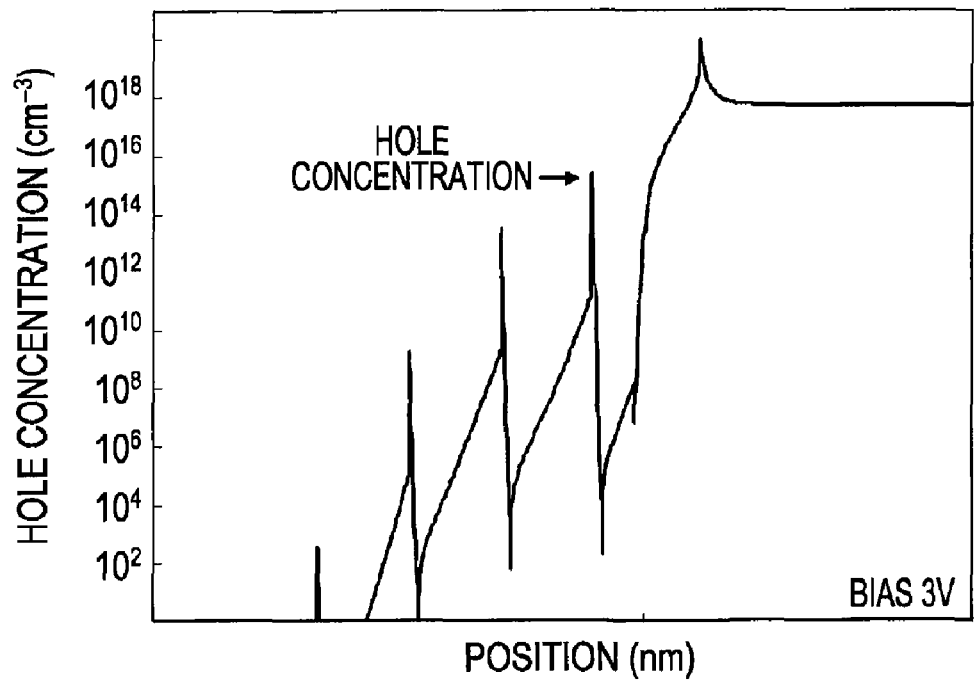
FIG. 17B is a graph showing the results of calculation of hole concentrations in Comparative Example 1-A.

Table 2 shows the structures of modified examples of Example 1 (modified example-B and modified example-C of Example 1) in which the number of well layers is 4, and the structure of Comparative Example 1-A. The band diagram and Fermi levels near the active layers in modified example-B and modified example-C of Example 1 and Comparative Example 1-A, which were determined by calculation, are shown in FIGS. 15A, 16A, and 17A, respectively. The results of calculation of hole concentrations are shown in FIGS. 15B, 16B, and 17B. In modified example-B of Example 1, the hole concentration of the rightmost well layer (nearest the interface of the second GaN-based compound semiconductor layer) shown in FIG. 15B is lower than that in Comparative Example 1-A, but the holes concentrations of the other well layers are higher than those in Comparative Example 1-A. In particular, the central two well layers have very high hole concentrations. In modified example-C of Example 1, the hole concentration of the rightmost well layer (nearest the interface of the second GaN-based compound semiconductor layer) shown in FIG. 16B is equivalent to that in Comparative Example 1-A, and the concentrations of holes distributed in the other well layers are higher than those in Comparative Example 1-A. Therefore, it is thought that these examples are effective in improving the luminous efficiency and decreasing the emission wavelength shift.

TABLE 2

|  | Modified example B of Example 1 | Modified example C of Example 1 | Comparative Example 1-A |
|---|---|---|---|
| Thickness of first well layer (nm) | 3 (3) | 3 (3) | 3 (3) |
| Thickness of first barrier layer (nm) | 45 (48) | 45 (48) | 25 (28) |
| Thickness of second well layer (nm) | 3 (51) | 3 (51) | 3 (31) |
| Thickness of second barrier layer (nm) | 25 (76) | 25 (76) | 25 (56) |
| Thickness of third well layer (nm) | 3 (79) | 3 (79) | 3 (59) |
| Thickness of third barrier layer (nm) | 8 (87) | 15 (94) | 25 (84) |
| Thickness of fourth well layer (nm) | 3 (90) | 3 (97) | 3 (87) |

Therefore, in the GaN-based semiconductor light-emitting device, the hole concentration distribution can be variously changed by changing the well layer distribution in the active layer having a multi-quantum well structure. In the present invention, the effect of improving luminous efficiency and decreasing the emission wavelength shift is exhibited in the visible region from blue to green of the GaN-based semiconductor light-emitting device. However, even in the blue-violet (wavelength: about 400 nm) region in which the emission wavelength shift is basically small, the present invention is effective in improving luminous efficiency. Further, in the ultraviolet (wavelength: 365 nm or less) region of an AlGaN system having a higher piezo electric field, the present invention is effective in decreasing the emission wavelength shift and improving luminous efficiency.

In addition to the method using the peak current value $I_0$ of the driving current, the quantity of light (luminance) emitted from the GaN-based semiconductor light-emitting device may be controlled by controlling the pulse width of the driving current, the pulse density of the driving current, or combination of both. In the examples described below, the quantity of light (luminance) emitted from the GaN-based semiconductor light-emitting device may be controlled by the same method.

When the total thickness of the active layer 15 is $t_0$, the well layer density in the active layer first region $AR_1$ ranging from the first GaN-based compound semiconductor layer-side interface (more specifically, the interface between the undoped GaN layer 14 and the active layer 15) to the thickness of ($t_0/2$) in the active layer 15 is $d_1$, and the well layer density in the active layer second region $AR_2$ ranging from the second GaN-based compound semiconductor layer-side interface (more specifically, the interface between the undoped GaN layer 16 and the active layer 15) to the thickness of ($t_0/2$) is $d_2$, the well layers are disposed in the active layer 15 to satisfy the relation $d_1 < d_2$. In this case, the well layer density $d_1$ and the well layer density $d_2$ are determined from the equations (1-1) and (1-2) as follows:

EXAMPLE 1 EQUIVALENT $$d_2 = (WL_2/WL)/(t_2/t_0)$$
$$= (6/10)/(75/150)$$
$$= 1.20$$

$$d_1 = (WL_1/WL)/(t_1/t_0)$$
$$= (4/10)/(75/150)$$
$$= 0.80$$

COMPARATIVE EXAMPLE 1 EQUIVALENT $$d_2 = (WL_2/WL)/(t_2/t_0)$$
$$= (5/10)/\{(73+1/2)/147\}$$
$$= 1.00$$

$$d_1 = (WL_1/WL)(t_1/t_0)$$
$$= (5/10)/\{(73+1/2)/147\}$$
$$= 1.00$$

When the total thickness of the active layer 15 is $t_0$, the well layer density in an active layer first region $AR_1$ ranging from the first GaN-based compound semiconductor layer-side interface (more specifically, the interface between the undoped GaN layer 14 and the active layer 15) to the thickness of $(t_0/3)$ in the active layer 15 is $d_1$, and the well layer density in an active layer second region $AR_2$ ranging from the second GaN-based compound semiconductor layer-side interface (more specifically, the interface between the undoped GaN layer 16 and the active layer 15) to the thickness of $(2t_0/3)$ is $d_2$, the well layers are disposed in the active layer 15 to satisfy the relation $d_1<d_2$. In this case, the well layer density $d_1$ and the well layer density $d_2$ are determined from the equations (1-1) and (1-2) as follows:

EXAMPLE 1 EQUIVALENT $$d_2 = (WL_2/WL)/(t_2/t_0)$$
$$= (8/10)/(50/150)$$
$$= 2.40$$

$$d_1 = (WL_1/WL)/(t_1/t_0)$$
$$= (2/10)/(100/150)$$
$$= 0.30$$

COMPARATIVE EXAMPLE 1 EQUIVALENT $$d_2 = (WL_2/WL)/(t_2/t_0)$$
$$= \{(6+2/3)10\}/(98/147)$$
$$= 1.00$$

$$d_1 = (WL_1/WL)/(t_1/t_0)$$
$$= \{(3+1/3)/10\}/(49/147)$$
$$= 1.00$$

As described above, in any case corresponding to Example 1, the well layers are disposed in the active layer 15 so as to satisfy the relation $d_1<d_2$.

In Example 1, as shown in FIG. 2, the driving circuit 26 includes a control part 27, a driving current source 28 serving as a supply source of the driving current, a pulse generator circuit 29 for generating predetermined pulse signals, and a driver 30. The driving current source 28, the pulse generator circuit 29, and the driver 30 correspond to pulse driving current supply means for supplying a pulse driving current to the GaN-based semiconductor light-emitting device. The control part 27 corresponds to pulse driving current setting means for setting the pulse width and pulse density of the pulse driving current and corresponds means for setting the peak current value.

In the driving circuit 26, the peak current value $I_0$ of the driving current is output from the driving current source 28 under control by the control part 27. In addition, a pulse signal is output from the pulse generator circuit 29 in order to control the pulse width $P_0$ of the GaN-based semiconductor light-emitting device 1 and the number of pulses (pulse density) having the pulse width $P_0$ in the one-operation period $T_{OP}$ of the GaN-based semiconductor light-emitting device 1 under control by the control part 27. In the driver 30 receiving the driving current and the pulse signal, the driving current supplied from the driving current source 28 is pulse-modulated on the basis of the pulse signal output from the pulse generator circuit 29 to supply the pulse driving current to the GaN-based semiconductor light-emitting device 1. Therefore, the quantity of light emitted from the GaN-based semiconductor light-emitting device 1 is controlled.

The summary of the method for manufacturing the GaN-based semiconductor light-emitting device 1 of Example 1 will be described below.

[Step—100]

First, sapphire with a C plane as a main plane is used as the substrate 10, cleaned in a hydrogen carrier gas at a substrate temperature of 1050° C. for 10 minutes, and then cooled to a substrate temperature of 500° C. Then, on the basis of a MOCVD process, trimethylgallium (TMG) gas is supplied as a gallium source under the supply of ammonia gas as a nitrogen raw material to deposit the buffer layer 11 composed of low-temperature GaN and 30 nm in thickness by crystal growth on the substrate 10. Then, the supply of TMG gas is stopped.

[Step—110]

Next, the substrate temperature is increased to 1020° C., and then the supply of TMG gas is again started to form the undoped GaN layer 12 having a thickness of 1 μm by crystal growth on the buffer layer 11. Then the supply of monosilane ($SiH_4$) gas as a silicon raw material is started to form the first GaN-based compound semiconductor layer 13 composed of Si-doped GaN (GaN:Si) and having n-type conductivity and a thickness of 3 μm by crystal growth on the undoped GaN layer 12. The doping concentration is about $5\times10^{18}/cm^3$.

[Step—120]

Then, the supply of TMG gas and $SiH_4$ gas is stopped, and the carrier gas is changed from hydrogen gas to nitrogen gas, and, at the same time, the substrate temperature is decreased to 750° C. Then, triethylgallium (TEG) gas used as a Ga source and trimethylindium (TMI) gas used as an In source are supplied by valve switching. First, the undoped GaN layer 14 having a thickness of 5 nm is formed by crystal growth, then the active layer 15 having a multi-quantum well structure including a well layer composed of undoped or doped InGaN with a n-type impurity concentration of less than $2\times10^{17}/cm^3$ and a barrier layer composed of undoped or doped GaN with a n-type impurity concentration of less than $2\times10^{17}/cm^3$ is formed. The well layer has an In composition ratio of, for example, 0.23 corresponding to an emission wavelength λ of 515 nm. The In composition ratio of the well layer may be determined on the basis of the desired emission wavelength. Details of the multi-quantum well structure are as shown in Table 1 for example.

[Step—130]

After the formation of the multi-quantum well structure is completed, the substrate temperature is increased to 800° C. while the undoped GaN layer 16 of 10 nm is grown. The supply of trimethylaluminum (TMA) gas used as an Al raw material and biscyclopentadienyl magnesium ($Cp_2Mg$) gas used as a Mg raw material is started to form, by crystal growth, the second GaN-based compound semiconductor layer 17 having p-type conductivity and a thickness of 20 nm and composed of Mg-doped AlGaN (AlGaN:Mg) with an Al composition ratio of 0.20. The doping concentration is about $5\times10^{19}/cm^3$.

[Step—140]

Then, the supply of TEG gas, TMA gas, and $Cp_2Mg$ gas is stopped, and the carrier gas is changed from nitrogen gas to hydrogen gas, and, at the same time, the substrate temperature is increased to 850° C. Then, the supply of TMG gas and $CP_2Mg$ gas is started to form the Mg-doped GaN layer (GaN:Mg) 18 having a thickness of 100 nm by crystal growth on the second GaN-based compound semiconductor layer 17. The doping concentration is about $5\times10^{19}/cm^3$. Then, the supply of TMG gas and $Cp_2Mg$ gas is stopped and, at the same time, the substrate temperature is decreased. At a substrate temperature of 600° C., the supply of ammonia gas is stopped. The substrate temperature is decreased to room temperature to complete crystal growth.

The substrate temperature $T_{MAX}$ after the growth of the active layer 15 satisfies the relation $T_{MAX}<1350-0.75\lambda$ (° C.) and preferably $T_{MAX}<1250-0.75\lambda$ (° C.) wherein λ (nm) is the emission wavelength. By using such a substrate temperature $T_{MAX}$ after the growth of the active layer 15, thermal deterioration of the active layer 15 can be suppressed as disclosed in Japanese Unexamined Patent Application Publication No. 2002-319702.

After the crystal growth is completed, the substrate is annealed in a nitrogen gas atmosphere at 800° C. for 10 minutes to activate the p-type impurity (p-type dopant). Then, like in a usual LED wafer process and chip forming process, the substrate is cut into chips by dicing after a photolithography process and an etching process, and a step of forming a p-type electrode and a n-type electrode by metal evaporation. Further, resin molding and packaging are performed to form various light-emitting diodes such as a shell type and a surface mounting type.

EXAMPLE 2

Example 2 is a modification of Example 1. In a GaN-based semiconductor light-emitting device of Example 2, an underlying layer containing In atoms is formed between the first GaN-based compound semiconductor layer 13 and the active layer 15 (more specifically, the first GaN-based compound semiconductor layer 13 and the undoped GaN layer 14 in Example 2). In addition, a superlattice layer containing a p-type dopant is formed between the active layer 15 and the second GaN-based compound semiconductor layer 17 (more specifically, the undoped GaN layer 16 and the second GaN-based compound semiconductor layer 17 in Example 2). In this structure, a more stable operation of the GaN-based semiconductor light-emitting device can be achieved at a high operating current density while further improving the luminous efficiency and further decreasing the operating voltage.

The underlying layer is a Si-doped InGaN layer having an In composition ratio of 0.03 and a thickness of 150 nm. The doping concentration is $5\times10^{18}/cm^3$. On the other hand, the superlattice layer has a superlattice structure in which an AlGaN layer (Mg-doped) with a thickness of 2.4 nm and a GaN layer (Mg-doped) with a thickness of 1.6 nm are stacked in five cycles. The Al composition ratio of the AlGaN layer is 0.15. The concentration of the p-type dopant contained in the superlattice layer is $5\times10^{19}/cm^3$.

Except these points, the GaN-based semiconductor light-emitting device of Example 2 has the same constitution and structure as those of Example 1, and thus detailed description is omitted. The constitution and structure of the GaN-based semiconductor light-emitting device of Example 2 can be applied to GaN-based semiconductor light-emitting devices of Examples 3 and 4 which will be described below.

EXAMPLE 3

Example 3 is a modification of Example 1. Table 3 below shows details of a multi-quantum well structure of an active layer 15 in a GaN-based semiconductor light-emitting device of Example 3. In Example 3 and Comparative Example 3, the In composition ratio of a well layer is controlled so that the emission wavelength is about 445 nm.

TABLE 3

|  | Example 3 | Comparative Example 3 |
|---|---|---|
| Total thickness of active layer ($t_0$ nm) | 122 | 124.5 |
| | The active layer is divided into two parts at $2t_0/3$ | |
| Thickness of active layer first region ($t_1$ nm) | 81 + ⅓ | 83 |
| Thickness of active layer second region ($t_2$ nm) | 40 + ⅔ | 41 + ½ |
| Number of well layers (WL) | 10 | 10 |
| Number of barrier layers | 9 | 9 |
| Number or well layers in active layer first region $WL_1$ | 4 + ⅞ | 6 + ⅔ |
| Number or well layers in active layer second region $WL_2$ | 5 + ⅔ | 3 + ⅓ |
| Well layer density in active layer first region $d_1$ | 0.72 | 1.00 |
| Well layer density in active layer second region $d_2$ | 1.57 | 1.00 |
| Thickness of first well layer (nm) | 3 (3) | 3 (3) |
| Thickness of first barrier layer (nm) | 52 (55) | 10.5 (13.5) |
| Thickness of second well layer (nm) | 3 (58) | 3 (16.5) |
| Thickness of second barrier layer (nm) | 5 (63) | 10.5 (27) |
| Thickness of third well layer (nm) | 3 (66) | 3 (30) |
| Thickness of third barrier layer (nm) | 5 (71) | 10.5 (40.5) |
| Thickness of fourth well layer (nm) | 3 (74) | 3 (43.5) |
| Thickness of fourth barrier layer (nm) | 5 (79) | 10.5 (54) |
| Thickness of fifth well layer (nm) | 3 (82) | 3 (57) |

TABLE 3-continued

|  | Example 3 | Comparative Example 3 |
|---|---|---|
| Thickness of fifth barrier layer (nm) | 5 (87) | 10.5 (67.5) |
| Thickness of sixth well layer (nm) | 3 (90) | 3 (70.5) |
| Thickness of sixth barrier layer (nm) | 5 (95) | 10.5 (81) |
| Thickness of seventh well layer (nm) | 3 (98) | 3 (84) |
| Thickness of seventh barrier layer (nm) | 5 (103) | 10.5 (94.5) |
| Thickness of eighth well layer (nm) | 3 (106) | 3 (97.5) |
| Thickness of eighth barrier well layer (nm) | 5 (111) | 10.5 (108) |
| Thickness of ninth well layer (nm) | 3 (114) | 3 (111) |
| Thickness of ninth barrier layer (nm) | 5 (119) | 10.5 (121.5) |
| Thickness of tenth well layer (nm) | 3 (122) | 3 (124.5) |

The well layer density $d_1$ and the well layer density $d_2$ are determined from the equations (1-1) and (1-2) as follows:

EXAMPLE 3

$$d_2 = (WL_2/WL)/(t_2/t_0)$$
$$= \{(5+2/9)/10\}/\{(40+2/3)/122\}$$
$$= 1.57$$

$$d_1 = (WL_1/WL)/(t_1/t_0)$$
$$= \{(4+7/9)/10\}/\{(81+1/3)/122\}$$
$$= 0.72$$

For comparison, a GaN-based semiconductor light-emitting device including an active layer shown as Comparative Example 3 in Table 3 was produced. The well layer density $d_1$ and the well layer density $d_2$ in Comparative Example 3 are determined from the equations (1-1) and (1-2) as follows:

COMPARATIVE EXAMPLE 3

$$d_2 = (WL_2/WL)/(t_2/t_0)$$
$$= ((3+1/3)/10\}/\{(41+1/2)/(124+1/2)\}$$
$$= 1.00$$

$$d_1 = (WL_1/WL)/(t_1/t_0)$$
$$= \{(6+2/3)\}/10\}/\{83/(124+1/2)\}$$
$$= 1.00$$

The GaN-based semiconductor light-emitting devices of Example 3 and Comparative Example 3 were evaluated on the basis of the same method as in Example 1.

Figure 18:
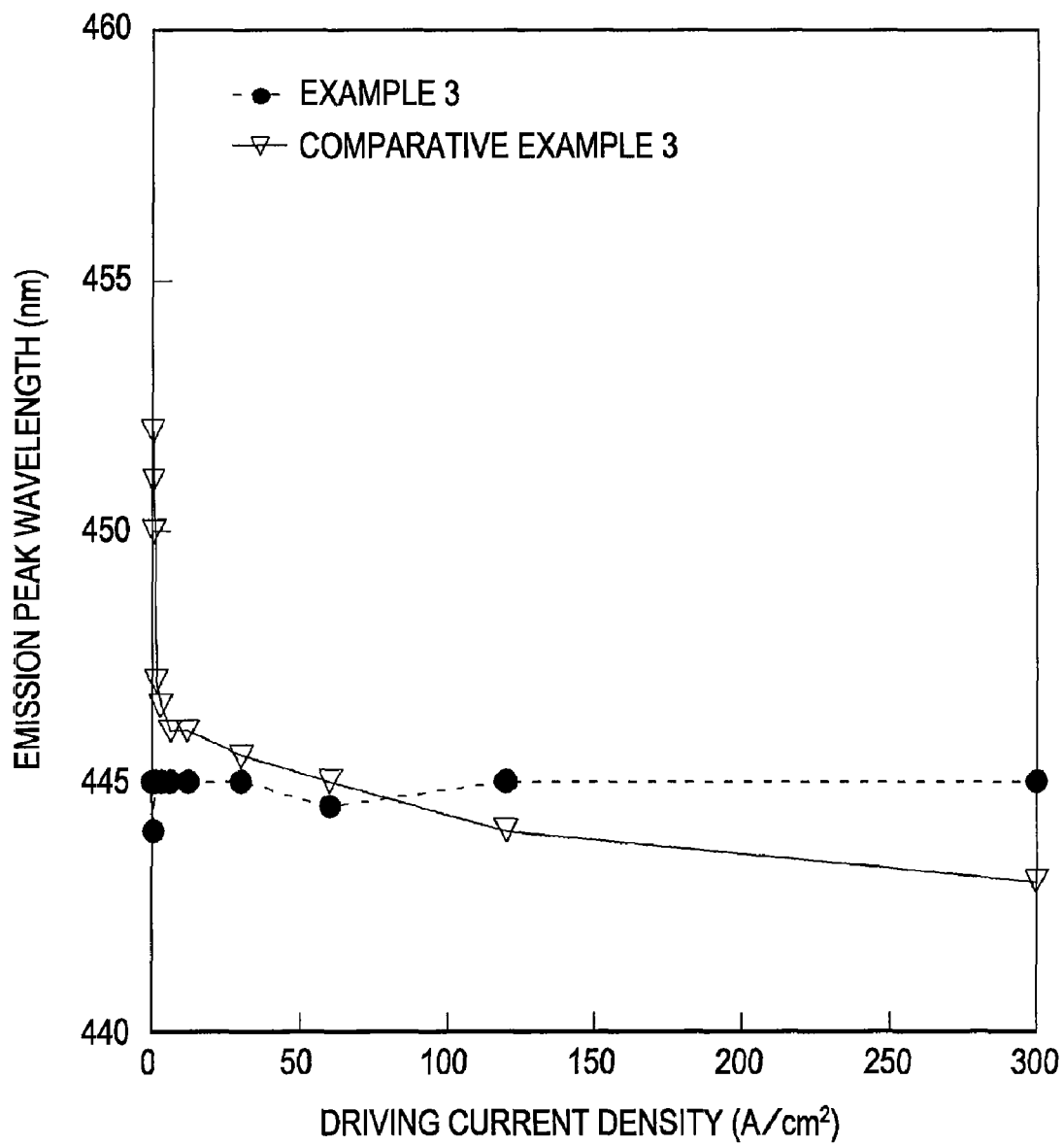
FIG. 18 is a graph showing a relationship between the operating current density and emission peak wavelength of each of GaN-based semiconductor light-emitting devices of Example 3 and Comparative Example 3.

FIG. 18 shows a relation between the operating current density and emission peak wavelength of each of the GaN-based semiconductor light-emitting devices. When the operating current density is increased from 0.1 A/cm² to 300 A/cm², in Comparative Example 3, Δλ=−9 nm, while in Example 3, Δλ=−1 nm and a very small emission wavelength shift is realized. Therefore, the blue light-emitting GaN-based semiconductor light-emitting device 1 of Example 3 exhibits a significantly small shift of the emission wavelength and is thus obviously superior to a conventional GaN-based semiconductor light-emitting device.

EXAMPLE 4

Figure 19A:
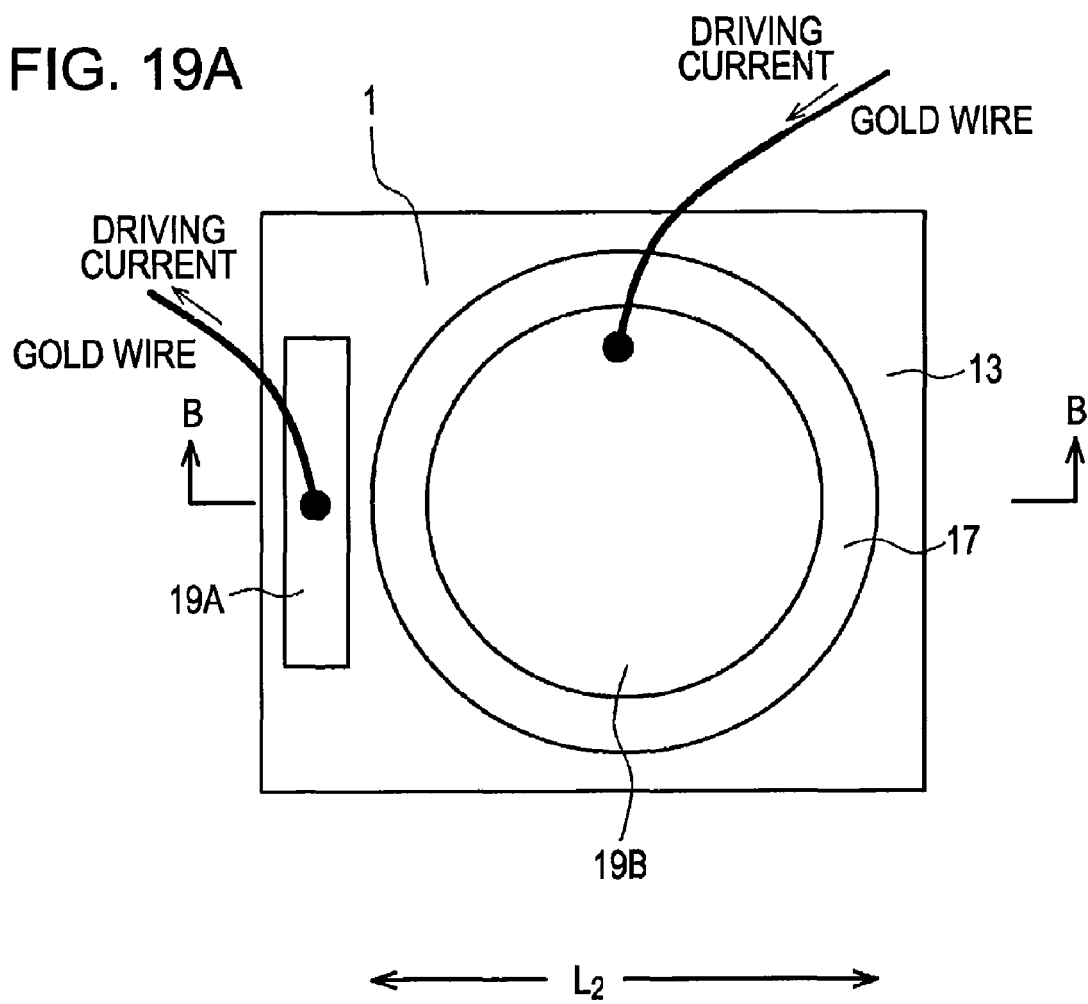
FIG. 19A is schematic top view of a GaN-based semiconductor light-emitting device of Example 4.
Figure 19B:
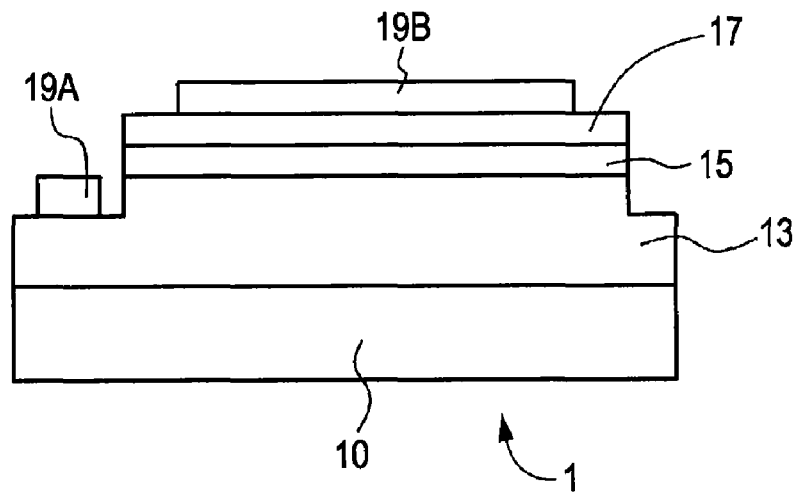
FIG. 19B is a schematic sectional view (in which oblique lines are omitted) taken along arrows B-B in FIG. 19A.

Example 4 is also a modification of Example 1. In Example 4, FIG. 19A is a schematic top view of a GaN-based semiconductor light-emitting device of Example 4, and FIG. 19B is a schematic sectional view (oblique lines are omitted9 taken along arrows B-B in FIG. 19A. The GaN-based semiconductor light-emitting device 1 of Example 4 is different in the planar shape of an active layer from the GaN-based semiconductor light-emitting device 1 of Example 1 shown in FIGS. 6A and 6B. Namely, in Example 4, the active layer 15 of the GaN-based semiconductor light-emitting device 1 has a circular planar shape having a diameter (corresponding to a short diameter) $L_2$ of 14 μm and an area of about $1.5\times10^{-6}$ cm². Except this point, the GaN-based semiconductor light-emitting device 1 of Example 4 has the same constitution and structure as those of the GaN-based semiconductor light-emitting device 1 of Example 1. The GaN-based semiconductor light-emitting device 1 of Example 4 is referred to as the "GaN-based semiconductor light-emitting device of Example 4A" for convenience sake.

Furthermore, a GaN-based semiconductor light-emitting device 1 having the same constitution and structure as those of the GaN-based semiconductor light-emitting device 1 of Example 1 shown in FIGS. 6A and 6B was produced, in which the active layer had a partially cut-away square planar shape (area: about $6.8\times10^{-4}$ cm²) having a side length (corresponding to a short side) $L_1$ of 300 μm. The GaN-based semiconductor light-emitting device 1 is referred to as the "GaN-based semiconductor light-emitting device of Example 4B" for convenience sake.

COMPARATIVE EXAMPLE 4

For comparison, a GaN-based semiconductor light-emitting device having the same structure as that of the GaN-based semiconductor light-emitting device 1 of Example 4 except that the constitution of the active layer was the same as Comparative Example 1 was produced as Comparative Example 4. The GaN-based semiconductor light-emitting device is referred to as the "GaN-based semiconductor light-emitting device of Comparative Example 4A" for convenience sake. Furthermore, a GaN-based semiconductor light-emitting device having the same constitution and structure as those of the GaN-based semiconductor light-emitting device 1 of Comparative Example 1 was produced, in which the active layer had a partially cut-away square planar shape (area: about $6.8\times10^{-4}$ cm²) having a side length (corresponding to a short side) $L_1$ of 300 μm. The GaN-based semiconductor light-emitting device is referred to as the "GaN-based semiconductor light-emitting device of Comparative Example 4B" for convenience sake.

When the GaN-based semiconductor light-emitting devices of Example 4A and Comparative Example 4A and Example 4B and Comparative Example 4B were driven at an operating current density of 30 A/cm², the driving current values are about 50 μA and about 20 mA, respectively.

Figure 20A:
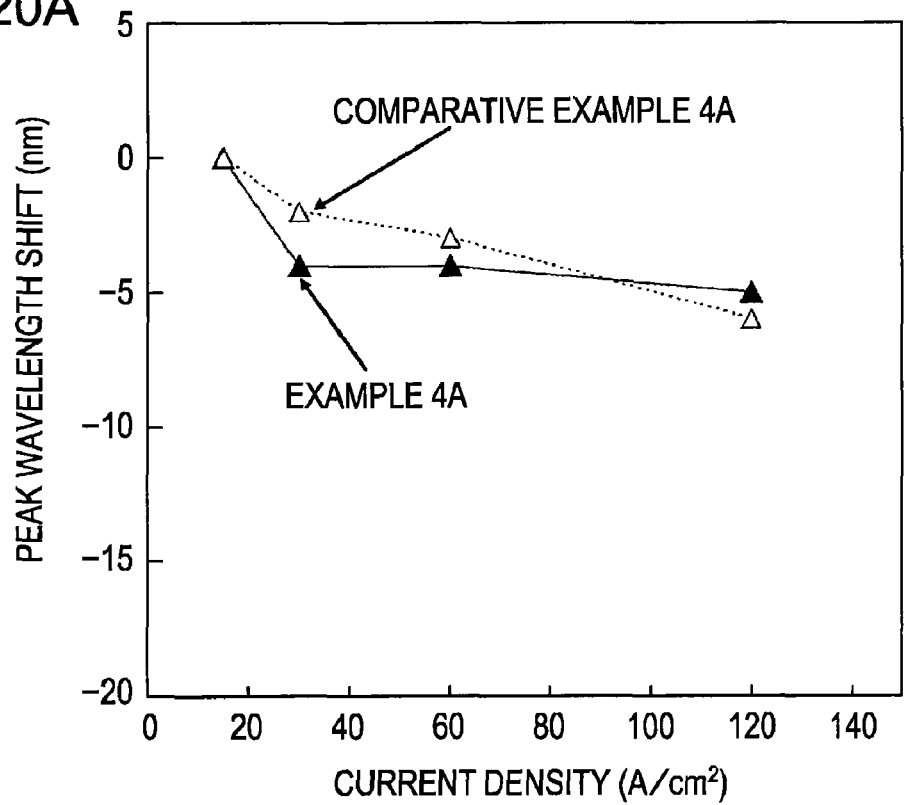
FIG. 20A is a graph showing a relationship between the operating current density and peak wavelength shift of each of GaN-based semiconductor light-emitting devices of Example 4A and Comparative Example 4A.
Figure 20B:
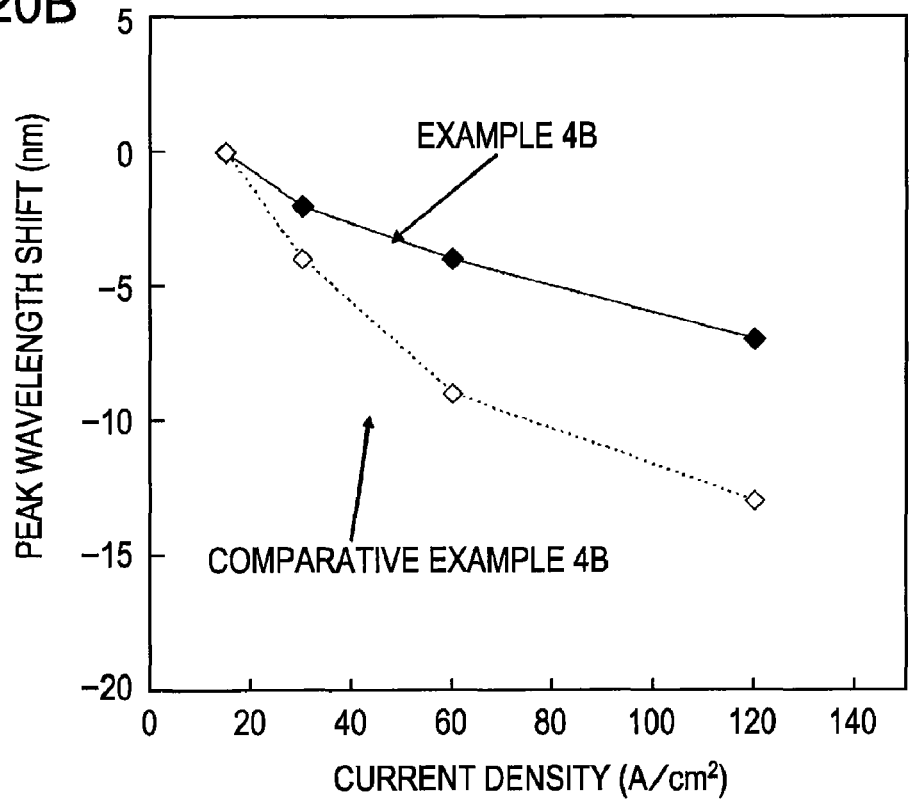
FIG. 20B is a graph showing a relationship between the operating current density and peak wavelength shift of each of GaN-based semiconductor light-emitting devices of Example 4B and Comparative Example 4B.

FIG. 20A shows a relation between the operating current density and peak wavelength shift of each of the GaN-based semiconductor light-emitting devices of Example 4A and Comparative Example 4A, and FIG. 20B shows a relation between the operating current density and peak wavelength shift of each of the GaN-based semiconductor light-emitting devices of Example 4B and Comparative Example 4B.

In the GaN-based semiconductor light-emitting device of any size, when the operating current density is 30 A/cm$^2$ or more, the emission wavelength shift of the example is smaller than that of the comparative example. It is thus said that the effect of an asymmetric distribution in the active layer is exhibited regardless of size. On the other hand, it is found that in comparison at the same operating current density, the emission wavelength shift of Example 4A is smaller than Example 4B.

Furthermore, for example, variations in the composition and thickness, doping, light emission, and threshold voltage of the quantum well layers are present in a plane of a GaN-based semiconductor light-emitting device. The minimum-maximum difference of the variations increases as the area of the GaN-based semiconductor light-emitting device increases. When a GaN-based semiconductor light-emitting device is a large size and has a transverse passage of a current flow, it is difficult to uniformly pass a current due to the sheet resistance of a layer, thereby causing variations in the operating current density in a plane. For these reasons, in a large GaN-based semiconductor light-emitting device, a shift of the emission wavelength due to a change in the operating current density is more emphasized. In contrast, in a small GaN-based semiconductor light-emitting device, a shift of the emission wavelength can be further decreased.

Such GaN-based semiconductor light-emitting devices capable of further decreasing the emission wavelength sift and each including an active layer having a diameter of about 14 μm, for example, can be formed at a high density in a matrix shape on a substrate and used for a projection-type display or mounted on a large substrate to realize a direct-view-type large television receiver. In addition, since the emission wavelength shift can be decreased, the manufacturing cost of a GaN-based semiconductor light-emitting device can be decreased, and a display device with an excellent dynamic range, gradation, and color stability can be realized by modulating the pulse amplitude and pulse density (pulse width).

EXAMPLE 5

Example 5 relates to a light illuminator of the present invention. The light illuminator of Example 5 includes a GaN-based semiconductor light-emitting device and a color conversion material on which light emitted from the GaN-based semiconductor light-emitting device is incident and which emits light at a wavelength different from that of the light emitted from the GaN-based semiconductor light-emitting device. The light illuminator of Example 5 has the same structure as that of a conventional light illuminator, and the color conversion material is applied, for example, on a light emission portion of the GaN-based semiconductor light-emitting device.

The basic constitution and structure of the GaN-based semiconductor light-emitting device (light-emitting diode) are the same as described in Examples 1 to 4. Namely, the GaN-based semiconductor light-emitting device includes:

(A) the first GaN-based compound semiconductor layer 13 having n-type conductivity;

(B) the active layer 15 having a multi-quantum well structure including well layers and barrier layers for separating between the well layers; and (C) the second GaN-based compound semiconductor layer 17 having p-type conductivity;

wherein the well layers are disposed in the active layer 15 so as to satisfy the relation $d_1 < d_2$ wherein $d_1$ is the well layer density on the first GaN-based compound semiconductor layer side in the active layer and $d_2$ is the well layer density on the second GaN-based compound semiconductor layer side.

In Example 5, light emitted from the GaN-based semiconductor light-emitting device is blue, and light emitted from the color conversion material is yellow. The color conversion material includes YAG (yttrium aluminum garnet) fluorescent particles and white light is emitted by color mixing of the light (blue) emitted from the GaN-based semiconductor light-emitting device and the light (yellow) emitted from the color conversion material.

Alternatively, in Example 5, light emitted from the GaN-based semiconductor light-emitting device is blue, and light emitted from the color conversion material is green and red so that white light is emitted by color mixing of the light (blue) emitted from the GaN-based semiconductor light-emitting device and the light (green and red) emitted from the color conversion material. Specifically, the color conversion material emitting green light includes green light-emitting fluorescent particles of $SrGa_2S_4$:Eu which are excited by the blue light emitted from the GaN-based semiconductor light-emitting device, and the color conversion material emitting red light includes red light-emitting fluorescent particles of CaS:Eu which are excited by the blue light emitted from the GaN-based semiconductor light-emitting device.

In the light-emitting device of Example 5, the GaN-based semiconductor light-emitting device may be driven by, for example, the driving circuit 26 described in Example 1, and the luminance (brightness) of the light-emitting device can be controlled by controlling the peak current of the driving current, and the pulse width and/or the pulse density of the driving current. In this case, a large shift of the emission wavelength can be suppressed using the same GaN-based semiconductor light-emitting device (light-emitting diode) as described in Examples 1 to 4, thereby stabilizing the emission wavelength of the GaN-based semiconductor light-emitting device.

EXAMPLE 6

Example 6 relates to an image display device according to a first embodiment of the present invention. The image display device of Example 6 includes a GaN-based semiconductor light-emitting device for displaying an image. The basic constitution and structure of the GaN-based semiconductor light-emitting device (light-emitting diode) are the same as described in Examples 1 to 4. Namely, the GaN-based semiconductor light-emitting device includes:

(A) the first GaN-based compound semiconductor layer 13 having n-type conductivity;

(B) the active layer 15 having a multi-quantum well structure including well layers and barrier layers for separating between the well layers; and (C) the second GaN-based compound semiconductor layer 17 having p-type conductivity;

wherein the well layers are disposed in the active layer 15 so as to satisfy the relation $d_1 < d_2$ wherein $d_1$ is the well layer density on the first GaN-based compound semiconductor layer side in the active layer and $d_2$ is the well layer density on the second GaN-based compound semiconductor layer side.

In the image display device of Example 6, the operating current density (or the driving current) of the GaN-based semiconductor light-emitting device for displaying an image can be controlled, and the pulse width and/or the pulse density of the driving current can be controlled to control the luminance (brightness) of a display image. Namely, the number of control parameters of luminance is increased in comparison to a conventional technique, thereby permitting luminance control in a wider range. Thus, a wide dynamic range of luminance can be obtained. Specifically, for example, the luminance of the whole image display device may be controlled by controlling the peak current of the driving current (operating current), and the luminance may be finely controlled by controlling the pulse width and/or the pulse density of the driving current. In contrast, the luminance of the whole image display device may be controlled by controlling the pulse width and/or the pulse density of the driving current, and the luminance may be finely controlled by controlling the peak current of the driving current (operating current). In this case, a large shift of the emission wavelength can be suppressed using the same GaN-based semiconductor light-emitting device (light-emitting diode) as described in Examples 1 to 4, thereby stabilizing the emission wavelength of the GaN-based semiconductor light-emitting device.

Examples of the image display device of Example 6 includes image display devices with constitutions and structures which will be described below. Unless otherwise specified, the number of GaN-based semiconductor light-emitting devices constituting an image display device or a light-emitting device panel may be determined on the basis of the specifications required for the image display device.

[1] Image Display Device According to Embodiment 1A

A passive matrix-type, direct-view-type image display device including:

(α) a light-emitting device panel 50 including GaN-based semiconductor light-emitting devices 1 arranged in a two-dimensional matrix;

wherein the emission state of each of the GaN-based semiconductor light-emitting devices 1 can be directly observed by controlling the emission/non-emission state of each GaN-based semiconductor light-emitting device 1 to display an image.

Figure 21A:
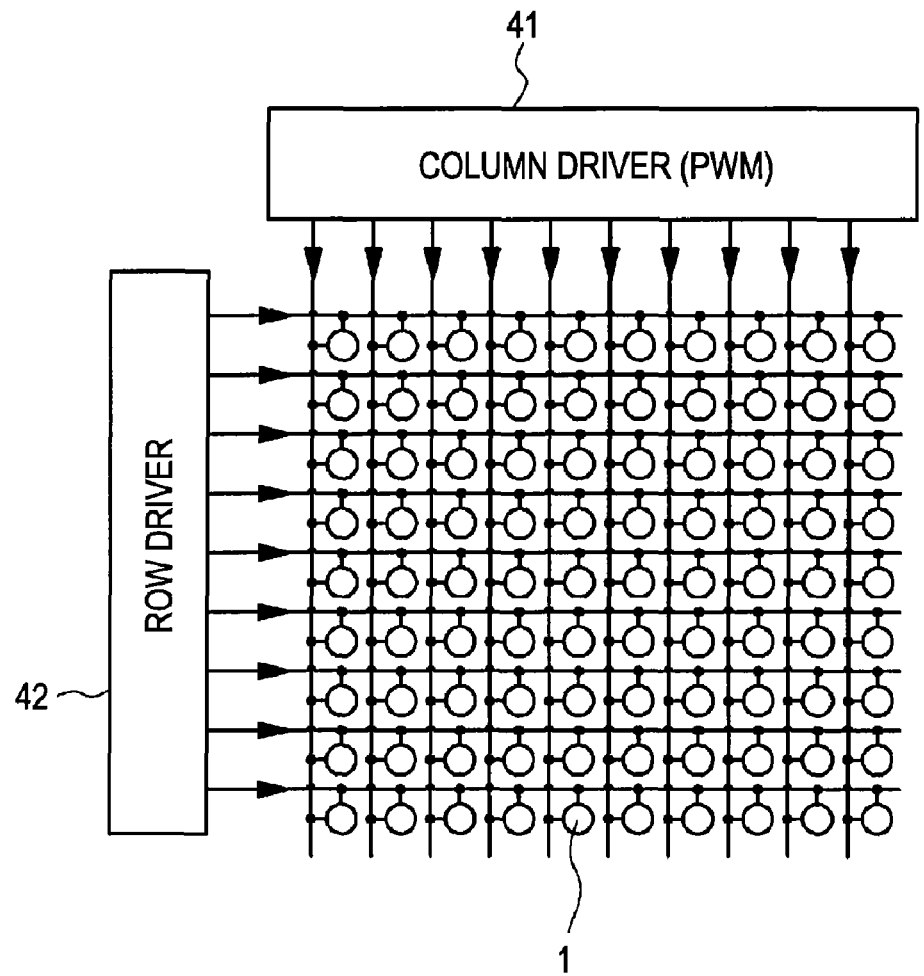
FIG. 21A is a circuit diagram of a passive matrix-type, direct-view-type image display device (image display device according to embodiment 1A) of Example 6.
Figure 21B:
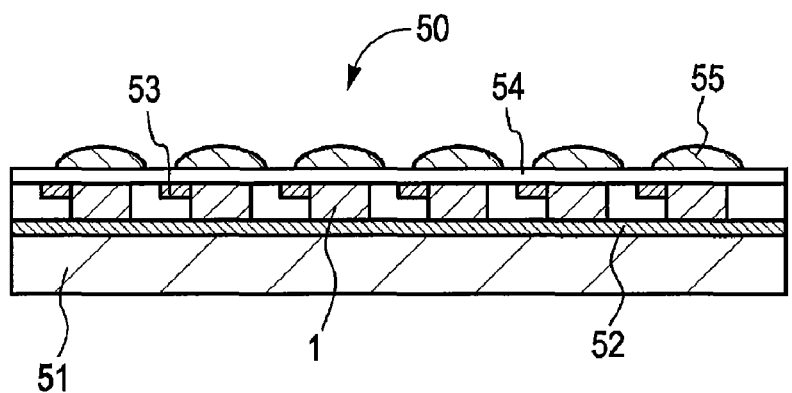
FIG. 21B is a schematic sectional view of a light-emitting device panel in which GaN-based semiconductor light-emitting devices are arranged in a two-dimensional matrix.

FIG. 21A is a diagram showing a circuit including the light-emitting device panel 50 constituting the passive matrix-type direct-view image display device, and FIG. 21B is a schematic sectional view of the light-emitting device panel in which the GaN-based semiconductor light-emitting devices 1 are arranged in a two-dimensional matrix. One of the electrodes (p-type electrode or n-type electrode) of each of the GaN-based semiconductor light-emitting devices 1 is connected to a column driver 41, and the other electrode (n-type electrode or p-type electrode) of each of the GaN-based semiconductor light-emitting devices 1 is connected to a row driver 42. The emission/non-emission state of each GaN-based semiconductor light-emitting device 1 is controlled by, for example, the row driver 42, and a driving current for driving each GaN-based semiconductor light-emitting device 1 is supplied from the column driver 41. One of the functions of the column driver 41 is the same as that of the driving circuit 26 of Example 1. Since each GaN-based semiconductor light-emitting device 1 can be selected and driven by a known method, detailed description is omitted.

The light-emitting device panel 50 includes a support 51 including, for example, a printed wiring board, the GaN-based semiconductor light-emitting devices 1 mounted on the support 51, X-direction wiring 52 formed on the support 51 to be electrically connected to electrodes (p-type electrodes or n-type electrodes) of the GaN-based semiconductor light-emitting devices 1 and connected to the column driver 41 or the row driver 42, Y-direction wiring 53 electrically connected to the other electrodes (n-type electrodes or p-type electrodes) of the GaN-based semiconductor light-emitting devices 1 and connected to the row driver 42 or the column driver 41, a transparent substrate 54 covering the GaN-based semiconductor light-emitting devices 1, and micro lenses 55 provided on the transparent substrate 54. However, the light-emitting device panel 50 is not limited to this constitution.

[2] Image Display Device According to Embodiment 1A

An active matrix-type, direct-view-type image display device including:

(α) a light-emitting device panel including GaN-based semiconductor light-emitting devices 1 arranged in a two-dimensional matrix;

wherein the emission state of each of the GaN-based semiconductor light-emitting devices 1 can be directly observed by controlling the emission/non-emission state of each GaN-based semiconductor light-emitting device 1 to display an image.

Figure 22:
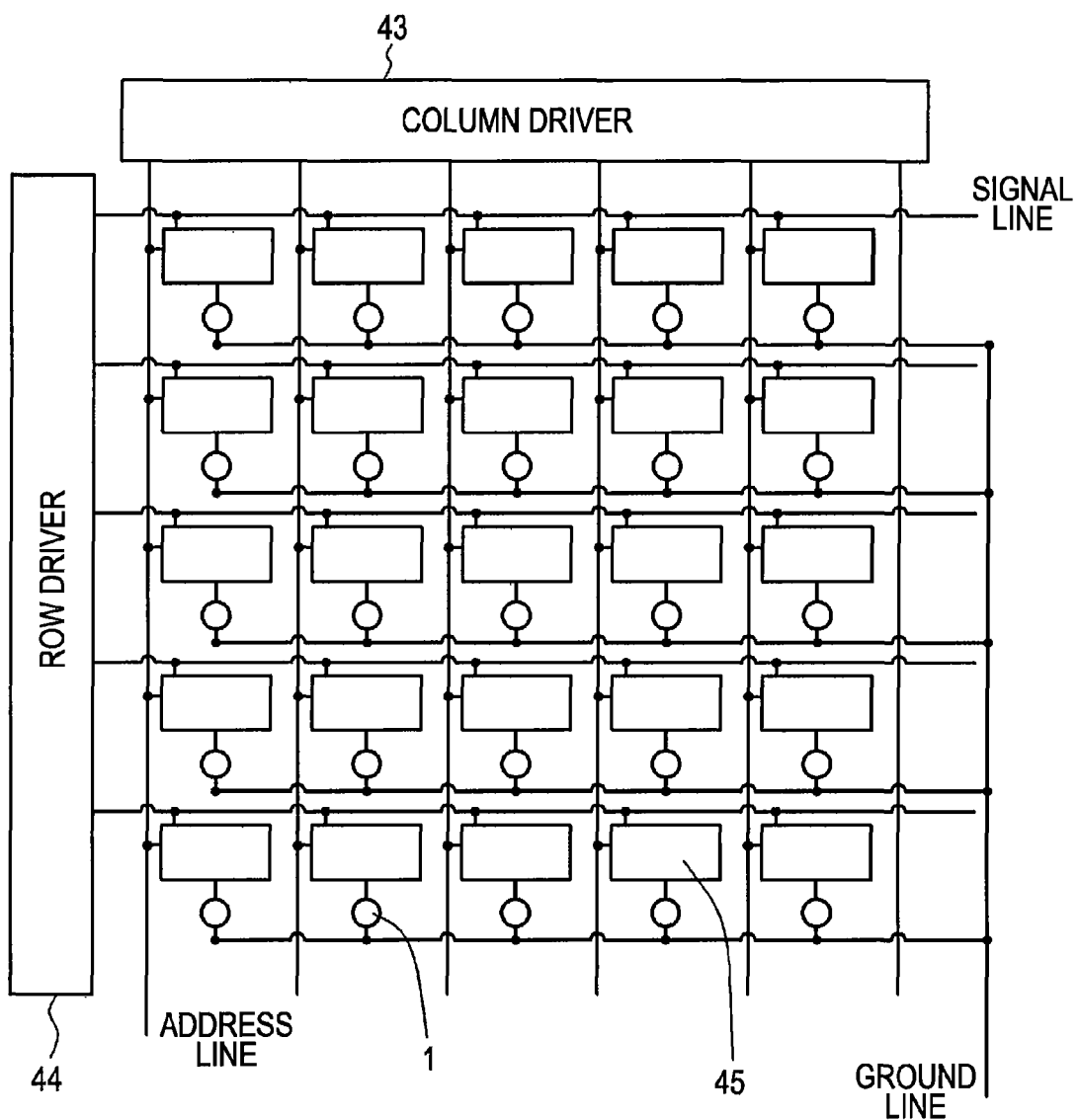
FIG. 22 is a circuit diagram of an active matrix-type, direct-view-type image display device (image display device according to embodiment 1A) of Example 6.

FIG. 22 is a diagram showing a circuit including the light-emitting device panel constituting the active matrix-type direct-view image display device. One of the electrodes (p-type electrode or n-type electrode) of each of the GaN-based semiconductor light-emitting devices 1 is connected to a driver 45 which is connected to a column driver 43 and a row driver 44. The other electrode (n-type electrode or p-type electrode) of each of the GaN-based semiconductor light-emitting devices 1 is connected to a ground wire. The emission/non-emission state of each GaN-based semiconductor light-emitting device 1 is controlled by, for example, the row driver 44 which selects the drivers 45, and a luminance signal for driving each GaN-based semiconductor light-emitting device 1 is supplied from the column driver 43. When a predetermined voltage is separately supplied to each of the drivers 45 from a power supply not shown in the drawing, the drivers 45 supply a driving current (based on PDM control or PWM control) to the GaN-based semiconductor light-emitting devices 1 according to the luminance signal. One of the functions of the column driver 43 is the same as that of the driving circuit 26 of Example 1. Since each GaN-based semiconductor light-emitting device 1 can be selected and driven by a known method, detailed description is omitted.

[3] Image Display Device According to Embodiment 1B

A passive matrix-type or active matrix-type, projection-type image display device including:

(α) a light-emitting device panel 50 including GaN-based semiconductor light-emitting devices 1 arranged in a two-dimensional matrix;

wherein the emission/non-emission state of each GaN-based semiconductor light-emitting device 1 is controlled to display an image by projection on a screen.

Figure 23:
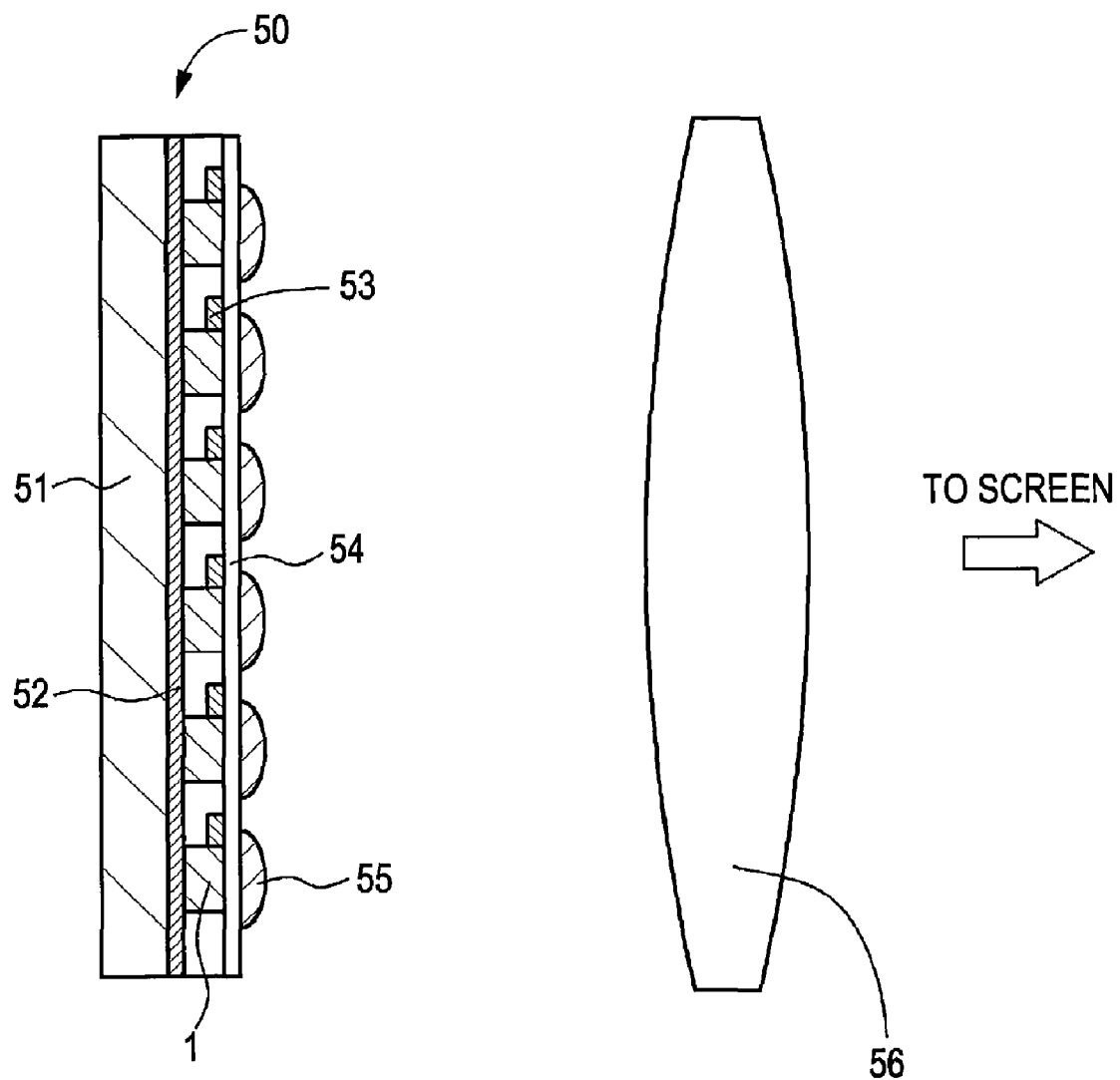
FIG. 23 is a conceptual view of a projection-type image display device (image display device according to embodiment 1B) including a light-emitting device panel in which GaN-based semiconductor light-emitting devices are arranged in a two-dimensional matrix.

A diagram of a circuit including the light-emitting device panel constituting the passive matrix-type image display device is the same as shown in FIG. 21A, and a diagram of a circuit including the light-emitting device panel constituting the active matrix-type image display device is the same as shown in FIG. 22. Therefore, detailed description is omitted. FIG. 23 is a conceptual view of the light-emitting device panel 50 in which the GaN-based semiconductor light-emitting devices 1 are arranged in a two-dimensional matrix. Light emitted from the light-emitting device panel 50 is projected on a screen through a projection lens 56. Since the constitution and structure of the light-emitting device panel 50 are the same as those described with reference to FIG. 21B, detailed description is omitted.

[4] Image Display Device According to Embodiment 1C

A color-display, direct-view-type or projection-type image display device including:

(α) a red light-emitting device panel 50R including red light-emitting semiconductor light-emitting devices (for example, AlGaInP-based semiconductor light-emitting devices or GaN-based semiconductor light-emitting devices) 1R arranged in a two-dimensional matrix;

(β) a green light-emitting device panel 50G including green light-emitting GaN-based semiconductor light-emitting devices 1G arranged in a two-dimensional matrix;

(γ) a blue light-emitting device panel 50B including blue light-emitting GaN-based semiconductor light-emitting devices 1B arranged in a two-dimensional matrix; and (δ) means (for example, a dichroic prism 57) for collecting the light emitted from the red light-emitting device panel 50R, the green light-emitting device panel 50G, and the blue light-emitting device panel 50B in an optical path;

wherein the emission/non-emission state of each of the red light-emitting semiconductor light-emitting devices 1R, the green light-emitting semiconductor light-emitting devices 1G, and the blue light-emitting semiconductor light-emitting devices 1B is controlled.

Figure 24:
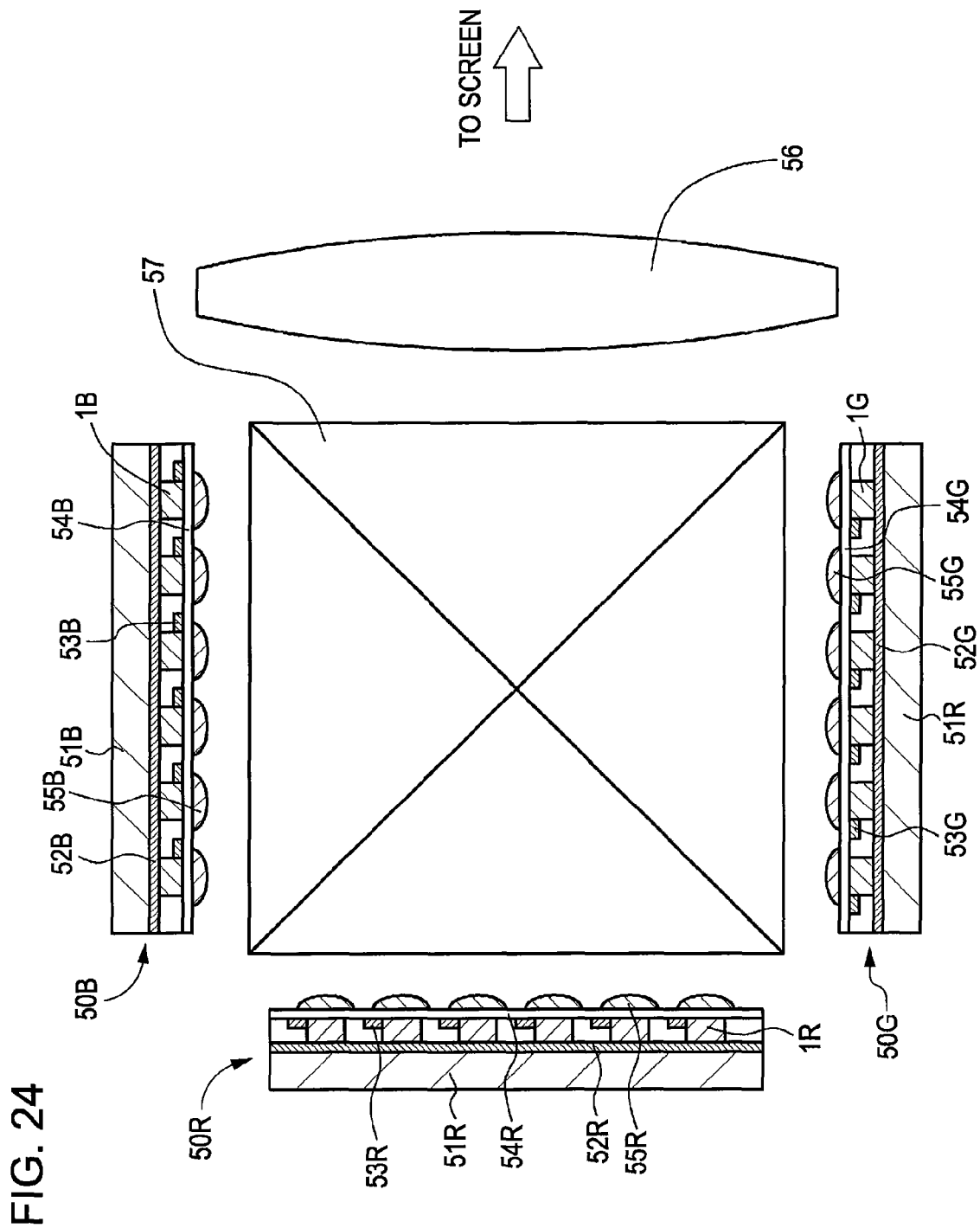
FIG. 24 is a conceptual view of a projection-type, color-display image display device (image display device according to embodiment 1C) including a red light-emitting device panel, a green light-emitting device panel, and a blue light-emitting device panel.

A diagram of a circuit including the light-emitting device panel constituting the passive matrix-type image display device is the same as shown in FIG. 21A, and a diagram of a circuit including the light-emitting device panel constituting the active matrix-type image display device is the same as shown in FIG. 22. Therefore, detailed description is omitted. FIG. 24 is a conceptual view of the light-emitting device panels 50R, 50G, and 50B in which the GaN-based semiconductor light-emitting devices 1R, 1G, and 1B, respectively, are arranged in a two-dimensional matrix. Lights emitted from the light-emitting device panels 50R, 50G, and 50B are incident on the dichroic prism 57 to be converged in one optical path. In the direct-view-type image display device, the light is directly viewed, and in the projection-type image display device, the light is projected on a screen through the projection lens 56. Since the constitution and structure of each of the light-emitting device panels 50R, 50G, and 50B are the same as those of the light-emitting device panel 50 described with reference to FIG. 21B, detailed description is omitted.

In this image display device, the semiconductor light-emitting devices 1R, 1G, and 1B constituting the light-emitting device panels 50R, 50G, and 50B, respectively, are preferably the GaN-based semiconductor light-emitting devices 1 described in Examples 1 to 4. However, according to circumstances, for example, the semiconductor light-emitting devices 1R constituting the light-emitting device panel 50R may be AlInGaP-based compound semiconductor light-emitting diodes, and the semiconductor light-emitting devices 1G and 1B constituting the light-emitting device panels 50G and 50B, respectively, may be the GaN-based compound semiconductor light-emitting devices 1 described in Examples 1 to 4.

(5) Image Display Device According to Embodiment 1D

A direct-view type or projection-type image display device including:

(α) a GaN-based semiconductor light-emitting device 101; and (β) a light transmission controller (for example, a liquid crystal display 58 including a high-temperature polysilicon-type thin film transistor, this applies to the description below) which is a light valve for controlling transmission/non-transmission of light emitted from the GaN-based semiconductor light-emitting device 101;

wherein transmission/non-transmission of light emitted from the GaN-based semiconductor light-emitting device 101 is controlled by the liquid crystal display device 58 serving as the light transmission controller to display an image.

Figure 25:
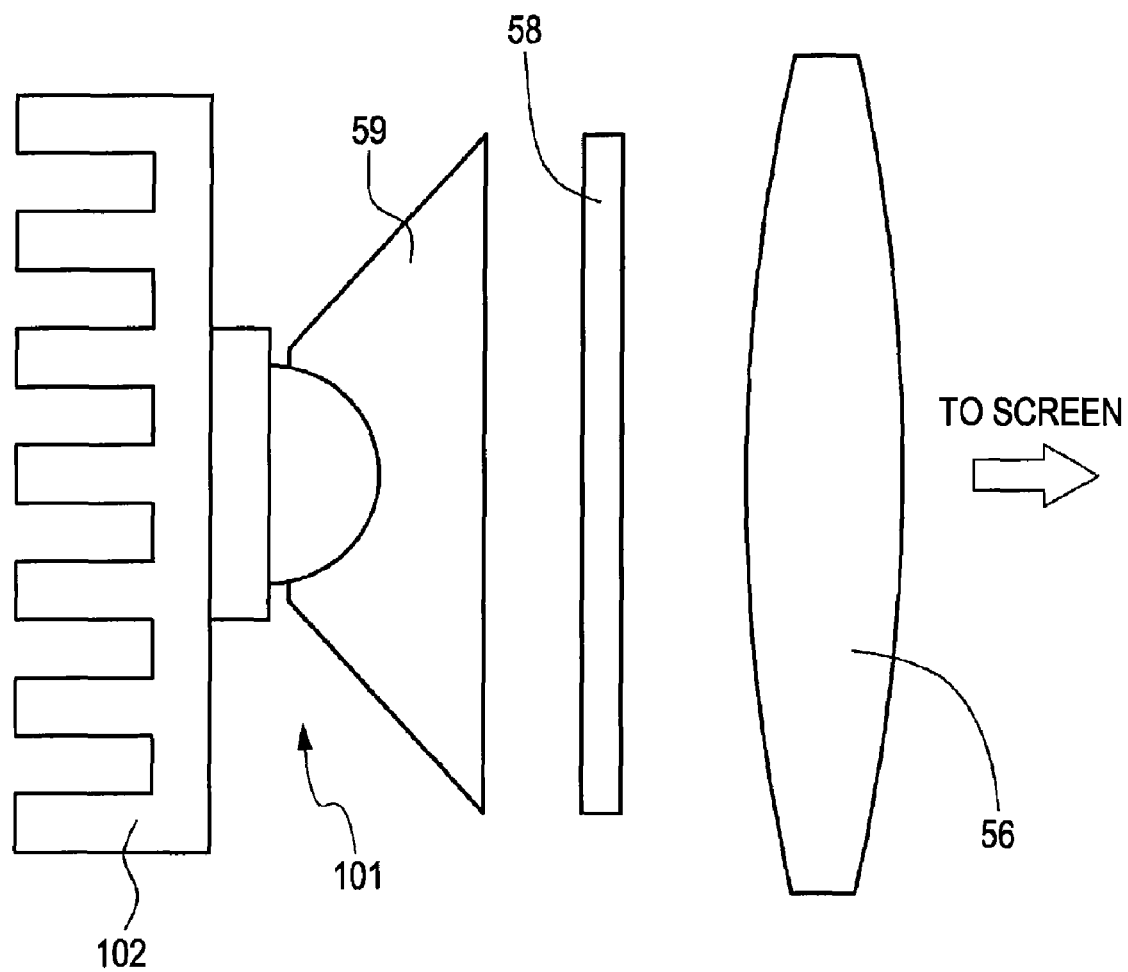
FIG. 25 is a conceptual view of a projection-type image display device (image display device according to embodiment 1D) including a GaN-based semiconductor light-emitting device and a light transmission controller.

The number of GaN-based semiconductor light-emitting devices may be determined on the basis of the specifications required for the image display device and may be 1 or more. In an example in which a conceptual view of an image display device is shown in FIG. 25, the number of the GaN-based semiconductor light-emitting device 101 is 1, and the GaN-based semiconductor light emitting device 101 is mounted on a heat sink 102. Light emitted from the GaN-based semiconductor light-emitting device 101 is guided by a light guiding member 59 including a light guide member composed of a transparent material such as a silicone resin, an epoxy resin, or a polycarbonate resin, and a reflector such as a mirror and is incident on the liquid crystal display device 58. In the direct-view-type image display device, the light emitted from the liquid crystal display device 58 is directly viewed, and in the projection-type image display device, the light is projected on a screen through the projection lens 56. The GaN-based semiconductor light-emitting device 101 may be the GaN-based semiconductor light-emitting device 1 described in Examples 1 to 4.

Figure 26:
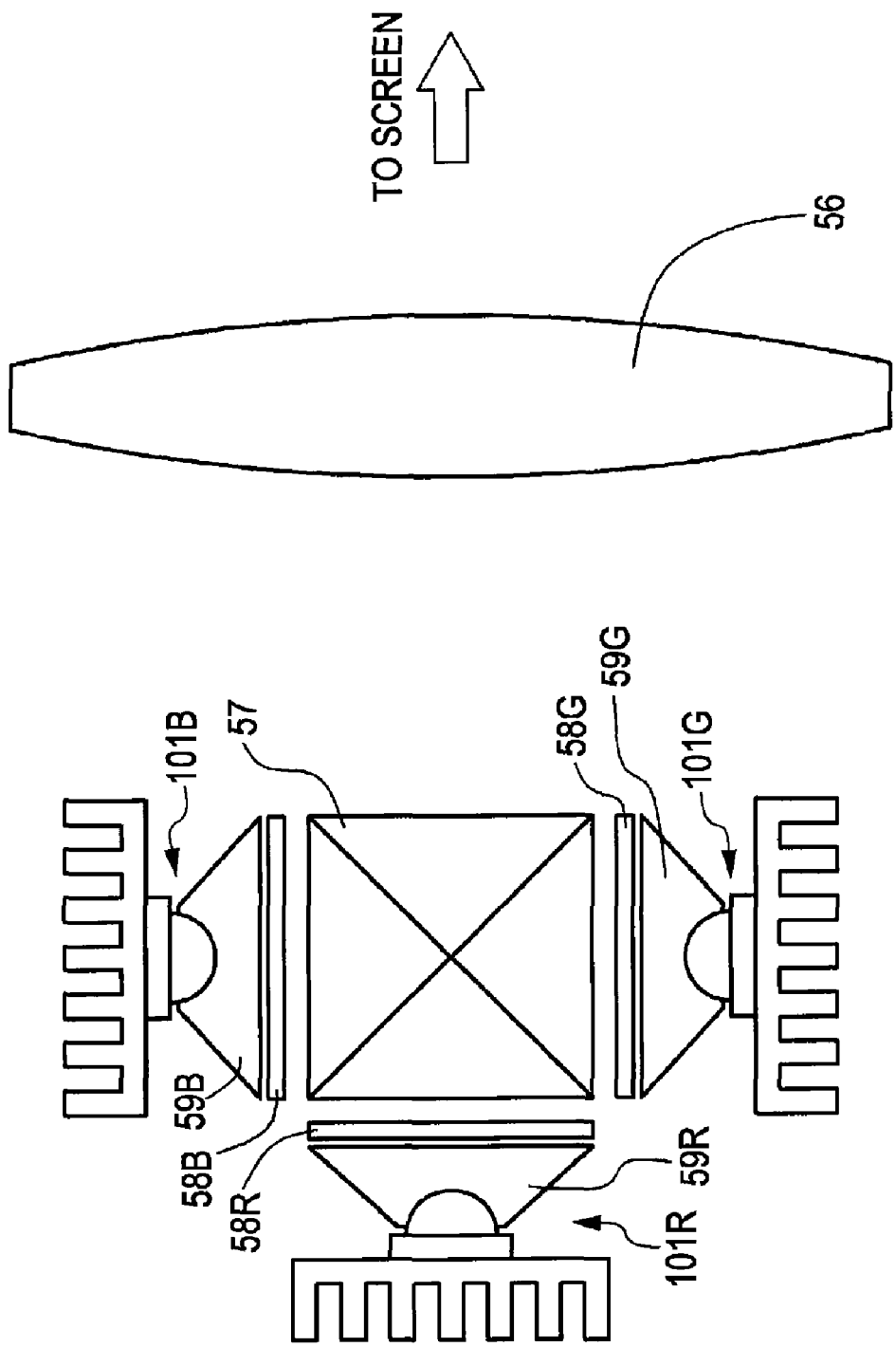
FIG. 26 is a conceptual view of a color-display, projection-type image display device (image display device according to embodiment 1D) including three sets of GaN-based semiconductor light-emitting device and a light transmission controller.

The image display device may include a red light-emitting semiconductor light-emitting device (for example, an AlGaInP-based semiconductor light-emitting device or GaN-based semiconductor light-emitting device) 101R, a light transmission controller (for example, a liquid crystal display 58R) which is a light valve for controlling transmission/non-transmission of light emitted from the red light-emitting semiconductor light-emitting device 101R, a green light-emitting GaN-based semiconductor light-emitting device 101G, a light transmission controller (for example, a liquid crystal display 58G) which is a light valve for controlling transmission/non-transmission of light emitted from the green light-emitting GaN-base semiconductor light-emitting device 101G, a blue light-emitting GaN-based semiconductor light-emitting device 101B, a light transmission controller (for example, a liquid crystal display 58B) which is a light valve for controlling transmission/non-transmission of light emitted from the blue light-emitting GaN-base semiconductor light-emitting device 101B, light guide members 59R, 59G, and 59B for guiding lights emitted from the GaN-based semiconductor light-emitting devices 101R, 101G, and 101B, respectively, and means (for example, a dichroic prism 57) for collecting the lights in one optical path. In this case, a color-display, direct-view-type or projection-type image display device can be obtained. An example whose conceptual view is shown in FIG. 26 corresponds to a color-display, projection-type image display device.

In this image display device, the semiconductor light-emitting devices 101R, 101G, and 101B are preferably the GaN-based semiconductor light-emitting devices 1 described in Examples 1 to 4. However, according to circumstances, for example, the semiconductor light-emitting device 101R may be an AlInGaP-based compound semiconductor light-emitting diode, and the semiconductor light-emitting devices 101G and 101B may be the GaN-based compound semiconductor light-emitting devices 1 described in Examples 1 to 4.

[6] Image Display Device According to Embodiment 1E

A direct-view-type or projection-type image display device including:

(α) a light-emitting device panel 50 including GaN-based semiconductor light-emitting devices arranged in a two-dimensional matrix; and (β) a light transmission controller (liquid crystal display device 58) for controlling transmission/non-transmission of light emitted from the GaN-based semiconductor light-emitting devices 1;

wherein transmission/non-transmission of light emitted from the GaN-based semiconductor light-emitting devices 1 is controlled by the light transmission controller (liquid crystal display device 58) to display an image.

Figure 27:
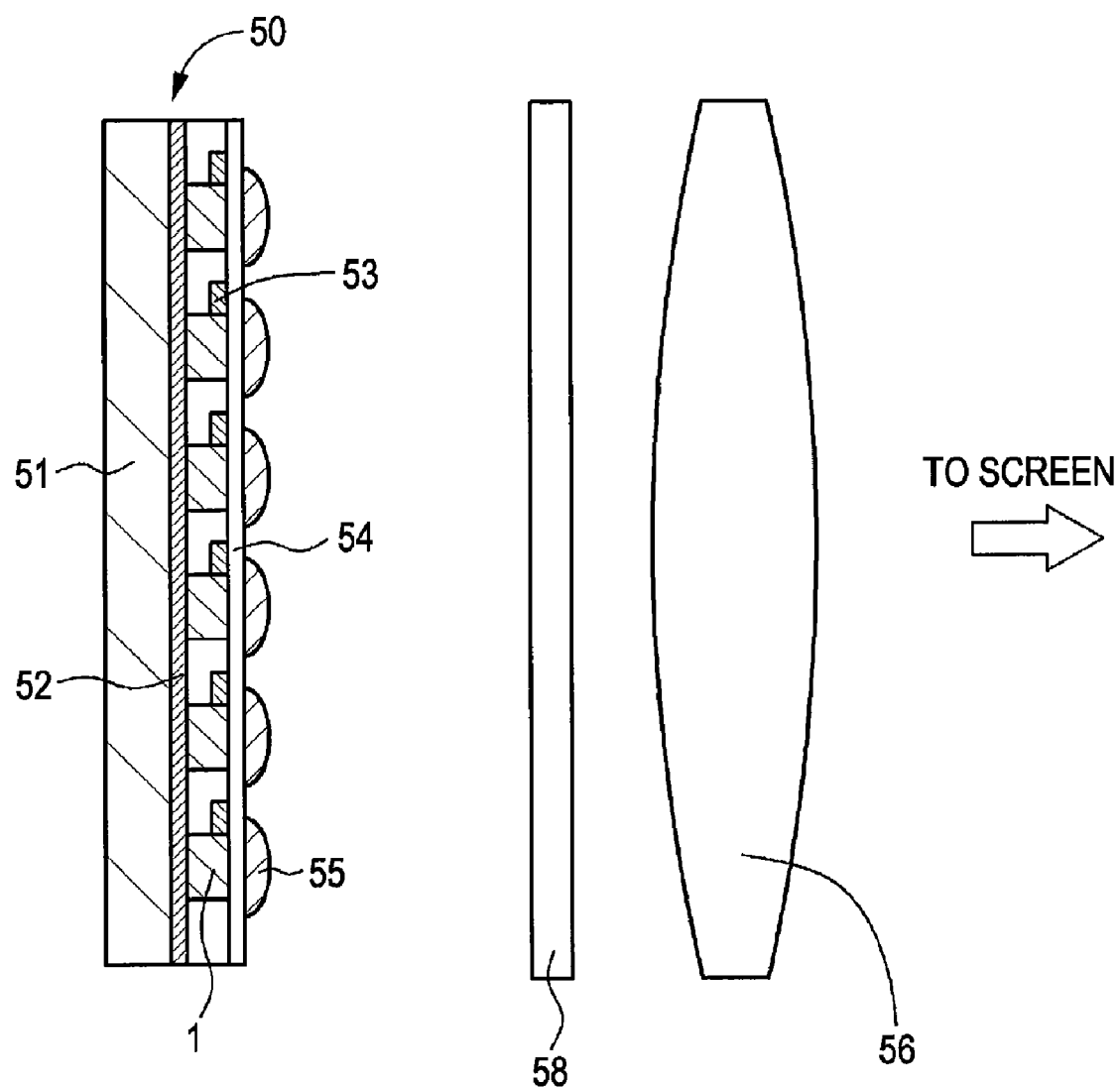
FIG. 27 is a conceptual view of a projection-type image display device (image display device according to embodiment 1E) including a light-emitting device panel and a light transmission controller.

FIG. 27 is a conceptual view showing the light-emitting device panel 50, etc. The constitution and structure of the light-emitting device panel 50 may be the same as those of the light-emitting device panel 50 described with reference to FIG. 21B, and thus detailed description is omitted. The transmission/non-transmission and brightness of light emitted from the light-emitting device panel 50 are controlled by the operation of the liquid crystal display device 58. Thus, the GaN-based semiconductor light-emitting devices 1 constituting the light-emitting device panel 50 may be constantly lighted or repeatedly lighted and unlighted at an appropriate period. Light emitted from the light-emitting device panel 50 is incident on the liquid crystal display device 58. In the direct-view-type image display device, the light emitted from the liquid crystal display device 58 is directly viewed, and in the projection-type image display device, the light is projected on a screen through the projection lens 56.

[7] Image Display Device According to Embodiment 1F

A color-display, direct-view-type or projection-type image display device including:

(α) a red light-emitting device panel 50R including red light-emitting semiconductor light-emitting devices (for example, AlGaInP-based semiconductor light-emitting devices or GaN-based semiconductor light-emitting devices) 1R arranged in a two-dimensional matrix, and a red light transmission controller (liquid crystal display device 58R) for controlling transmission/non-transmission of light emitted from the red light-emitting device panel 50R;

(β) a green light-emitting device panel 50G including green light-emitting GaN-based semiconductor light-emitting devices 1G arranged in a two-dimensional matrix, and a green light transmission controller (liquid crystal display device 58G) for controlling transmission/non-transmission of light emitted from the green light-emitting device panel 50G;

(γ) a blue light-emitting device panel 50B including blue light-emitting GaN-based semiconductor light-emitting devices 1B arranged in a two-dimensional matrix, and a blue light transmission controller (liquid crystal display device 58B) for controlling transmission/non-transmission of light emitted from the blue light-emitting device panel 50B; and (δ) means (for example, a dichroic prism 57) for collecting the light transmitted through the red light transmission controller 58R, the green light transmission controller 58G, and the blue light transmission controller 58B in an optical path;

wherein the transmission/non-transmission of light emitted from the light-emitting device panels 50R, 50G, and 50B is controlled by the light transmission controllers 58R, 58G, and 58B, respectively, to display an image.

Figure 28:
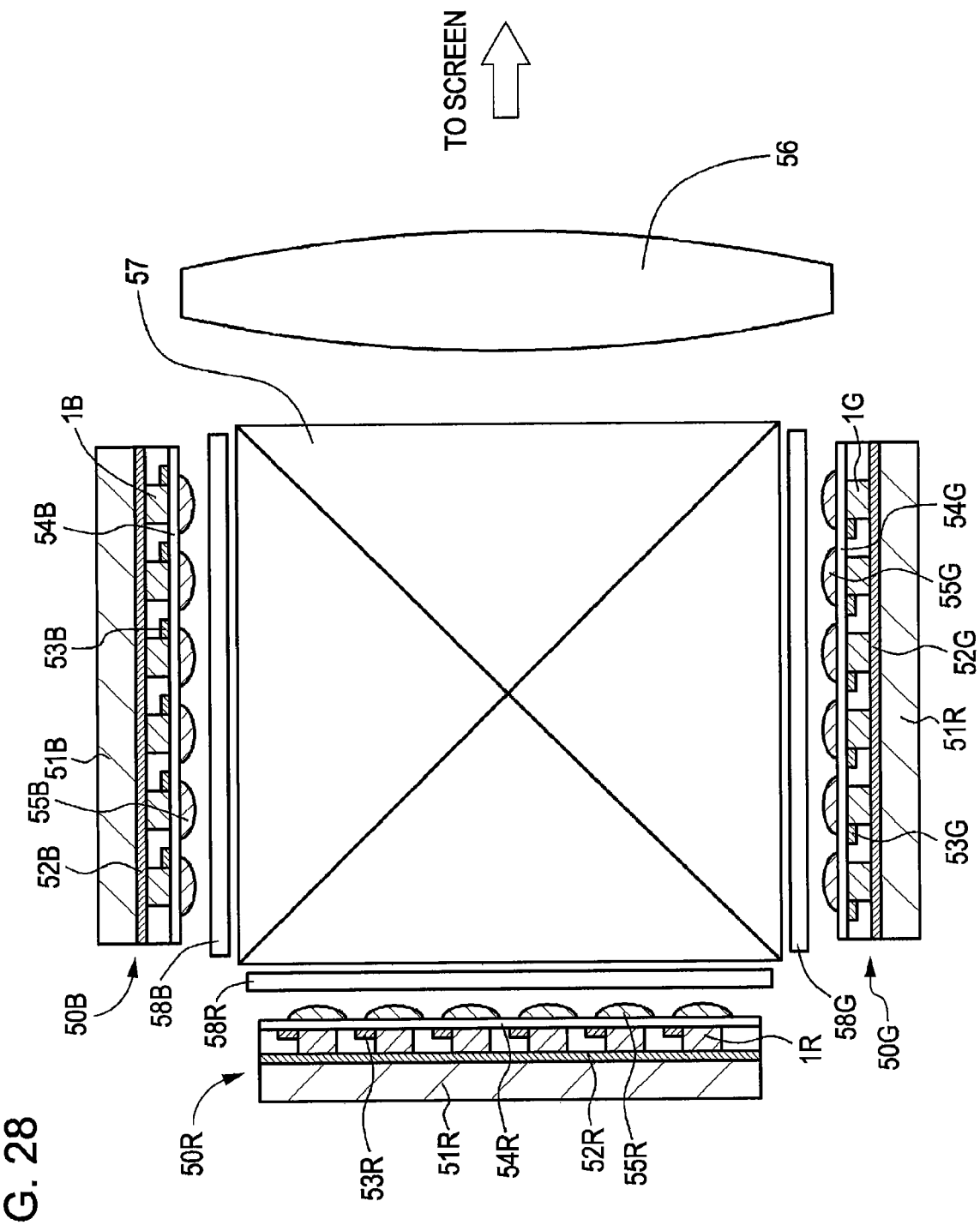
FIG. 28 is a conceptual view of a color-display, projection-type image display device (image display device according to embodiment 1F) including three sets of a GaN-based semiconductor light-emitting device and a light transmission controller.

FIG. 28 is a conceptual view showing the light-emitting device panels 50R, 50G, and 50B including the GaN-based semiconductor light-emitting devices 1R, 1G, and 1B, respectively, arranged in a two-dimensional matrix. The transmission/non-transmission of light emitted from the light-emitting device panels 50R, 50G, and 50B is controlled by the light transmission controllers 58R, 50G, and 58B, respectively. The light is incident on the dichroic prism 57 to be collected in one optical path. In the direct-view-type image display device, the light is directly viewed, and in the projection-type image display device, the light is projected on a screen through the projection lens 56. The constitution and structure of each of the light-emitting device panels 50R, 50G, and 50B may be the same as those of the light-emitting device panel 50 described with reference to FIG. 21B, and thus detailed description is omitted.

In this image display device, the semiconductor light-emitting devices 1R, 1G, and 1B constituting the light-emitting device panels 50R, 50G, and 50B, respectively, are preferably the GaN-based semiconductor light-emitting devices 1 described in Examples 1 to 4. However, according to circumstances, for example, the semiconductor light-emitting devices 1R constituting the light-emitting device panel 50R may be AlInGaP-based compound semiconductor light-emitting diodes, and the semiconductor light-emitting devices 1G and 1B constituting the light-emitting device panels 50G and 50B, respectively, may be the GaN-based compound semiconductor light-emitting devices 1 described in Examples 1 to 4.

[8] Image Display Device According to Embodiment 1G

A field sequential-system, color-display image display device (direct-view type or projection type) including:

(α) a red light-emitting semiconductor light-emitting device (for example, an AlGaInP-based semiconductor light-emitting device or GaN-based semiconductor light-emitting device) 1R;

(β) a green light-emitting GaN-based semiconductor light-emitting device 1G;

(γ) a blue light-emitting GaN-based semiconductor light-emitting device 1B;

(δ) means (for example, a dichroic prism 57) for collecting the light emitted from the red light-emitting semiconductor light-emitting device 1R, the green light-emitting GaN-based semiconductor light-emitting device 1G, and the blue light-emitting GaN-based semiconductor light-emitting device 1B in an optical path; and (ε) a light transmission controller (liquid crystal display device 58) for controlling transmission/non-transmission of light emitted from the means (dichroic prism 57) for colleting the light in the optical path;

wherein the transmission/non-transmission of light emitted from each of the light-emitting devices is controlled by the light transmission controller 58 to display an image.

Figure 29:
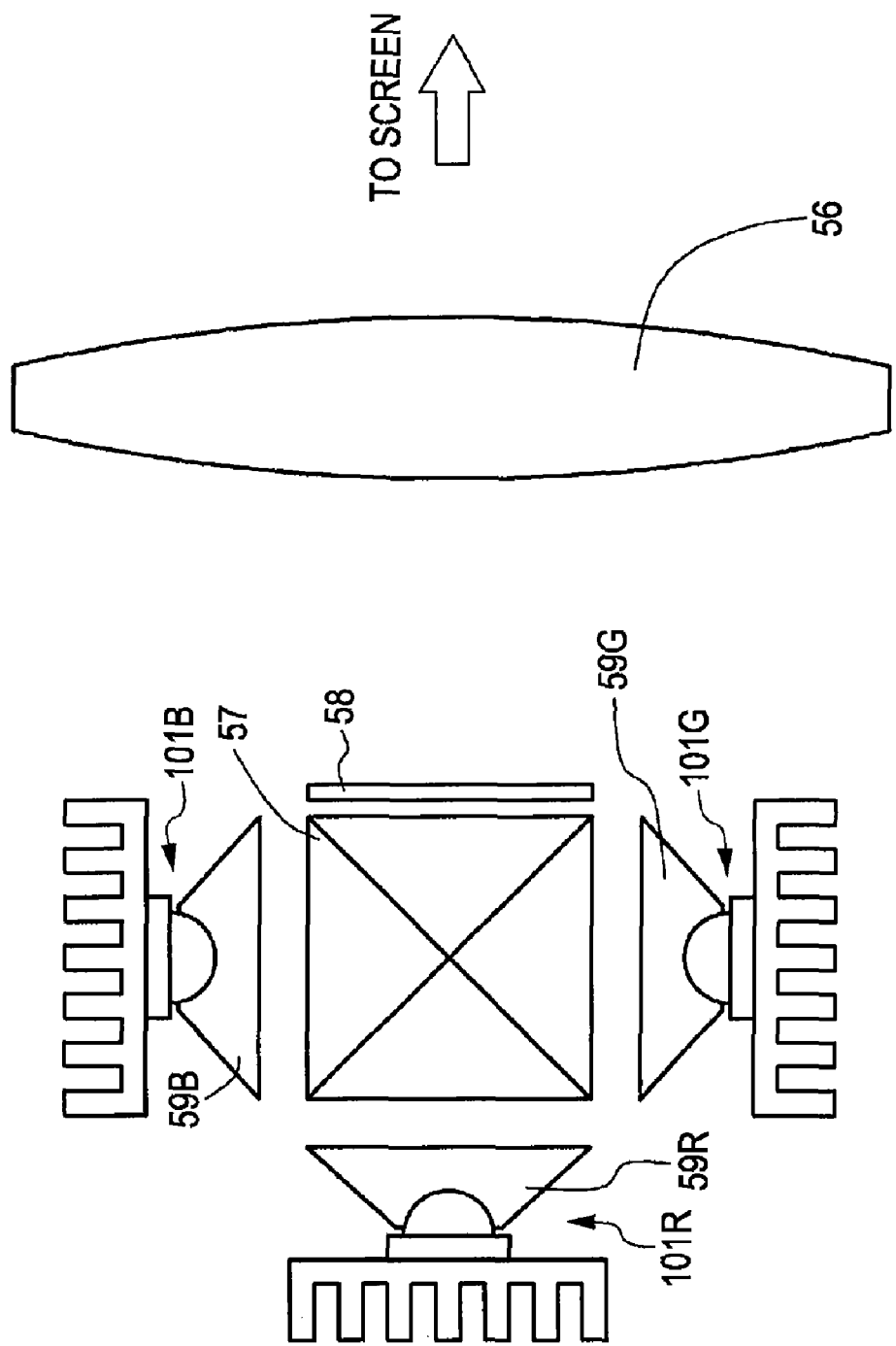
FIG. 29 is a conceptual view of a color-display, projection-type image display device (image display device according to embodiment 1G) including three GaN-based semiconductor light-emitting devices and a light transmission controller.

FIG. 29 is a conceptual view showing the semiconductor light-emitting devices 101R, 101G, and 101B. The light emitted from the semiconductor light-emitting devices 101R, 101G, and 101B is incident on the dichroic prism 57 to be converged in one optical path. The transmission/non-transmission of the light emitted from the dichroic prism 57 is controlled by the light transmission controller 58. In the direct-view-type image display device, the light is directly viewed, and in the projection-type image display device, the light is projected on a screen through the projection lens 56. In this image display device, the semiconductor light-emitting devices 101R, 101G, and 101B are preferably the GaN-based semiconductor light-emitting devices 1 described in Examples 1 to 4. However, according to circumstances, for example, the semiconductor light-emitting device 101R may be an AlInGaP-based compound semiconductor light-emitting diode, and the semiconductor light-emitting devices 101G and 101B may be the GaN-based compound semiconductor light-emitting devices 1 described in Examples 1 to 4.

[9] Image Display Device According to Embodiment 1H

A field sequential-system, color-display image display device (direct-view type or projection type) including:

(α) a red light-emitting device panel 50R including red light-emitting semiconductor light-emitting devices (for example, AlGaInP-based semiconductor light-emitting devices or GaN-based semiconductor light-emitting devices) 1R arranged in a two-dimensional matrix;

(β) a green light-emitting device panel 5G including green light-emitting GaN-based semiconductor light-emitting devices 1G arranged in a two-dimensional matrix;

(γ) a blue light-emitting device panel 50B including blue light-emitting GaN-based semiconductor light-emitting devices 1B arranged in a two-dimensional matrix;

(δ) means (for example, a dichroic prism 57) for collecting the light emitted from the red light-emitting device panel 50R, the green light-emitting device panel 50G, and the blue light-emitting device panel 50B in an optical path; and (ε) a light transmission controller (liquid crystal display device 58) for controlling transmission/non-transmission of light emitted from the means (dichroic prism 57) for colleting the light in the optical path;

wherein the transmission/non-transmission of light emitted from the light-emitting device panels 50R, 50G, and 50B is controlled by the light transmission controller 58 to display an image.

Figure 30:
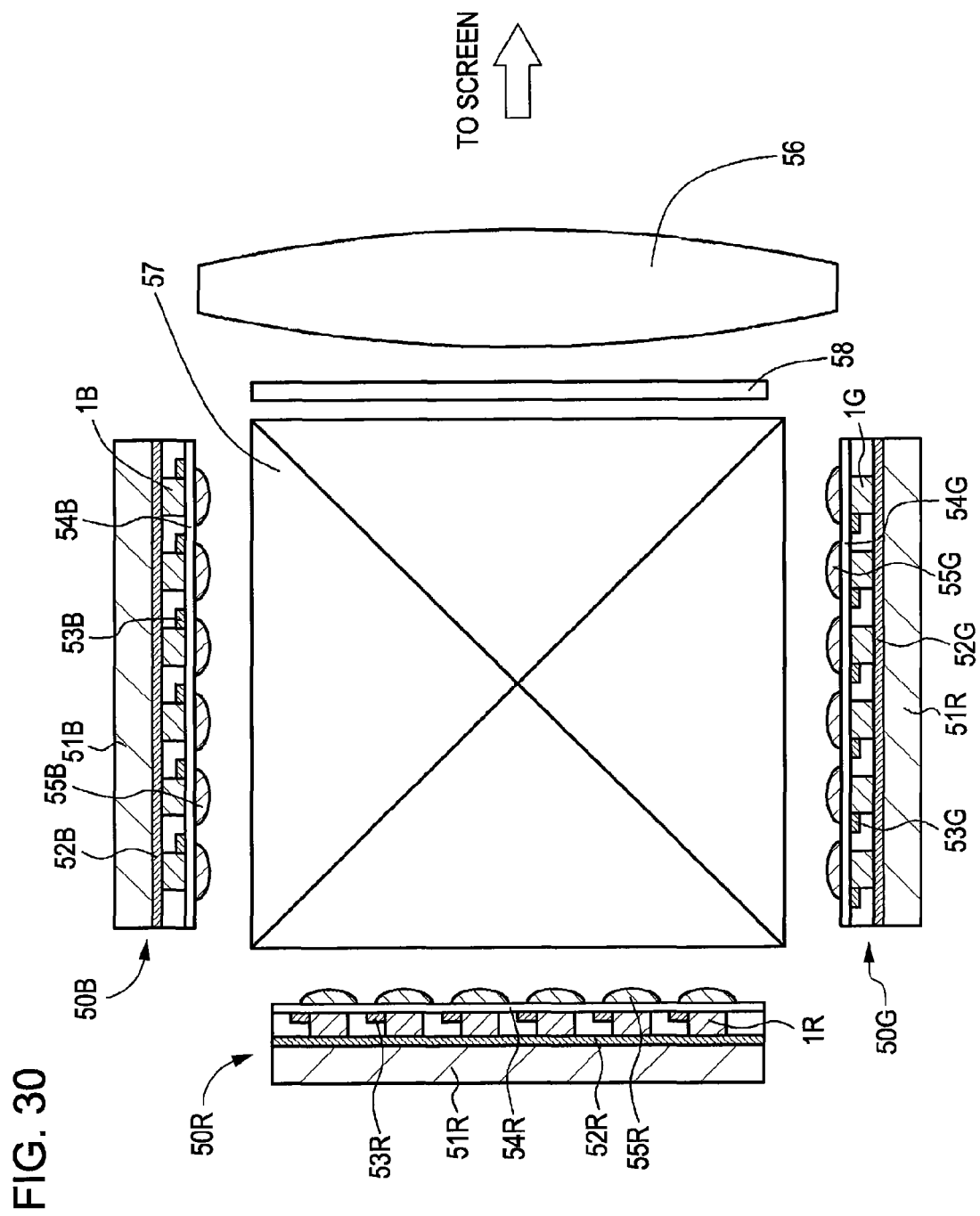
FIG. 30 is a conceptual view of a color-display, projection-type image display device (image display device according to embodiment 1H) including three light-emitting device panels and a light transmission controller.

FIG. 30 is a conceptual view showing the light-emitting device panels 50R, 50G, and 50B including the GaN-based semiconductor light-emitting devices 1R, 1G, and 1B, respectively, arranged in a two-dimensional matrix. The light emitted from the light-emitting device panels 50R, 50G, and 50B is incident on the dichroic prism 57 to be converged in one optical path. The transmission/non-transmission of the light emitted from the dichroic prism 57 is controlled by the light transmission controller 58. In the direct-view-type image display device, the light is directly viewed, and in the projection-type image display device, the light is projected on a screen through the projection lens 56. The constitution and structure of each of the light-emitting device panels 50R, 50G, and 50B may be the same as those of the light-emitting device panel 50 described with reference to FIG. 21B, and thus detailed description is omitted.

In this image display device, the semiconductor light-emitting devices 1R, 1G, and 1B constituting the light-emitting device panels 50R, 50G, and 50B, respectively, are preferably the GaN-based semiconductor light-emitting devices 1 described in Examples 1 to 4. However, according to circumstances, for example, the semiconductor light-emitting devices 1R constituting the light-emitting device panel 50R may be AlInGaP-based compound semiconductor light-emitting diodes, and the semiconductor light-emitting devices 1G and 1B constituting the light-emitting device panels 50G and 50B, respectively, may be the GaN-based compound semiconductor light-emitting devices 1 described in Examples 1 to 4.

EXAMPLE 7

Example 7 relates to an image display device according to a second embodiment of the present invention. The image display device of Example 7 includes light-emitting device units UN for displaying a color image, which are arranged in a two-dimensional matrix and each of which includes a first light-emitting device emitting blue light, a second light-emitting device emitting green light, and a third light-emitting device emitting red light. A GaN-based semiconductor light emitting device (light-emitting diode) constituting at least one of the first light-emitting device, the second light-emitting device, and the third light-emitting device has the same constitution and structure as described in Examples 1 to 4. Namely, the GaN-based semiconductor light-emitting device includes:

(A) a first GaN-based compound semiconductor layer 13 having n-type conductivity;

(B) an active layer 15 having a multi-quantum well structure including well layers and barrier layers for separating between the well layers; and (C) a second GaN-based compound semiconductor layer 17 having p-type conductivity;

wherein the well layers are disposed in the active layer so as to satisfy the relation $d_1 < d_2$ wherein $d_1$ is the well layer density on the first GaN-based compound semiconductor layer side in the active layer and $d_2$ is the well layer density on the second GaN-based compound semiconductor layer side.

In the image display device, any one of the first light-emitting device, the second light-emitting device, and the third light-emitting device may be the GaN-based semiconductor light-emitting device 1 described in Examples 1 to 4. According to circumstances, for example, the red light-emitting device may be an AlInGaP-based compound semiconductor light-emitting diode.

In the image display device of Example 7, the luminance (brightness) of a display image can be controlled by controlling the pulse width and/or the pulse density of the driving current in addition to the control of the operating current density (or the driving current) of the GaN-based semiconductor light-emitting device for displaying an image. Therefore, the number of control parameters of luminance is increased in comparison to a conventional technique, thereby permitting luminance control in a wider range. Namely, a wide dynamic range of luminance can be obtained. Specifically, for example, the luminance of the whole image display device may be controlled by controlling the peak current of the driving current (operating current), and the luminance may be finely controlled by controlling the pulse width and/or the pulse density of the driving current. In contrast, the luminance of the whole image display device may be controlled by controlling the pulse width and/or the pulse density of the driving current, and the luminance may be finely controlled by controlling the peak current of the driving current (operating current). In addition, by using the same GaN-based semiconductor light-emitting device (light-emitting diode) as described in Examples 1 to 4, a large shift of the emission wavelength can be suppressed to stabilize the emission wavelength of the GaN-based semiconductor light-emitting device.

Examples of the image display device of Example 7 includes image display devices with constitutions and structures which will be described below. The number of light-emitting device units may be determined on the basis of the specifications required for the image display device.

[1] Image Display Devices According to Embodiments 2A and 2B

In a passive matrix-type or active matrix-type, direct-view, color-display image display device, the emission/non-emission state of each of first, second, and third light-emitting devices is controlled to directly observe the emission state of each light-emitting device and display an image. In a passive matrix-type or active matrix-type, projection-type, color-display image display device, the emission/non-emission state of each of first, second, and third light-emitting devices is controlled to display an image by projection on a screen.

Figure 31:
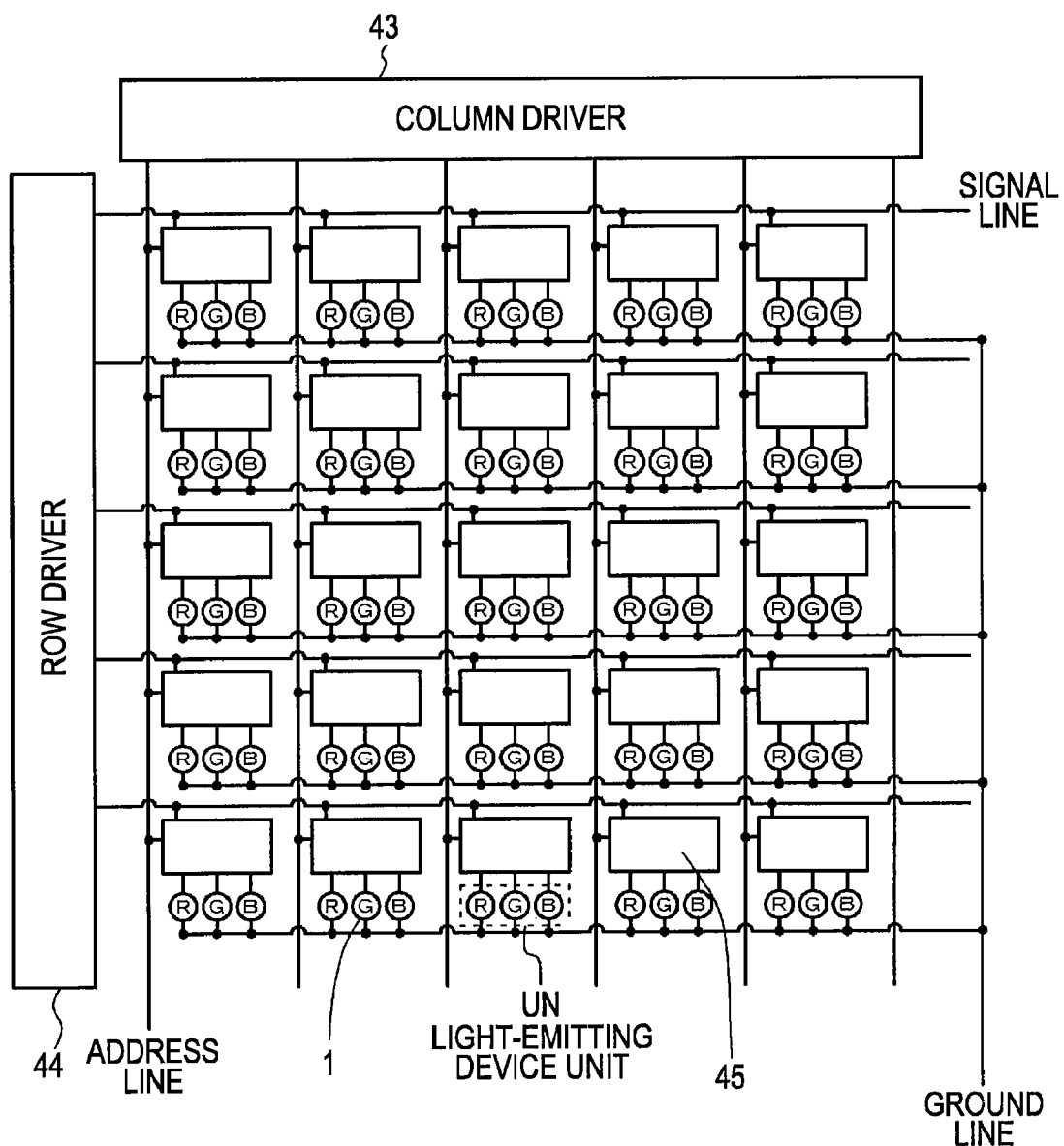
FIG. 31 is a circuit diagram of an active matrix-type, direct-view-type, color-display image display device (image display device according to embodiment 2A) of Example 7.

FIG. 31 is a diagram showing a circuit including a light-emitting device panel constituting the active matrix-type direct-view, color-display image display device. One of the electrodes (p-type electrode or n-type electrode) of each of GaN-based semiconductor light-emitting devices 1 (in FIG. 31, a red light-emitting semiconductor light-emitting device is shown by "R", a green light-emitting semiconductor light-emitting device is shown by "G", and a blue light-emitting semiconductor light-emitting device is shown by "B") is connected to a driver 45 which is connected to a column driver 43 and a row driver 44. The other electrode (n-type electrode or p-type electrode) of each of the GaN-based semiconductor light-emitting devices 1 is connected to a ground wire. The emission/non-emission state of each GaN-based semiconductor light-emitting device 1 is controlled by, for example, the row driver 44 which selects the drivers 45, and a luminance signal for driving each GaN-based semiconductor light-emitting device 1 is supplied from the column driver 43. When a predetermined voltage is separately supplied to each of the drivers 45 from a power supply not shown in the drawing, the drivers 45 supply a driving current (based on PDM control or PWM control) to the GaN-based semiconductor light-emitting devices 1 according to the luminance signal. One of the functions of the column driver 43 is the same as that of the driving circuit 26 of Example 1. Each of the red light-emitting semiconductor light-emitting device R, the green light-emitting semiconductor light-emitting device G, and the blue light-emitting semiconductor light-emitting device B is selected by the driver 45. The emission/non-emission states of the red light-emitting semiconductor light-emitting device R, the green light-emitting semiconductor light-emitting device G, and the blue light-emitting semiconductor light-emitting device B may be time-division-controlled or simultaneously controlled. Since each GaN-based semiconductor light-emitting device can be selected and driven by a known method, detailed description is omitted. In the direct-view-type image display device, the light is directly viewed, and in the projection-type image display device, the light is projected on a screen through the projection lens 56.

[2] Image Display Device According to Embodiment 2C

A field sequential-system, color-display image, direct-view-type or projection-type image display device including a light transmission controller (for example, a liquid crystal display device) for controlling transmission/non-transmission of light emitted from each of light-emitting device units arranged in a two-dimensional matrix, wherein the emission/non-emission state of each of first, second, and third light-emitting devices in the light-emitting device units is time-division-controlled and transmission/non-transmission of light emitted from the first, second, and third light-emitting devices is controlled by the light transmission controller to display an image.

A conceptual view of the image display device is the same as shown in FIG. 23. In the direct-view-type image display device, light is directly viewed, and in the projection-type image display device, light is projected on a screen through a projection lens.

EXAMPLE 8

Example 8 relates to a planar light source device and a liquid crystal display assembly (specifically, a color liquid crystal display assembly) of the present invention. The planar light source device of Example 8 is a planar light source device for irradiating the back of a transmissive or transflective color liquid crystal display device. The color liquid crystal display assembly of Example 8 is a color liquid crystal display assembly including a transmissive or transflective color liquid crystal display device and a planar light source device for irradiating the back of the color liquid crystal display device.

A GaN-based semiconductor light-emitting device (light-emitting diode) used as a light source of the planar light source device has the same basic constitution and structure as described in Examples 1 to 4. Namely, the GaN-based semiconductor light-emitting device includes:

(A) a first GaN-based compound semiconductor layer 13 having n-type conductivity;

(B) an active layer 15 having a multi-quantum well structure including well layers and barrier layers for separating between the well layers; and (C) a second GaN-based compound semiconductor layer 17 having p-type conductivity;

wherein the well layers are disposed in the active layer so as to satisfy the relation $d_1 < d_2$ wherein $d_1$ is the well layer density on the first GaN-based compound semiconductor layer side in the active layer and $d_2$ is the well layer density on the second GaN-based compound semiconductor layer side.

In the planar light source device of Example 8, the luminance (brightness) of the GaN-based semiconductor light-emitting device serving as the light source can be controlled by controlling the operating current density (or the driving current) of the GaN-based semiconductor light-emitting device serving as the light source and the pulse width and/or the pulse density of the driving current. Namely, the number of control parameters of luminance is increased in comparison to a conventional technique, thereby permitting luminance control in a wider range. Thus, a wide dynamic range of luminance can be obtained. Specifically, for example, the luminance of the whole planar light source device may be controlled by controlling the peak current of the driving current (operating current), and the luminance may be finely controlled by controlling the pulse width and/or the pulse density of the driving current. In contrast, the luminance of the whole planar light source device may be controlled by controlling the pulse width and/or the pulse density of the driving current, and the luminance may be finely controlled by controlling the peak current of the driving current (operating current). In this case, a large shift of the emission wavelength can be suppressed using the same GaN-based semiconductor light-emitting device (light-emitting diode) as described in Examples 1 to 4, thereby stabilizing the emission wavelength of the GaN-based semiconductor light-emitting device.

Figure 32A:
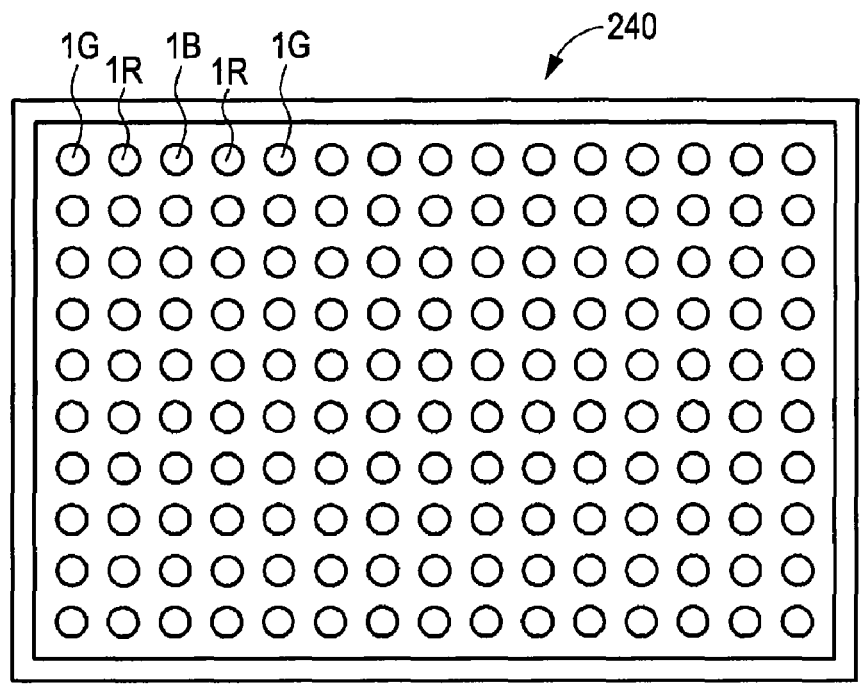
FIG. 32A is a schematic view showing the arrangement and array state of light-emitting devices in a planar light source device of Example 8.
Figure 32B:
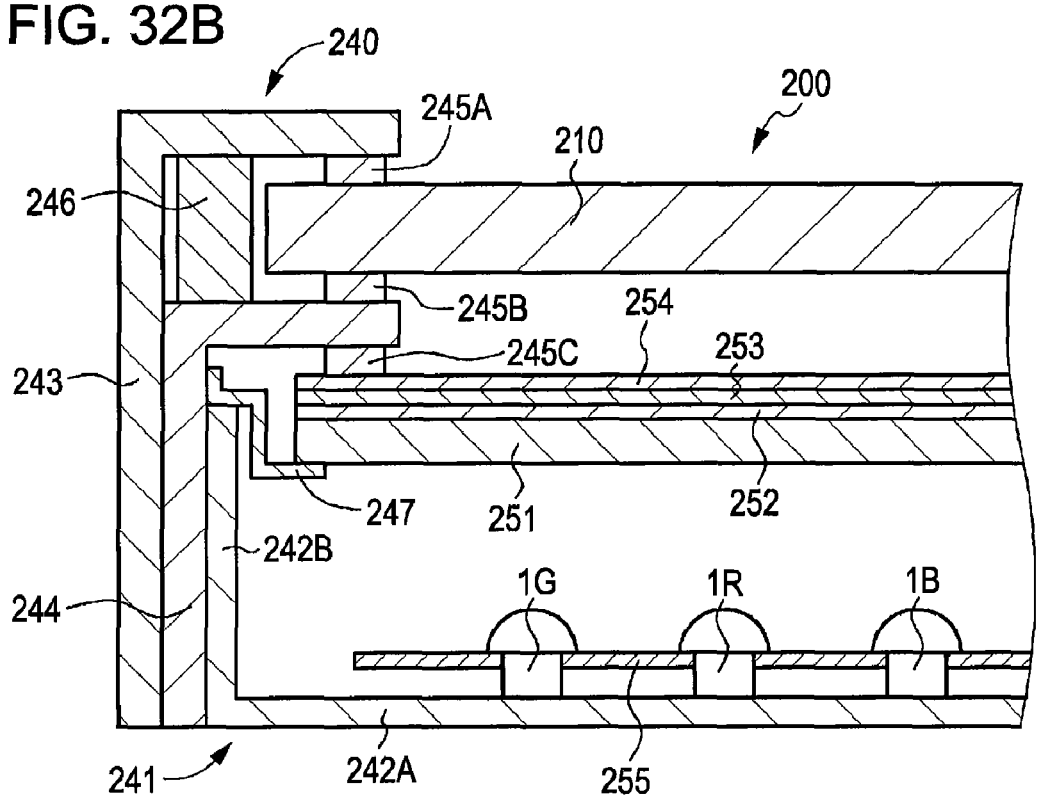
FIG. 32B is a schematic partial sectional view showing a planar light source device and a color liquid crystal display assembly.
Figure 33:
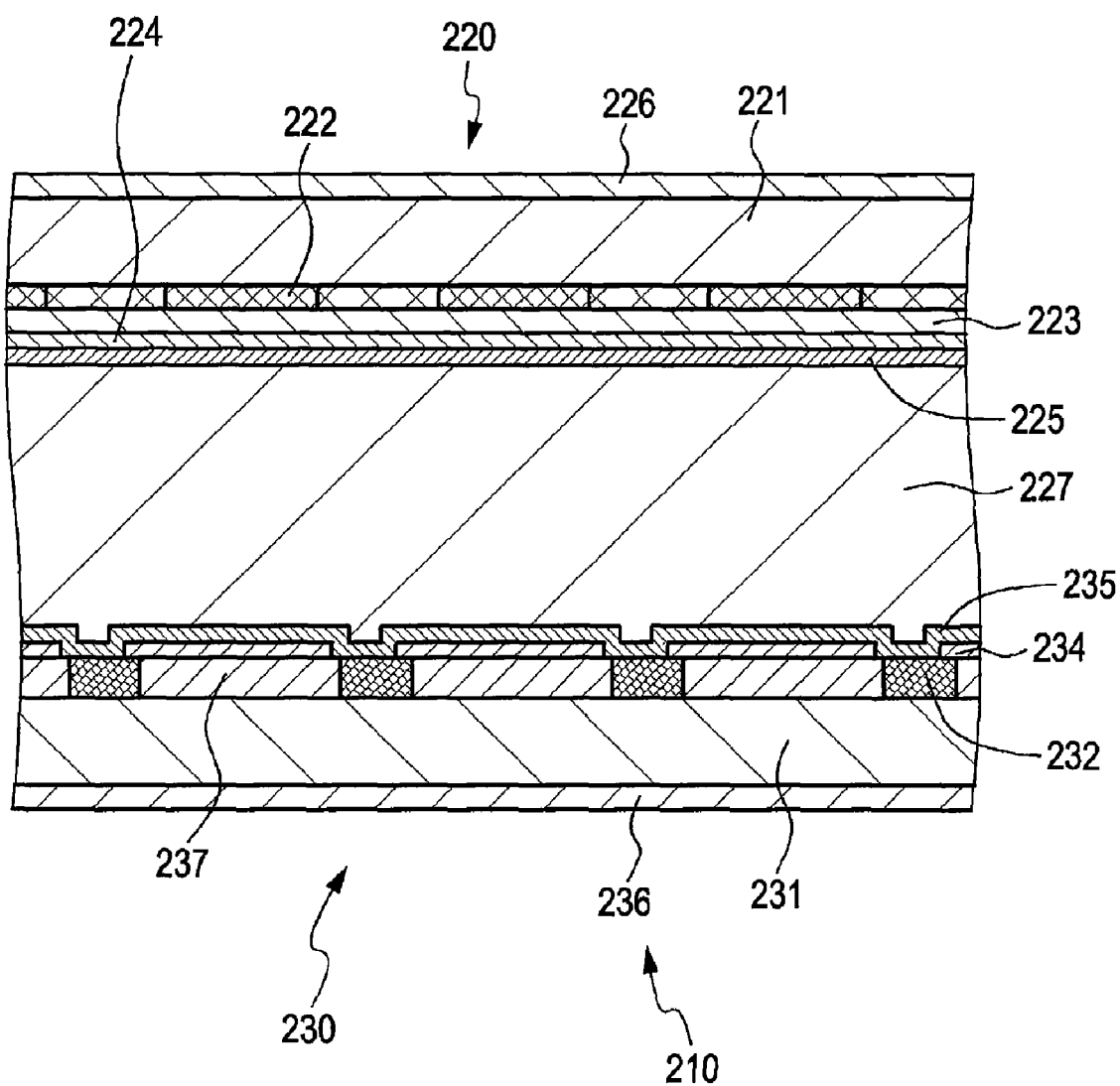
FIG. 33 is a schematic partial sectional view showing a color liquid crystal display device.

FIG. 32A is a schematic view showing the arrangement and array state of the light-emitting devices in the planar light source device of Example 8, FIG. 32B is a schematic partial sectional view showing the planar light source device and the color liquid crystal display assembly, and FIG. 33 is a schematic partial sectional view showing the color liquid crystal display assembly.

More specifically, the color liquid crystal display assembly 200 of Example 8 includes:

a transmissive color liquid crystal display device 210 including:

(a) a front panel 220 provided with a transparent first electrode 224;

(b) a rear panel 230 provided with a transparent second electrode 234; and (c) a liquid crystal material 227 disposed between the front panel 220 and the rear panel 230; and (d) a planar light source device (direct-lighting type back light) 240 having semiconductor light-emitting devices 1R, 1G, and 1B serving as light sources.

The planar light source device (direct-lighting type back light) 240 is opposed to the rear panel 230, for irradiating the rear panel side of the color liquid crystal display device 210.

The direct-lighting type planar light source device 240 includes a casing 241 including an outer frame 243 and an inner frame 244. The ends of the transmissive color liquid crystal display device 210 are held between the outer frame 243 and the inner frame 244 with spacers 245A and 245B provided therebetween. Also, a guide member 246 is disposed between the outer frame 243 and the inner frame 244 to form a structure in which the color liquid crystal display device 210 held between the outer frame 243 and the inner frame 244 is not deviated. Further, a diffusion plate 251 is provided in an upper portion of the casing 241 to be attached to the inner frame 244 through a spacer 245C and a bracket member 247. Further, an optical functional sheet group consisting of a diffusion sheet 252, a prism sheet 253, and a polarization conversion sheet 254 is stacked on the diffusion plate 251.

A reflective sheet 255 is provided in a lower portion of the casing 241. The reflective sheet 255 is disposed so that the reflective surface faces the diffusion plate 251 and is attached to the bottom 242A of the casing 241 through an attachment member not shown in the drawing. The reflective sheet 255 includes a silver amplified reflective film having a structure in which for example, a silver reflective film, a low-refractive-index film, and a high-refractive-index film are stacked in order on a base sheet. The reflective sheet 255 reflects light emitted from a plurality of red light-emitting AlGaInP-based semiconductor light-emitting devices 1R, a plurality of green light-emitting GaN-based semiconductor light-emitting devices 1G, and a plurality of blue light-emitting GaN-based semiconductor light-emitting devices 1B, and light reflected by the side 242B of the casing 241. Therefore, red light, green light, and blue right emitted from the plurality of semiconductor light-emitting devices 1R, 1G, and 1B are mixed to obtain white light with high color purity as illuminating light. The illuminating light passes through the diffusion plate 251 and the optical functional sheet group consisting of the diffusion sheet 252, the prism sheet 253, and the polarization conversion sheet 254 and is applied to the rear side of the color liquid crystal display device 210.

In an array state of the light-emitting devices, for example, a plurality of light-emitting device rows each including a set of a red light-emitting AlGaInP-based semiconductor light-emitting device 1R, a green light-emitting GaN-based semiconductor light-emitting device 1G, and a blue light-emitting GaN-based semiconductor light-emitting device 1B can be arrayed in a horizontal direction to form a light-emitting device row array, and a plurality of the light-emitting device row arrays can be arrayed in a vertical direction. The numbers of the respective light-emitting devices constituting each light-emitting device row are, for example, two red light-emitting AlGaInP-based semiconductor light-emitting devices, two green light-emitting GaN-based semiconductor light-emitting devices, and one blue light-emitting GaN-based semiconductor light-emitting device. In this case, the light-emitting devices are arrayed in the order of the red light-emitting AlGaInP-based semiconductor light-emitting device, the green light-emitting GaN-based semiconductor light-emitting device, the blue light-emitting GaN-based semiconductor light-emitting device, the green light-emitting GaN-based semiconductor light-emitting device, and the red light-emitting AlGaInP-based semiconductor light-emitting device.

As shown in FIG. 33, the front panel 220 constituting the color liquid crystal display device 210 includes a first substrate 221 including, for example, a glass substrate, and a polarizing film 226 provided on the outer surface of the first substrate 221. The front panel further includes a color filter 222 provided on the inner surface of the first substrate 221 and covered with an overcoat layer 223 composed of an acrylic resin or an epoxy resin, the transparent first electrode (also referred to as the "common electrode" and composed of, for example, ITO) 224 being formed on the overcoat layer 223. Further, an alignment film 225 is formed on the transparent first electrode 224. On the other hand, more specifically, the rear panel includes a second substrate 231 including, for example, a glass substrate, a switching element (specifically, a thin film transistor, TFT) 232 and the transparent second electrode (also referred to as the "pixel electrode" and composed of ITO) 234, which are provided on the inner surface of the second substrate 231 so that conduction/non-conduction of the transparent second electrode 234 is controlled by the switching element 232, and a polarizing film 236 provided on the outer surface of the second substrate 231. Further, an alignment film 235 is formed over the entire surface including the transparent second electrode 234. The front panel 220 and the rear panel 230 are bonded together in the peripheral region through a sealing material (not shown in the drawing). The switching element 232 is not limited to TFT, and, for example, a MIM element can be used. In the drawing, reference numeral 237 denotes an insulating layer provided between the switching elements 232.

Since the members and the liquid crystal material which constitute the transmissive color liquid crystal display device may be known members and material, detailed description is omitted.

Each of the red light-emitting semiconductor light-emitting device 1R, the green light-emitting GaN-based semiconductor light-emitting device 1G, and the blue light-emitting GaN-based semiconductor light-emitting device 1B has the structure shown by (A) in FIG. 2 and is connected to the driving circuit 26. Each light-emitting device is driven by the same method as described in Example 1.

When a planar light source device is divided into a plurality of regions so that each region is independently dynamically controlled, the dynamic range of luminance of a color liquid crystal display device can be further widened. In other words, a planar light source device is divided into a plurality of ranges for each image display frame, and the brightness of the planar light source device is changed in each region according to an image signal (for example, the luminance of each region of the planar light source device is changed in proportion to the maximum luminance of the corresponding region of an image). In this case, in a bright region of an image, the corresponding region of the planar light source device is brightened, while in a dark region of an image, the corresponding region of the planar light source device is darkened, so that the contrast ratio of the color liquid crystal display device can be significantly improved. Furthermore, the mean power consumption can be decreased. In this technique, it is important to decrease color variations between the regions of the planar light source device. In a GaN-based semiconductor light-emitting device, variations easily occur in luminous colors during the manufacture. However, the GaN-based semiconductor light-emitting device used in Example 8 is the same as described in Examples 1 to 4, and thus a planar light source device with little variation in luminous colors between the regions can be achieved. Further, in addition to the control of the operating current density (or the driving current) of the GaN-based semiconductor light-emitting device used as the light source, the luminance (brightness) of the GaN-based semiconductor light-emitting device used as the light source can be controlled by controlling the pulse width and/or the pulse density of the driving current. Therefore, the independent dynamic control of each of a plurality of divided regions can be securely easily performed. Specifically, for example, the luminance of each region of the planar light source device may be controlled by controlling the peak current of the driving current (operating current), and the luminance may be finely controlled by controlling the pulse width and/or the pulse density of the driving current. In contrast, the luminance of the whole planar light source device may be controlled by controlling the pulse width and/or the pulse density of the driving current, and the luminance may be finely controlled by controlling the peak current of the driving current (operating current).

EXAMPLE 9

Figure 34:
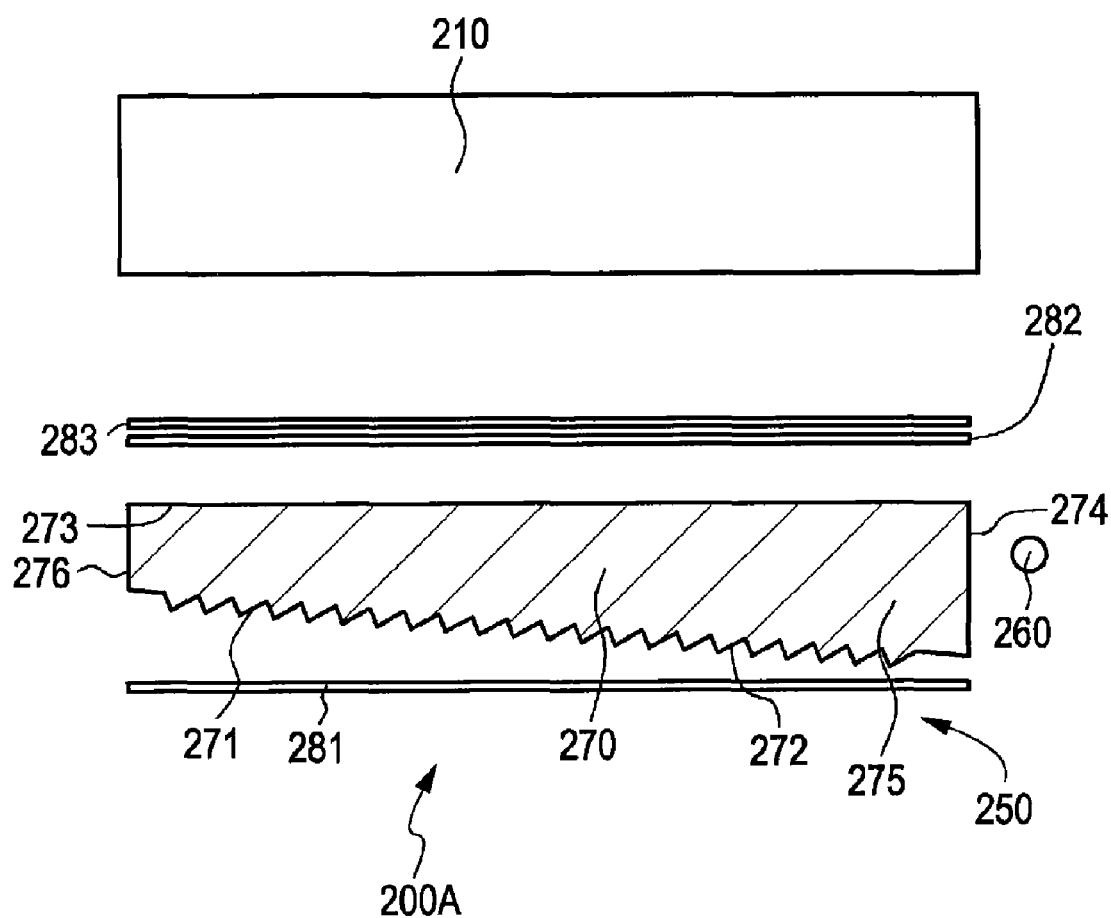
FIG. 34 is a conceptual view showing a color liquid crystal display device of Example 9.

Example 9 is a modification of Example 8. In Example 8, the planar light source device is a direct-lighting type. However, in Example 9, a planar light source device is an edge light type. FIG. 34 is a conceptual view of a color liquid crystal display assembly of Example 9. A schematic partial sectional view of a color liquid crystal display device of Example 9 is the same as shown in FIG. 33.

A color liquid crystal display assembly 200A of Example 9 includes:

a transmissive color liquid crystal display device 210 including:

(a) a front panel 220 with a transparent first electrode 224;

(b) a rear panel 230 with a transparent second electrode 234; and (c) a liquid crystal material 227 disposed between the front panel 220 and the rear panel 230; and (d) a planar light source device (edge light-type back light) 250 including a light guide plate 270 and a light source 260, for irradiating the rear panel side of the color liquid crystal display device 210.

The light guide plate 270 is opposed to the rear panel 230.

The light source 260 includes, for example, a red light-emitting AlGaInP-based semiconductor light-emitting device, a green light-emitting GaN-based semiconductor light-emitting device, and a blue light-emitting GaN-based semiconductor light-emitting device. These semiconductor light-emitting devices are not shown in the drawing. As the green light-emitting GaN-based semiconductor light-emitting device and the blue light-emitting GaN-based semiconductor light-emitting device, the same GaN-based semiconductor light-emitting device as described in Example 1 to 4 can be used. The constitution and structure of each of the front panel 220 and the rear panel 230 constituting the color liquid crystal display device 210 are the same as those of the front panel 220 and the rear panel 230 of Example 8 described with reference to FIG. 33, and thus detailed description is omitted.

For example, the light guide plate 270 composed of a polycarbonate resin has a first surface (bottom) 271, a second surface (top) 273 opposite to the first surface 271, the first side 274, a second side 275, a third side 276 opposite to the first side 274, and a fourth side opposite to the second side 274. A specific example of the shape of the light guide plate 270 is a wedge-shaped truncated quadrangular pyramid shape as a whole. In this case, the two opposing sides of the truncated quadrangular prism correspond to the first and second surfaces 271 and 273, and the bottom of the truncated quadrangular prism corresponds to the first side 274. Furthermore, an irregular portion 272 is provided on the surface of the first surface 271. The continuous irregular portion of the light guide plate 270 has a triangular sectional shape taken along a virtual plane vertical to the first surface in the incidence direction of the light guide plate 270. In other words, the irregular portion 272 provided on the surface of the first surface 271 has a prisms shape. The second surface 273 of the light guide plate 270 may be smooth (i.e., a mirror surface) or may be provided with blast crimps having a diffusion effect (i.e., a fine irregular surface). Further, a reflective member 281 is disposed opposite to the first surface 271 of the light guide plate 270. The color liquid crystal display device 210 is disposed opposite to the second surface 273 of the light guide plate 270. Further, a diffusion sheet 282 and a prism sheet 283 are disposed between the color liquid crystal display device 210 and the second surface 273 of the light guide plate 270. Light emitted from the light source 260 is incident on the light guide plate 270 from the first side 274 (for example, corresponding to the bottom of the truncated quadrangular prism), scattered by collision with the irregular portion 272 of the first surface 271, emitted from the first surface 271, reflected by the reflective member 281, again incident on the first surface 271, emitted from the second surface 273, and passes through the diffusion sheet 282 and the prism sheet 283 to illuminate the color liquid crystal display device 210.

Although the present invention is described above on the basis of the preferred examples, the present invention is not limited to these examples. The constitutions and structures of the GaN-based semiconductor light-emitting device described in each example, and the light-emitting device, the image display device, the planar light source device, and the color liquid crystal display assembly in each of which the GaN-based semiconductor light-emitting device is incorporated are illustrative, and the members and materials constituting these devices are also illustrative. Thus, appropriate changes can be made. The order of the stacked layers in the GaN-based semiconductor light-emitting device may be reversed. A direct-view-type image display device may be a type in which an image is projected on the human retina. In each example, the n-type electrode and the p-type electrode are formed on the same side (upper side) of the GaN-based semiconductor light-emitting device. However, alternatively, the substrate 10 is separated, and the n-type electrode and the p-type electrode may be formed on different sides of the GaN-based semiconductor light-emitting device, i.e., the lower side and the upper side, respectively. In addition, a reflective electrode of silver or aluminum may be used as an electrode instead of the transparent electrode, and the long side (long diameter) and the short side (short diameter) may be changed.

Figure 35:
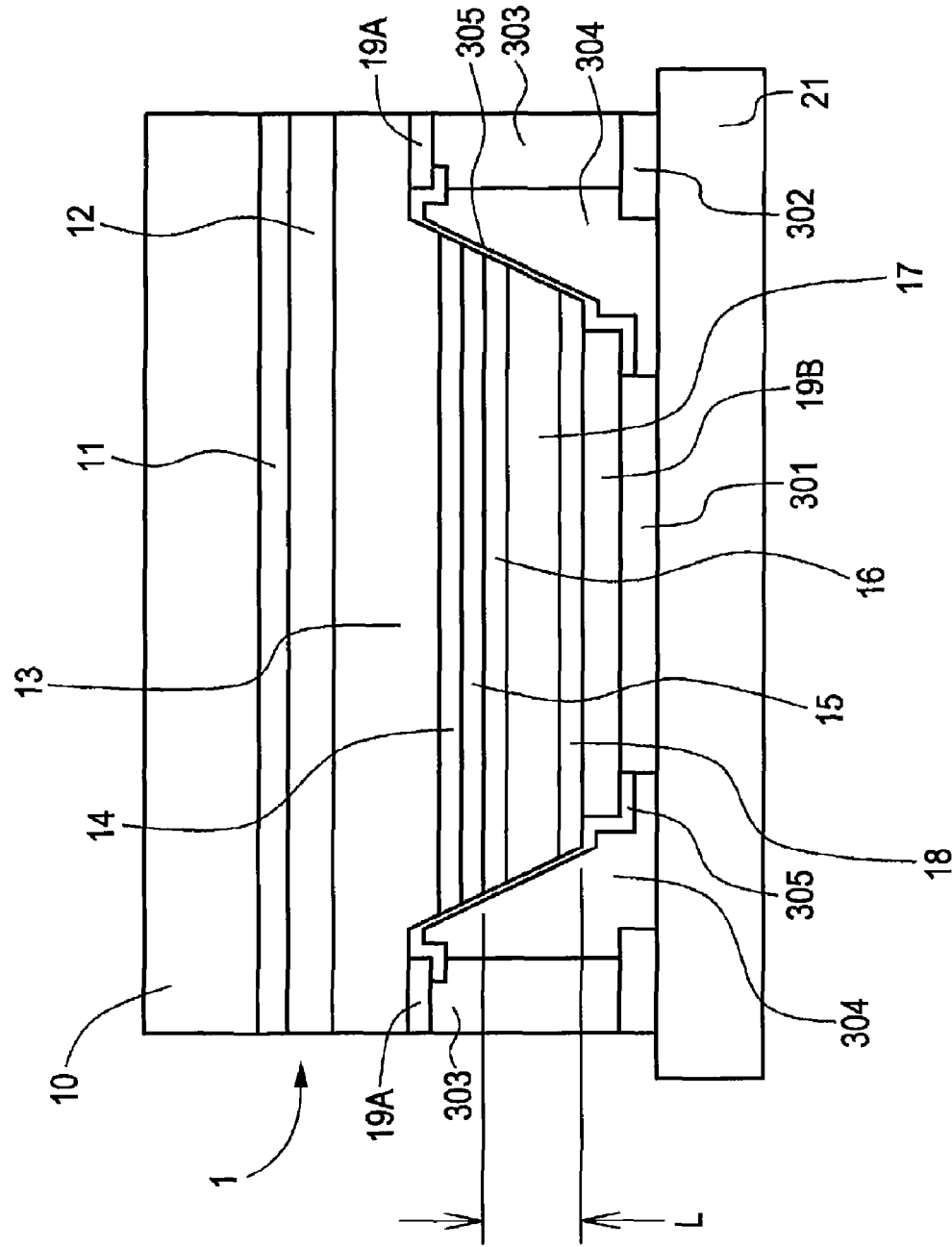
FIG. 35 is a schematic sectional view of a GaN-based semiconductor light-emitting device including LED having a flip-chip structure.

FIG. 35 is a schematic sectional view showing a GaN-based semiconductor light-emitting device 1 including a LED having a flip-chip structure. However, in FIG. 35, oblique lines in each component are omitted. The layer structure of the GaN-based semiconductor light-emitting device 1 may be the same as that of the GaN-based semiconductor light-emitting device 1 described in Examples 1 to 4. The side of each layer is covered with a passivation film 305, a n-type electrode 19A is formed on an exposed portion of the first GaN-based compound semiconductor layer 13, and a p-type electrode 19B also functioning as a light reflecting layer is formed on the Mg-doped GaN layer 18. The lower portion of the GaN-based semiconductor light-emitting device 1 is surrounded by a $SiO_2$ layer 304 and an aluminum layer 303. Further, the p-type electrode 19B and the aluminum layer 303 are fixed to a sub-mount 21 with solder layers 301 and 302, respectively. In this structure, it is preferred to satisfy the following relation:

$$0.5(\lambda/n_0) \leq L \leq (\lambda/n_0)$$

wherein L is the distance from the active layer 15 to the p-type electrode 19B also functioning as a light reflecting layer, no is the refractive index of the compound semiconductor layer present between the active layer 15 and the p-type electrode 19B, and k is the emission wavelength.

Further, a semiconductor laser can be formed using the GaN-based semiconductor light-emitting device. An example of a layer structure of such a semiconductor laser includes the layers below which are stacked in order on a GaN substrate. The emission wavelength is about 450 nm.

(1) a Si-doped GaN layer having a thickness of 3 μm (doping concentration of $5 \times 10^{18}/cm^3$);

(2) a superlattice layer having a total thickness of 1 μm (a stacked structure of 250 pairs of layers each including a Si-doped $Al_{0.1}Ga_{0.9}N$ layer having a thickness of 2.4 nm and a Si-doped GaN layer having a thickness of 1.6 nm, doping concentration of $5 \times 10^{18}/cm^3$);

(3) a Si-doped $In_{0.03}Ga_{0.97}N$ layer having a thickness of 150 nm (doping concentration of $5 \times 10^{18}/cm^3$);

(4) an undoped $In_{0.03}Ga_{0.97}N$ layer having a thickness of 5 nm (5) an active layer having a multi-quantum well structure ($In_{0.15}Ga_{0.85}N$ well layer having a thickness of 3 nm/$In_{0.03}Ga_{0.97}N$ barrier layer having a thickness of 15 nm/$In_{0.15}Ga_{0.85}N$ well layer having a thickness of 3 nm/$In_{0.03}Ga_{0.97}N$ barrier layer having a thickness of 5 nm/$In_{0.15}Ga_{0.85}N$ well layer having a thickness of 3 nm/$In_{0.03}Ga_{0.97}N$ barrier layer having a thickness of 5 nm/$In_{0.15}Ga_{0.85}N$ well layer having a thickness of 3 nm)

(6) an undoped GaN layer having a thickness of 10 nm;

(7) a superlattice layer having a total thickness of 20 nm (a stacked structure of 5 pairs of layers each including a Mg-doped $Al_{0.2}Ga_{0.8}N$ layer having a thickness of 2.4 nm and a Mg-doped GaN layer having a thickness of 1.6 nm, doping concentration of $5 \times 10^{19}/cm^3$);

(8) a Mg-doped GaN layer having a thickness of 120 nm, (doping concentration of $1 \times 10^{19}/cm^3$);

(9) a superlattice layer having a total thickness of 500 nm (a stacked structure of 125 pairs of layers each including a Mg-doped $Al_{0.1}Ga_{0.9}N$ layer having a thickness of 2.4 nm and a Mg-doped GaN layer having a thickness of 1.6 nm, doping concentration of $5 \times 10^{19}/cm^3$);

(10) a Mg-doped GaN layer having a thickness of 20 nm (doping concentration of $1 \times 10^{20}/cm^3$); and

(11) a Mg-doped $In_{0.15}Ga_{0.85}N$ layer having a thickness of 5 nm (doping concentration of $1 \times 10^{20}/cm^3$)

The temperature characteristics (temperature-emission wavelength relation) of an AlGaInP-based semiconductor light-emitting device and a GaN-based semiconductor light-emitting device may be previously determined so that the temperatures of the AlGaInP-based semiconductor light-emitting device and the GaN-based semiconductor light-emitting device in a planar light source device or a color liquid crystal display assembly are monitored. In this case, it is possible to realize the stable operations of the AlGaInP-based semiconductor light-emitting device and the GaN-based semiconductor light-emitting device immediately after the supply of electric power.

The above-described driving circuit 26 can be applied to not only the drive of the GaN-based semiconductor light-emitting device of the present invention but also the drive of a GaN-based semiconductor light-emitting device (for example, the GaN-based semiconductor light-emitting device described in Comparative Example 1) having conventional constitution and structure.

As the driving circuit, the driving circuit disclosed in Japanese Unexamined Patent Application Publication No. 2003-22052 can also be used. This driving circuit includes emission wavelength correction means for correcting variations in emission wavelength between a plurality of GaN-based semiconductor light-emitting devices by controlling the currents supplied to the GaN-based semiconductor light-emitting devices and luminance correction means for correcting variation in luminance between the GaN-based semiconductor light-emitting devices. The emission wavelength correction means includes a current mirror circuit provided for each GaN-based semiconductor light-emitting device to be driven so that the current flowing in each GaN-based semiconductor light-emitting device is controlled by the current mirror circuit. The current flowing on the reference side of the current mirror is controlled by controlling the current flowing through a plurality of active elements connected in parallel. The luminance correction means includes a constant-current circuit for supplying a current to each GaN-based semiconductor light-emitting device to be driven, and on-off of a switching element of the constant-current circuit is controlled.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A GaN-based semiconductor light-emitting device comprising:
(A) a first GaN-based compound semiconductor layer having n-type conductivity;
(B) an active layer having:
a multi-quantum well structure including well layers and barrier layers for separating between the well layers;
a thickness of $t_0$; and
a first region extending from the first GaN-based compound layer to a thickness of approximately ($2t_0/3$) in the active layer, the first region having a well layer density of $d_1$; and a second region that is separate from the first region and having a well layer density of $d_2$; and (C) a second GaN-based compound semiconductor layer having p-type conductivity, the second region of the active layer extending from the second GaN-based compound layer to a thickness of approximately ($t_0/3$) in the active layer;

wherein the first GaN-based compound layer is located closer to a substrate than the second GaN-based compound layer, wherein the well layers are disposed in the first and second regions of the active layer and the thicknesses of successive barrier layers decrease or remain the same from the first GaN-based compound semiconductor layer side to the second GaN-based compound semiconductor layer side so as to satisfy the relation $d_1<d_2$, and and wherein the thicknesses of the barrier layers decrease at least twice from the first GaN-based compound semiconductor layer side to the second GaN-based compound semiconductor layer side.

2. The GaN-based semiconductor light-emitting device according to claim 1, wherein the following relations are satisfied:

$$500 \text{ (nm)} \leq \lambda_2 \leq 550 \text{ (nm)}$$

$$0 \leq |\lambda_2 - \lambda_3| \leq 5 \text{ (nm)}$$

wherein $\lambda_2$ (nm) is the emission wavelength of the active layer when an operating current density is 30 A/cm², and $\lambda_3$ (nm) is the emission wavelength of the active layer when an operating current density is 300 A/cm².

3. The GaN-based semiconductor light-emitting device according to claim 1, wherein the following relations are satisfied:

$$500 \text{ (nm)} \leq \lambda_2 \leq 550 \text{ (nm)}$$

$$0 \leq |\lambda_1 - \lambda_2| \leq 10 \text{ (nm)}$$

$$0 \leq |\lambda_2 - \lambda_3| \leq 5 \text{ (nm)}$$

wherein $\lambda_1$ (nm) is the emission wavelength of the active layer when an operating current density is 1 A/cm², $\lambda_2$ (nm) is the emission wavelength of the active layer when an operating current density is 30 A/cm², and $\lambda_3$ (nm) is the emission wavelength of the active layer when an operating current density is 300 A/cm².

4. The GaN-based semiconductor light-emitting device according to claim 1, wherein the following relations are satisfied:

$$430 \text{ (nm)} \leq \lambda_2 \leq 480 \text{ (nm)}$$

$$0 \leq |\lambda_2 - \lambda_3| \leq 2 \text{ (nm)}$$

wherein $\lambda_2$ (nm) is the emission wavelength of the active layer when an operating current density is 30 A/cm², and $\lambda_3$ (nm) is the emission wavelength of the active layer when an operating current density is 300 A/cm².

5. The GaN-based semiconductor light-emitting device according to claim 1, wherein the following relations are satisfied:

$$430 \text{ (nm)} \leq \lambda_2 \leq 480 \text{ (nm)}$$

$$0 \leq |\lambda_1 - \lambda_2| \leq 5 \text{ (nm)}$$

$$0 \leq |\lambda_2 - \lambda_3| \leq 2 \text{ (nm)}$$

wherein $\lambda_1$ (nm) is the emission wavelength of the active layer when an operating current density is 1 A/cm², $\lambda_2$ (nm) is the emission wavelength of the active layer when an operating current density is 30 A/cm², and $\lambda_3$ (nm) is the emission wavelength of the active layer when an operating current density is 300 A/cm².

6. The GaN-based semiconductor light-emitting device according to claim 1, wherein when the total thickness of the active layer is $t_0$, the well layer density in an active layer first region ranging from the first GaN-based compound semiconductor layer-side interface to the thickness of ($t_0/2$) in the active layer is $d_1$, and the well layer density in an active layer second region ranging from the second GaN-based compound semiconductor layer-side interface to the thickness of ($t_0/2$) in the active layer is $d_2$, the well layers are disposed in the active layer to satisfy the relation $d_1<d_2$.

7. The GaN-based semiconductor light-emitting device according to claim 1, wherein when the total thickness of the active layer is $t_0$, the well layer density in an active layer first region ranging from the first GaN-based compound semiconductor layer-side interface to the thickness of ($2t_0/3$) in the active layer is $d_1$, and the well layer density in an active layer second region ranging from the second GaN-based compound semiconductor layer-side interface to the thickness of ($t_0/3$) in the active layer is $d_2$, the well layers are disposed in the active layer to satisfy the relation $d_1<d_2$.

8. The GaN-based semiconductor light-emitting device according to claim 1, wherein the well layers are disposed in the active layer to satisfy the relation $1.2 \leq d_2/d_1 \leq 10$.

9. The GaN-based semiconductor light-emitting device according to claim 1, wherein the thickness of the barrier layer nearest the second GaN-based compound semiconductor layer is 20 nm or less.

10. The GaN-based semiconductor light-emitting device according to claim 1, wherein the at least one well layer and the other well layers include an approximate 0.23 to 0.77 ratio of indium atoms to gallium atoms.

11. The GaN-based semiconductor light-emitting device according to claim 1, wherein the number of the well layers in the active layer is 4 or more.

12. The GaN-based semiconductor light-emitting device according to claim 1, further comprising:

(D) an underlying layer containing indium atoms and formed between the first GaN-based compound semiconductor layer and the active layer; and (E) a superlattice layer containing a p-type dopant and formed between the active layer and the second GaN-based compound semiconductor layer.

13. The GaN-based semiconductor light-emitting device according to claim 1, wherein the GaN-based compound semiconductor layers constituting the active layer are composed of an undoped GaN-based compound semiconductor, or the n-type impurity concentration of the GaN-based compound semiconductor layers constituting the active layer is less than $2 \times 10^{17}/\text{cm}^3$.

14. The GaN-based semiconductor light-emitting device according to claim 1, wherein a length of a short side or a short diameter of the active layer from a top view is 0.1 mm or less.

15. The GaN-based semiconductor light-emitting device according to claim 1, wherein a length of a short side or a short diameter of the active layer from a top view is 0.03 mm or less.

16. The GaN-based semiconductor light-emitting device according to claim 1, further comprising a driving circuit to:

adjust a peak current to control a quantity of light emitted from the GaN-based semiconductor light-emitting device;

adjust a pulse width to control the quantity of light emitted from the GaN-based semiconductor light-emitting device; and adjust a number of pulses in an operational period to control the quantity of light emitted from the GaN-based semiconductor light-emitting device.

17. The GaN-based semiconductor light-emitting device according to claim 1, wherein at least one of the well layers having a different ratio of indium atoms to gallium atoms from the other well layers and the thickness of a first barrier layer nearest the second GaN-based compound semiconductor layer is twice or more the thickness of a second barrier layer nearest the first GaN-based compound semiconductor layer.

* * * * *

UNITED STATES PATENT AND TRADEMARK OFFICE
CERTIFICATE OF CORRECTION

| | | |
|---|---|---|
| PATENT NO. | : 8,168,966 B2 | Page 1 of 1 |
| APPLICATION NO. | : 11/718862 | |
| DATED | : May 1, 2012 | |
| INVENTOR(S) | : Biwa et al. | |

It is certified that error appears in the above-identified patent and that said Letters Patent is hereby corrected as shown below:

On the Title Page, Item (86) the "PCT No.", please replace
"PCT/JP2006/017881" with
--PCT/JP2006/317881--.

Signed and Sealed this
Eighteenth Day of June, 2013

Teresa Stanek Rea
*Acting Director of the United States Patent and Trademark Office*